(12) United States Patent
Chiang et al.

(10) Patent No.: US 12,471,346 B2
(45) Date of Patent: Nov. 11, 2025

(54) MEMORY ARRAY ISOLATION STRUCTURES

(71) Applicant: Taiwan Semiconductor Manufacturing Co., Ltd., Hsinchu (TW)

(72) Inventors: Kuo-Chang Chiang, Hsinchu (TW); Hung-Chang Sun, Kaohsiung (TW); Sheng-Chih Lai, Hsinchu (TW); TsuChing Yang, Taipei (TW); Yu-Wei Jiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/301,113

(22) Filed: Apr. 14, 2023

(65) Prior Publication Data

US 2023/0253464 A1    Aug. 10, 2023

Related U.S. Application Data

(62) Division of application No. 17/119,346, filed on Dec. 11, 2020, now Pat. No. 11,640,974.

(Continued)

(51) Int. Cl.
*H10D 64/68* (2025.01)
*G11C 11/22* (2006.01)
(Continued)

(52) U.S. Cl.
CPC ......... *H10D 64/033* (2025.01); *G11C 11/223* (2013.01); *G11C 11/2255* (2013.01);
(Continued)

(58) Field of Classification Search
CPC .............. G11C 11/223; G11C 11/2255; G11C 11/2257; G11C 11/2259; H01L 29/40111;
(Continued)

(56) References Cited

U.S. PATENT DOCUMENTS

| 1,152,386 | A | 8/1915 | Smith |
| 5,399,890 | A | 3/1995 | Okada et al. |

(Continued)

FOREIGN PATENT DOCUMENTS

| CN | 102265405 A | 11/2011 |
| CN | 102971797 A | 3/2013 |

(Continued)

OTHER PUBLICATIONS

Zhang et al., "P-1.6: Effect of Deposition Condition of Passivation Layer on the Performance of Self Aligned Top-Gate a-IGZO TFTs", SID Symposium Digest of Technical Papers, vol. 49, pp. 535-537. (Year: 2018).*

(Continued)

*Primary Examiner* — Meiya Li
(74) *Attorney, Agent, or Firm* — Slater Matsil, LLP

(57) ABSTRACT

A memory cell includes a thin film transistor over a semiconductor substrate. The thin film transistor includes a memory film contacting a word line; and an oxide semiconductor (OS) layer contacting a source line and a bit line, wherein the memory film is disposed between the OS layer and the word line; and a dielectric material separating the source line and the bit line. The dielectric material forms an interface with the OS layer. The dielectric material comprises hydrogen, and a hydrogen concentration at the interface between the dielectric material and the OS layer is no more than 3 atomic percent (at %).

20 Claims, 57 Drawing Sheets

Related U.S. Application Data

(60) Provisional application No. 63/045,992, filed on Jun. 30, 2020.

(51) Int. Cl.
| | |
|---|---|
| *H10D 30/67* | (2025.01) |
| *H10D 30/69* | (2025.01) |
| *H10D 64/01* | (2025.01) |

(52) U.S. Cl.
CPC ..... *G11C 11/2257* (2013.01); *H10D 30/6755* (2025.01); *H10D 30/701* (2025.01); *H10D 64/689* (2025.01)

(58) Field of Classification Search
CPC ............. H01L 29/516; H01L 29/78391; H01L 29/7869; H01L 29/7926; H10B 43/10; H10B 43/27; H10B 51/10; H10B 51/20; H10D 30/6755; H10D 30/693; H10D 30/701; H10D 64/033; H10D 64/689
See application file for complete search history.

(56) References Cited

U.S. PATENT DOCUMENTS

| | | |
|---|---|---|
| 6,204,158 B1 | 3/2001 | Hendrix et al. |
| 6,274,453 B1 | 8/2001 | Schlosser et al. |
| 6,627,940 B1 | 9/2003 | Schumann et al. |
| 6,784,061 B1 | 8/2004 | Yang et al. |
| 8,203,884 B2 | 6/2012 | Kito et al. |
| 8,349,681 B2 | 1/2013 | Alsmeier et al. |
| 8,470,671 B1 | 6/2013 | Lin et al. |
| 8,530,976 B1 | 9/2013 | Ratnakumar et al. |
| 8,847,302 B2 | 9/2014 | Alsmeier et al. |
| 9,015,561 B1 | 4/2015 | Hu |
| 9,041,093 B2 | 5/2015 | Tanaka et al. |
| 9,240,420 B2 | 1/2016 | Rabkin et al. |
| 9,281,044 B2 | 3/2016 | Ramaswamy et al. |
| 9,318,315 B2 | 4/2016 | Mueller et al. |
| 9,355,727 B1 | 5/2016 | Zhang et al. |
| 9,418,743 B1 | 8/2016 | Chen |
| 9,455,262 B2 | 9/2016 | Widjaja |
| 9,484,389 B2 | 11/2016 | Wouters et al. |
| 9,496,274 B2 | 11/2016 | Pachamuthu et al. |
| 9,502,265 B1 | 11/2016 | Jiang et al. |
| 9,520,407 B2 | 12/2016 | Fukuzumi et al. |
| 9,530,899 B2 | 12/2016 | Kim et al. |
| 9,570,464 B1 | 2/2017 | Wakatsuki et al. |
| 9,601,497 B1 | 3/2017 | Chen et al. |
| 9,620,513 B2 | 4/2017 | Lee et al. |
| 9,620,712 B2 | 4/2017 | Hayashi et al. |
| 9,634,023 B2 | 4/2017 | Lee |
| 9,640,547 B2 | 5/2017 | Mizukami et al. |
| 9,653,475 B1 | 5/2017 | Yoshimizu et al. |
| 9,728,551 B1 * | 8/2017 | Lu ....................... H01L 21/3003 |
| 9,748,257 B2 | 8/2017 | Lee et al. |
| 9,806,202 B2 | 10/2017 | Yamazaki et al. |
| 9,875,784 B1 | 1/2018 | Li et al. |
| 9,892,930 B1 | 2/2018 | Sawa et al. |
| 9,941,299 B1 | 4/2018 | Chen et al. |
| 9,947,721 B2 | 4/2018 | Fantini |
| 9,953,992 B1 | 4/2018 | Ogawa et al. |
| 9,997,631 B2 | 6/2018 | Yang et al. |
| 10,043,819 B1 | 8/2018 | Lai et al. |
| 10,056,150 B2 | 8/2018 | Ikeda et al. |
| 10,096,615 B2 | 10/2018 | Lee et al. |
| 10,109,639 B1 | 10/2018 | DeForge et al. |
| 10,115,681 B1 | 10/2018 | Ariyoshi |
| 10,191,694 B2 | 1/2019 | Colinge et al. |
| 10,256,247 B1 | 4/2019 | Kanakamedala et al. |
| 10,256,248 B2 | 4/2019 | Lu et al. |
| 10,283,513 B1 | 5/2019 | Zhou et al. |
| 10,367,003 B2 | 7/2019 | Kang et al. |
| 10,446,437 B2 | 10/2019 | Yang |
| 10,490,571 B2 | 11/2019 | Yoo et al. |
| 10,515,981 B2 | 12/2019 | Or-Bach et al. |
| 10,553,604 B2 | 2/2020 | Lu et al. |
| 10,593,399 B2 | 3/2020 | Fratin et al. |
| 10,593,697 B1 | 3/2020 | Hu et al. |
| 10,629,809 B2 | 4/2020 | Yamakawa |
| 10,720,441 B2 | 7/2020 | Kam et al. |
| 10,777,566 B2 | 9/2020 | Lue |
| 10,868,042 B1 | 12/2020 | Zhang et al. |
| 10,910,393 B2 | 2/2021 | Lai et al. |
| 10,930,333 B2 | 2/2021 | Chen et al. |
| 10,998,447 B2 | 5/2021 | Onuki et al. |
| 11,011,529 B2 | 5/2021 | Ramaswamy |
| 11,069,697 B1 | 7/2021 | Or-Bach et al. |
| 11,081,524 B2 | 8/2021 | Hua et al. |
| 11,133,325 B2 | 9/2021 | Dai et al. |
| 11,152,386 B2 | 10/2021 | Or-Bach et al. |
| 11,170,836 B1 | 11/2021 | Tang |
| 11,171,157 B1 | 11/2021 | Lai et al. |
| 11,195,846 B2 | 12/2021 | Huo |
| 11,205,659 B2 | 12/2021 | Zhu et al. |
| 11,211,395 B2 | 12/2021 | Lung |
| 11,355,516 B2 | 6/2022 | Yang et al. |
| 11,404,091 B2 | 8/2022 | Lin et al. |
| 11,423,966 B2 | 8/2022 | Lin et al. |
| 11,515,332 B2 | 11/2022 | Lu et al. |
| 11,587,823 B2 | 2/2023 | Chia et al. |
| 11,729,986 B2 | 8/2023 | Lu et al. |
| 11,776,602 B2 | 10/2023 | Lin et al. |
| 11,785,776 B2 | 10/2023 | Lu et al. |
| 2002/0130345 A1 | 9/2002 | Saigoh et al. |
| 2004/0016958 A1 | 1/2004 | Kato et al. |
| 2004/0026725 A1 | 2/2004 | Gnadinger |
| 2004/0058493 A1 | 3/2004 | Demange et al. |
| 2006/0228859 A1 | 10/2006 | Willer |
| 2007/0072439 A1 | 3/2007 | Akimoto et al. |
| 2008/0258140 A1 | 10/2008 | Lee et al. |
| 2008/0258141 A1 | 10/2008 | Park et al. |
| 2008/0265235 A1 | 10/2008 | Kamigaichi et al. |
| 2009/0020744 A1 | 1/2009 | Mizukami et al. |
| 2010/0038641 A1 | 2/2010 | Imai |
| 2010/0044778 A1 | 2/2010 | Seol et al. |
| 2010/0123177 A1 | 5/2010 | Ozaki |
| 2010/0133601 A1 | 6/2010 | Miyazaki et al. |
| 2010/0181610 A1 | 7/2010 | Kim et al. |
| 2010/0207186 A1 | 8/2010 | Higashi et al. |
| 2010/0330738 A1 | 12/2010 | Uchiyama et al. |
| 2011/0049646 A1 | 3/2011 | Lim et al. |
| 2011/0089417 A1 | 4/2011 | Yamazaki et al. |
| 2011/0180796 A1 | 7/2011 | Yamazaki et al. |
| 2011/0194357 A1 | 8/2011 | Han et al. |
| 2011/0199804 A1 | 8/2011 | Son et al. |
| 2011/0215317 A1 | 9/2011 | Yamazaki et al. |
| 2011/0227140 A1 | 9/2011 | Ishiduki et al. |
| 2011/0253998 A1 | 10/2011 | Theiss et al. |
| 2011/0266604 A1 | 11/2011 | Kim et al. |
| 2011/0298013 A1 | 12/2011 | Hwang et al. |
| 2012/0003800 A1 | 1/2012 | Lee et al. |
| 2012/0007158 A1 | 1/2012 | Yoon et al. |
| 2012/0104484 A1 | 5/2012 | Lee et al. |
| 2012/0181534 A1 | 7/2012 | Hatano |
| 2012/0228687 A1 | 9/2012 | Noda |
| 2013/0083588 A1 | 4/2013 | Takemura |
| 2013/0148398 A1 | 6/2013 | Baek et al. |
| 2013/0161821 A1 | 6/2013 | Hwang et al. |
| 2013/0162778 A1 | 6/2013 | Kurokawa |
| 2013/0264631 A1 | 10/2013 | Alsmeier et al. |
| 2013/0320344 A1 | 12/2013 | Kim et al. |
| 2014/0015057 A1 | 1/2014 | Lee et al. |
| 2014/0048868 A1 | 2/2014 | Kim et al. |
| 2014/0138609 A1 | 5/2014 | Satoh et al. |
| 2014/0160841 A1 | 6/2014 | Koval |
| 2014/0264532 A1 | 9/2014 | Dennison et al. |
| 2014/0264718 A1 | 9/2014 | Wada et al. |
| 2014/0273340 A1 | 9/2014 | Van Duren et al. |
| 2014/0312341 A1 * | 10/2014 | Chiang ............ H01L 29/66969 257/43 |
| 2014/0362644 A1 | 12/2014 | Lue et al. |
| 2015/0037934 A1 | 2/2015 | Yamazaki |
| 2015/0069320 A1 | 3/2015 | Rabkin et al. |

(56) References Cited

U.S. PATENT DOCUMENTS

| | | |
|---|---|---|
| 2015/0084042 A1 | 3/2015 | Maeda et al. |
| 2015/0132944 A1 | 5/2015 | Park |
| 2015/0200199 A1 | 7/2015 | Sakamoto et al. |
| 2015/0206978 A1 | 7/2015 | Miki et al. |
| 2015/0243674 A1 | 8/2015 | Shih et al. |
| 2015/0294977 A1 | 10/2015 | Kim et al. |
| 2015/0311256 A1 | 10/2015 | Rabkin et al. |
| 2015/0357343 A1 | 12/2015 | Ishida et al. |
| 2015/0380418 A1 | 12/2015 | Zhang et al. |
| 2016/0012901 A1 | 1/2016 | Hsu et al. |
| 2016/0027514 A1 | 1/2016 | Sim et al. |
| 2016/0035420 A1 | 2/2016 | Konno et al. |
| 2016/0071860 A1 | 3/2016 | Kai et al. |
| 2016/0086970 A1 | 3/2016 | Peng |
| 2016/0086972 A1 | 3/2016 | Zhang et al. |
| 2016/0118404 A1 | 4/2016 | Peng |
| 2016/0148947 A1 | 5/2016 | Seo et al. |
| 2016/0163389 A1 | 6/2016 | Zhang et al. |
| 2016/0163686 A1 | 6/2016 | Lee et al. |
| 2016/0181259 A1 | 6/2016 | Van Houdt et al. |
| 2016/0204117 A1 | 7/2016 | Liu et al. |
| 2016/0284811 A1 | 9/2016 | Yu et al. |
| 2016/0322368 A1 | 11/2016 | Sun et al. |
| 2016/0322381 A1 | 11/2016 | Liu et al. |
| 2016/0336068 A1 | 11/2016 | Yamazaki et al. |
| 2017/0040416 A1 | 2/2017 | Ota et al. |
| 2017/0077308 A1 | 3/2017 | Yamazaki et al. |
| 2017/0117290 A1 | 4/2017 | Lee et al. |
| 2017/0148517 A1 | 5/2017 | Harari |
| 2017/0148800 A1 | 5/2017 | Nishikawa et al. |
| 2017/0154894 A1 | 6/2017 | Yoshimizu et al. |
| 2017/0154895 A1 | 6/2017 | Huo |
| 2017/0179026 A1 | 6/2017 | Toyama et al. |
| 2017/0213843 A1 | 7/2017 | Choi |
| 2017/0213846 A1 | 7/2017 | Lee |
| 2017/0221910 A1 | 8/2017 | Chen et al. |
| 2017/0236831 A1 | 8/2017 | Kim |
| 2017/0236848 A1 | 8/2017 | Yamazaki |
| 2017/0301684 A1 | 10/2017 | Park et al. |
| 2017/0337884 A1 | 11/2017 | Kurokawa |
| 2017/0338241 A1 | 11/2017 | Lee |
| 2017/0345940 A1 | 11/2017 | Suzuki et al. |
| 2017/0373079 A1 | 12/2017 | Sharangpani et al. |
| 2018/0026044 A1 | 1/2018 | Utsumi et al. |
| 2018/0083018 A1 | 3/2018 | Yamakita et al. |
| 2018/0130823 A1 | 5/2018 | Kim |
| 2018/0145180 A1 | 5/2018 | Koezuka et al. |
| 2018/0151583 A1 | 5/2018 | Lupino et al. |
| 2018/0151588 A1 | 5/2018 | Tsutsumi et al. |
| 2018/0151745 A1 | 5/2018 | Chang et al. |
| 2018/0166453 A1 | 6/2018 | Muller |
| 2018/0247976 A1 | 8/2018 | Sel et al. |
| 2018/0269210 A1 | 9/2018 | Tezuka et al. |
| 2018/0269229 A1 | 9/2018 | Or-Bach et al. |
| 2018/0301415 A1 | 10/2018 | Mizukami et al. |
| 2018/0315794 A1 | 11/2018 | Kamalanathan et al. |
| 2018/0350829 A1 | 12/2018 | Tezuka et al. |
| 2018/0350837 A1 | 12/2018 | Yoo et al. |
| 2019/0027493 A1 | 1/2019 | Kimura et al. |
| 2019/0058109 A1 | 2/2019 | Chen et al. |
| 2019/0067324 A1 | 2/2019 | Zhang et al. |
| 2019/0067325 A1 | 2/2019 | Yano |
| 2019/0074286 A1 | 3/2019 | Singh et al. |
| 2019/0102104 A1 | 4/2019 | Righetti et al. |
| 2019/0115071 A1 | 4/2019 | Nardi et al. |
| 2019/0123061 A1 | 4/2019 | Liu |
| 2019/0140101 A1 | 5/2019 | Im et al. |
| 2019/0148286 A1 | 5/2019 | Or-Bach et al. |
| 2019/0148393 A1 | 5/2019 | Lue |
| 2019/0157287 A1 | 5/2019 | Huo et al. |
| 2019/0157291 A1 | 5/2019 | Kam et al. |
| 2019/0172838 A1 | 6/2019 | Jo et al. |
| 2019/0198617 A1 | 6/2019 | Li et al. |
| 2019/0228734 A1 | 7/2019 | Gao et al. |
| 2019/0244971 A1 | 8/2019 | Harari |
| 2019/0259778 A1 | 8/2019 | Yoo |
| 2019/0287985 A1 | 9/2019 | Shimojo et al. |
| 2019/0295626 A1 | 9/2019 | Ikeda et al. |
| 2019/0312050 A1 | 10/2019 | Lai et al. |
| 2019/0326308 A1 | 10/2019 | Pu et al. |
| 2019/0393353 A1 | 12/2019 | Jeong et al. |
| 2020/0006378 A1 | 1/2020 | Huo |
| 2020/0006433 A1 | 1/2020 | Majhi et al. |
| 2020/0013791 A1 | 1/2020 | Or-Bach et al. |
| 2020/0013799 A1 | 1/2020 | Herner et al. |
| 2020/0018541 A1 | 1/2020 | Villanueva et al. |
| 2020/0026990 A1 | 1/2020 | Lue |
| 2020/0027509 A1 | 1/2020 | Chen et al. |
| 2020/0035701 A1 | 1/2020 | Huang et al. |
| 2020/0051990 A1 | 2/2020 | Harari et al. |
| 2020/0058673 A1 | 2/2020 | Nishikawa et al. |
| 2020/0066756 A1 | 2/2020 | Yoo et al. |
| 2020/0075631 A1 | 3/2020 | Dong et al. |
| 2020/0083248 A1 | 3/2020 | Uchida |
| 2020/0091171 A1 | 3/2020 | Tokuhira et al. |
| 2020/0098774 A1 | 3/2020 | Yeh et al. |
| 2020/0098776 A1 | 3/2020 | Sugisaki et al. |
| 2020/0105635 A1 | 4/2020 | Yu et al. |
| 2020/0105773 A1 | 4/2020 | Morris et al. |
| 2020/0105775 A1 | 4/2020 | Huang et al. |
| 2020/0111920 A1 | 4/2020 | Sills et al. |
| 2020/0119025 A1 | 4/2020 | Jiang et al. |
| 2020/0119047 A1 | 4/2020 | Yoo et al. |
| 2020/0152502 A1 | 5/2020 | Hsu |
| 2020/0152653 A1 | 5/2020 | Lu et al. |
| 2020/0168630 A1 | 5/2020 | Borukhov |
| 2020/0176464 A1 | 6/2020 | Jang et al. |
| 2020/0176468 A1 | 6/2020 | Herner et al. |
| 2020/0185409 A1 | 6/2020 | Baek et al. |
| 2020/0185411 A1* | 6/2020 | Herner ............ H01L 21/32139 |
| 2020/0194431 A1 | 6/2020 | Castro et al. |
| 2020/0194451 A1 | 6/2020 | Lee et al. |
| 2020/0203329 A1 | 6/2020 | Kanamori et al. |
| 2020/0212068 A1 | 7/2020 | Lee et al. |
| 2020/0227428 A1 | 7/2020 | Liu et al. |
| 2020/0227439 A1 | 7/2020 | Sato |
| 2020/0227727 A1 | 7/2020 | Li |
| 2020/0279598 A1 | 9/2020 | Jiang et al. |
| 2020/0286530 A1 | 9/2020 | Lee et al. |
| 2020/0286958 A1 | 9/2020 | Hua et al. |
| 2020/0295033 A1 | 9/2020 | Sakamoto et al. |
| 2020/0303300 A1 | 9/2020 | Kato |
| 2020/0343252 A1 | 10/2020 | Lai et al. |
| 2020/0381037 A1 | 12/2020 | Kim et al. |
| 2020/0381450 A1* | 12/2020 | Lue ................ H10B 43/27 |
| 2020/0402890 A1 | 12/2020 | Chary et al. |
| 2021/0036009 A1 | 2/2021 | Jung et al. |
| 2021/0036019 A1 | 2/2021 | Sharangpani et al. |
| 2021/0043654 A1 | 2/2021 | Yoo et al. |
| 2021/0048044 A1 | 2/2021 | Jackan et al. |
| 2021/0065805 A1 | 3/2021 | Choi et al. |
| 2021/0066344 A1 | 3/2021 | Son et al. |
| 2021/0066348 A1 | 3/2021 | Prasad et al. |
| 2021/0074727 A1 | 3/2021 | Prasad et al. |
| 2021/0082943 A1 | 3/2021 | Jang |
| 2021/0082955 A1 | 3/2021 | Rajashekhar et al. |
| 2021/0118861 A1 | 4/2021 | Yun et al. |
| 2021/0174856 A1 | 6/2021 | Chen et al. |
| 2021/0175253 A1 | 6/2021 | Han et al. |
| 2021/0202514 A1 | 7/2021 | Han |
| 2021/0217772 A1 | 7/2021 | Zhang |
| 2021/0242241 A1 | 8/2021 | Rajashekhar et al. |
| 2021/0313281 A1 | 10/2021 | Kaminaga et al. |
| 2021/0327482 A1 | 10/2021 | Tang et al. |
| 2021/0327890 A1 | 10/2021 | Makala et al. |
| 2021/0335805 A1 | 10/2021 | Kai et al. |
| 2021/0375847 A1 | 12/2021 | Chibvongodze et al. |
| 2021/0375917 A1 | 12/2021 | Lu et al. |
| 2021/0375927 A1 | 12/2021 | Chia et al. |
| 2021/0375932 A1 | 12/2021 | Wang et al. |
| 2021/0376153 A1 | 12/2021 | Lu et al. |
| 2021/0391315 A1 | 12/2021 | Zhang |
| 2021/0391351 A1 | 12/2021 | Takimoto et al. |
| 2021/0391355 A1 | 12/2021 | Lill et al. |

(56) References Cited

U.S. PATENT DOCUMENTS

| | | |
|---|---|---|
| 2021/0398593 A1 | 12/2021 | Song et al. |
| 2021/0398997 A1 | 12/2021 | Luo et al. |
| 2021/0407569 A1 | 12/2021 | Young et al. |
| 2021/0407845 A1 | 12/2021 | Wang et al. |
| 2021/0407848 A1 | 12/2021 | Chia et al. |
| 2021/0407980 A1 | 12/2021 | Young et al. |
| 2021/0408038 A1 | 12/2021 | Lin et al. |
| 2021/0408044 A1 | 12/2021 | Chiang et al. |
| 2021/0408045 A1 | 12/2021 | Chiang et al. |
| 2021/0408046 A1 | 12/2021 | Chang et al. |
| 2022/0005821 A1 | 1/2022 | Or-Bach et al. |
| 2022/0020770 A1 | 1/2022 | Yang et al. |
| 2022/0020771 A1 | 1/2022 | Yang et al. |
| 2022/0036931 A1 | 2/2022 | Lin et al. |
| 2022/0037253 A1 | 2/2022 | Yang et al. |
| 2022/0037361 A1 | 2/2022 | Lin et al. |
| 2022/0037362 A1 | 2/2022 | Lin et al. |
| 2022/0216223 A1 | 7/2022 | Xu et al. |
| 2022/0285395 A1 | 9/2022 | Yang et al. |
| 2022/0399400 A1 | 12/2022 | Takashima |
| 2023/0023327 A1 | 1/2023 | Nagashima et al. |
| 2023/0058806 A1 | 2/2023 | Lin et al. |
| 2023/0225129 A1 | 7/2023 | Lin et al. |
| 2023/0225131 A1 | 7/2023 | Lin et al. |
| 2024/0161837 A1 | 5/2024 | Harari |

FOREIGN PATENT DOCUMENTS

| | | |
|---|---|---|
| CN | 103050149 A | 4/2013 |
| CN | 103165617 A | 6/2013 |
| CN | 103545279 A | 1/2014 |
| CN | 103794612 A | 5/2014 |
| CN | 104112748 A | 10/2014 |
| CN | 104170061 A | 11/2014 |
| CN | 104584200 A | 4/2015 |
| CN | 105359270 A | 2/2016 |
| CN | 106158877 A | 11/2016 |
| CN | 107785376 A | 3/2018 |
| CN | 107871520 A | 4/2018 |
| CN | 108401468 A | 8/2018 |
| CN | 108701475 A | 10/2018 |
| CN | 108962902 A | 12/2018 |
| CN | 108987400 A | 12/2018 |
| CN | 109075172 A | 12/2018 |
| CN | 109378313 A | 2/2019 |
| CN | 109411503 A | 3/2019 |
| CN | 109768082 A | 5/2019 |
| CN | 110114881 A | 8/2019 |
| CN | 110121778 A | 8/2019 |
| CN | 110268523 A | 9/2019 |
| CN | 110416223 A | 11/2019 |
| CN | 110447103 A | 11/2019 |
| CN | 110506322 A | 11/2019 |
| CN | 110520985 A | 11/2019 |
| CN | 110800107 A | 2/2020 |
| CN | 110808332 A | 2/2020 |
| CN | 110957326 A | 4/2020 |
| CN | 111048518 A | 4/2020 |
| CN | 111180451 A | 5/2020 |
| CN | 111384063 A | 7/2020 |
| CN | 113540115 A | 10/2021 |
| JP | H05326978 A | 12/1993 |
| JP | 2007281199 A | 10/2007 |
| JP | 2009016400 A | 1/2009 |
| JP | 2010034109 A | 2/2010 |
| JP | 2010267704 A | 11/2010 |
| JP | 2011060958 A | 3/2011 |
| JP | 2013149647 A | 8/2013 |
| JP | 2015122478 A | 7/2015 |
| JP | 2017103328 A | 6/2017 |
| JP | 2019504479 A | 2/2019 |
| KR | 20080096432 A | 10/2008 |
| KR | 20090125893 A | 12/2009 |
| KR | 20110112727 A | 10/2011 |
| KR | 20120006218 A | 1/2012 |
| KR | 20130142522 A | 12/2013 |
| KR | 20140008622 A | 1/2014 |
| KR | 20140024632 A | 3/2014 |
| KR | 20150038352 A | 4/2015 |
| KR | 20150054503 A | 5/2015 |
| KR | 20150118395 A | 10/2015 |
| KR | 20150118648 A | 10/2015 |
| KR | 20170048393 A | 5/2017 |
| KR | 101758538 B1 | 7/2017 |
| KR | 20170089378 A | 8/2017 |
| KR | 20170093099 A | 8/2017 |
| KR | 20170131945 A | 12/2017 |
| KR | 20180059271 A | 6/2018 |
| KR | 20180126323 A | 11/2018 |
| KR | 20180131118 A | 12/2018 |
| KR | 20190012061 A | 2/2019 |
| KR | 20190036077 A | 4/2019 |
| KR | 20190057065 A | 5/2019 |
| KR | 20190058157 A | 5/2019 |
| KR | 20190064852 A | 6/2019 |
| KR | 20190105174 A | 9/2019 |
| KR | 20190105604 A | 9/2019 |
| KR | 20190118751 A | 10/2019 |
| KR | 20200000664 A | 1/2020 |
| KR | 20200008828 A | 1/2020 |
| KR | 20200035469 A | 4/2020 |
| KR | 20210045538 A | 4/2021 |
| TW | 461083 B | 10/2001 |
| TW | 201114021 A | 4/2011 |
| TW | 201205576 A | 2/2012 |
| TW | 201244065 A | 11/2012 |
| TW | 201510994 A | 3/2015 |
| TW | 201517236 A | 5/2015 |
| TW | 201624708 A | 7/2016 |
| TW | 201631627 A | 9/2016 |
| TW | 201703264 A | 1/2017 |
| TW | 201727836 A | 8/2017 |
| TW | 201737434 A | 10/2017 |
| TW | 201803131 A | 1/2018 |
| TW | 201804615 A | 2/2018 |
| TW | 201814839 A | 4/2018 |
| TW | 201830586 A | 8/2018 |
| TW | 201843811 A | 12/2018 |
| TW | I643317 B | 12/2018 |
| TW | I643318 B | 12/2018 |
| TW | 201904029 A | 1/2019 |
| TW | 201905916 A | 2/2019 |
| TW | 201909386 A | 3/2019 |
| TW | 201913963 A | 4/2019 |
| TW | 201913971 A | 4/2019 |
| TW | 201926642 A | 7/2019 |
| TW | 201931577 A | 8/2019 |
| TW | 673831 B | 10/2019 |
| TW | 201942980 A | 11/2019 |
| TW | 201944543 A | 11/2019 |
| TW | 201946253 A | 12/2019 |
| TW | I681548 B | 1/2020 |
| TW | 202010102 A | 3/2020 |
| TW | 202013684 A | 4/2020 |
| TW | I692038 B | 4/2020 |
| TW | 202029353 A | 8/2020 |
| WO | 0209191 A2 | 1/2002 |
| WO | 2016093947 A1 | 6/2016 |
| WO | 2017091338 A1 | 6/2017 |
| WO | 2018004581 A1 | 1/2018 |
| WO | 2018136730 A1 | 7/2018 |
| WO | 2018136734 A1 | 7/2018 |
| WO | 2018144957 A1 | 8/2018 |
| WO | 2019125352 A1 | 6/2019 |
| WO | 2019152226 A1 | 8/2019 |
| WO | 2020027532 A1 | 2/2020 |
| WO | 2020086566 A1 | 4/2020 |
| WO | 2021029916 A1 | 2/2021 |

OTHER PUBLICATIONS

Liu et al., "Influence of Passivation Layers on Characteristics of a-InGaZnO Thin Film Transistors", IEEE Electron Device Letters, vol. 32. No. 2, pp. 161-163. (Year: 2011).*

(56) References Cited

OTHER PUBLICATIONS

Kim et al., "Synergistic Improvement of Long-Term Plasticity in Photonic Synapses Using Ferroelectric Polarization in Hafnia-Based Oxide-Semiconductor Transistors" Advanced Materials, Feb. 2020, 32, Pohang, Korea, pp. 1-6.

Wei, et al., Chemical solution deposition of ferroelectric Sr:HfO2 film from inorganic salt precursors Journal of Alloys and Compounds, 731 (2018), China, available online Sep. 25, 2017, pp. 546-553.

Gosele et al., "What determines the lateral bonding speed in silicon wafer bonding," Appl. Phys. Lett. Aug. 7, 1995, 67 (6), 863-865.

Karouta, F., "A practical approach to reactive ion etching," J. Phys. D: Appl. Phys. 47 (2014) 233501, May 8, 2014, 15 pages.

Lue, H. et al., "A Novel 3D AND-type NVM Architecture Capable of High-density, Low-power In-Memory Sum-of-Product Computation for Artificial Intelligence Application," 2018 IEEE Symposium on VLSI Technology, Jun. 18-22, 2018, 2 pages.

Navarro, "Direct Wafter Bonding Dynamics," HAL Open Science, Mechanics [physics.med-ph]. Université de Grenoble, Jul. 2014, 116 pages.

Park, J. et al., "A hybrid ferroelectric-flash memory cells," J _ Appl. Phys. 116, 124512, Sep. 29, 2014, 8 pages.

S.M. Sze et al., Physics of Semiconductor Devices, Third Edition, Formation of Barrier, Hoboken, New Jersey, Wiley-Interscience, 2007, ISBN 978-0-471-14323-9 (Belegschrift), p. 137.

Wortman et al., Young's Modulus, Shear Modulus, and Poisson's Ratio in Silicon and Germanium, J. Appl. Phys., Jan. 1, 1965, 36 (1), 153-156.

Wu, B. et al., "High aspect ration silicon etch: A review," J. Appl. Phys. 108, 051101 (2010) : https://doi.org/10.1063/1.3474652, Sep. 9, 2010, 21 pages.

\* cited by examiner

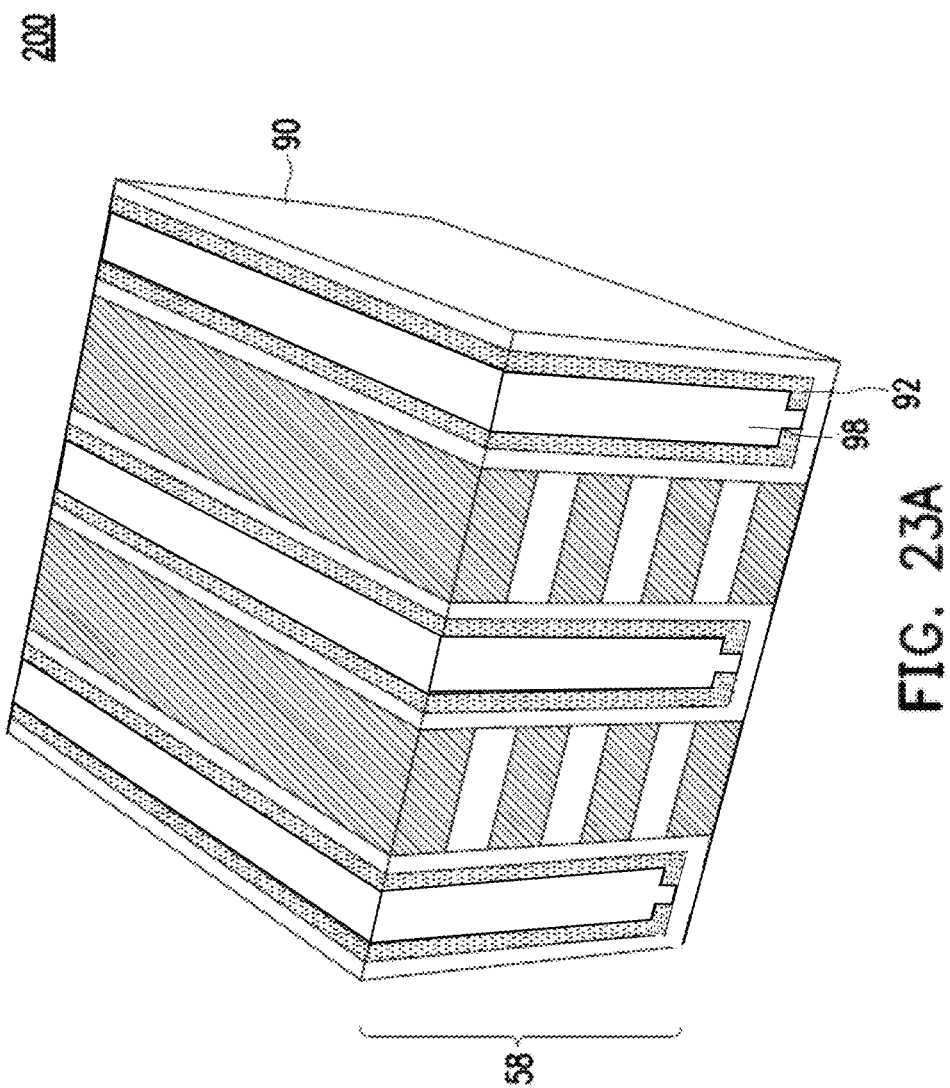

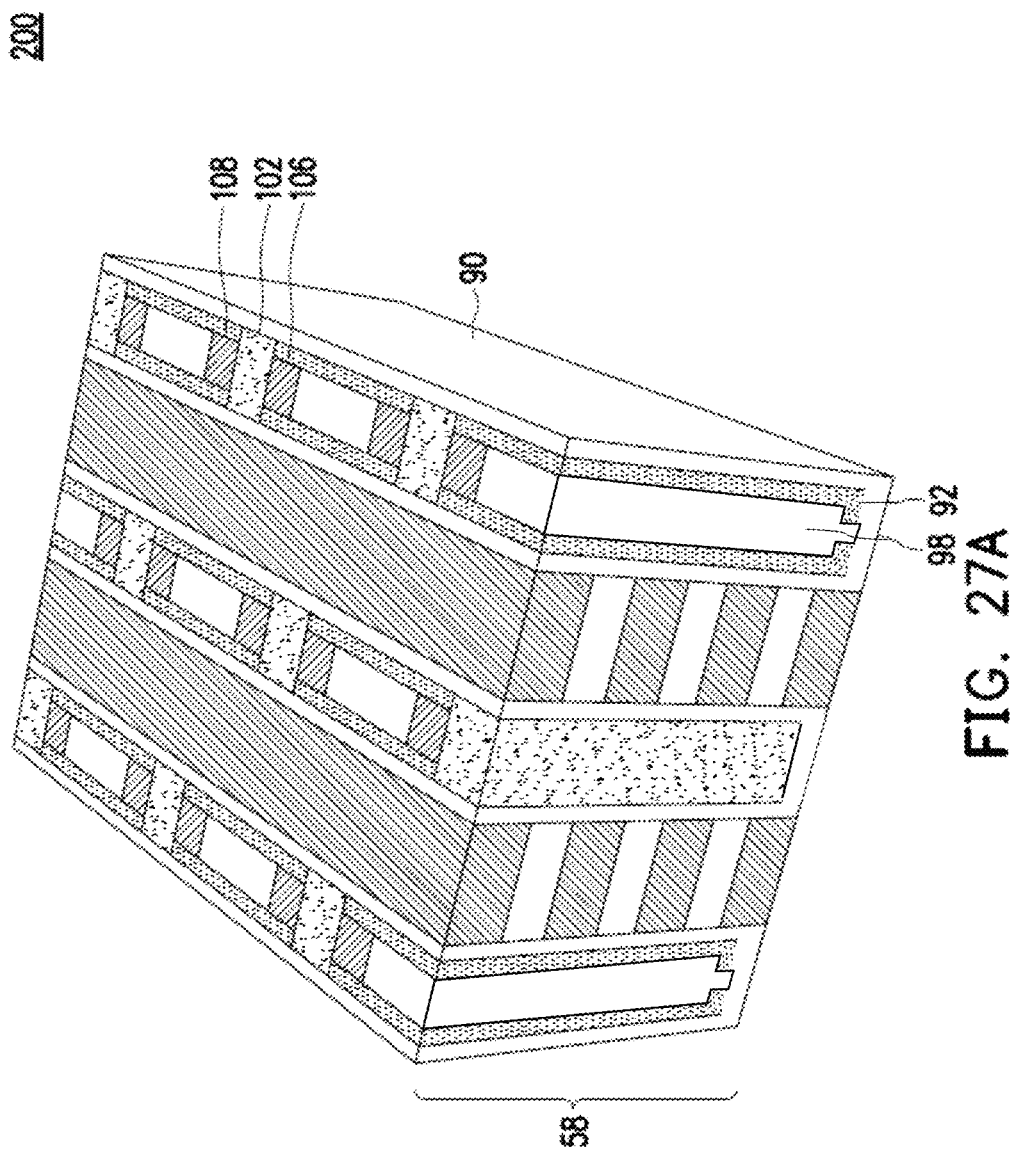

MEMORY ARRAY ISOLATION STRUCTURES

PRIORITY CLAIM AND CROSS-REFERENCE

This application is a divisional of U.S. application Ser. No. 17/119,346, filed on Dec. 11, 2020, which claims the benefit of U.S. Provisional Application No. 63/045,992, filed on Jun. 30, 2020, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4, 5, 6, 7, 8, 9, 10, 11, 12A, 12B, 13, 14, 15, 16, 17A, 17B, 18A, 18B, 19A, 19B, 20, 21, 22A, 22B, 23A, 23B, 23C, 24A, 24B, 24C, 25A, 25B, 25C, 26A, 26B, 26C, 27A, 27B, 27C, 28A, 28B, 28C, and 28D illustrate varying views of manufacturing a memory array in accordance with some embodiments.

DETAILED DESCRIPTION

Figure 1A:
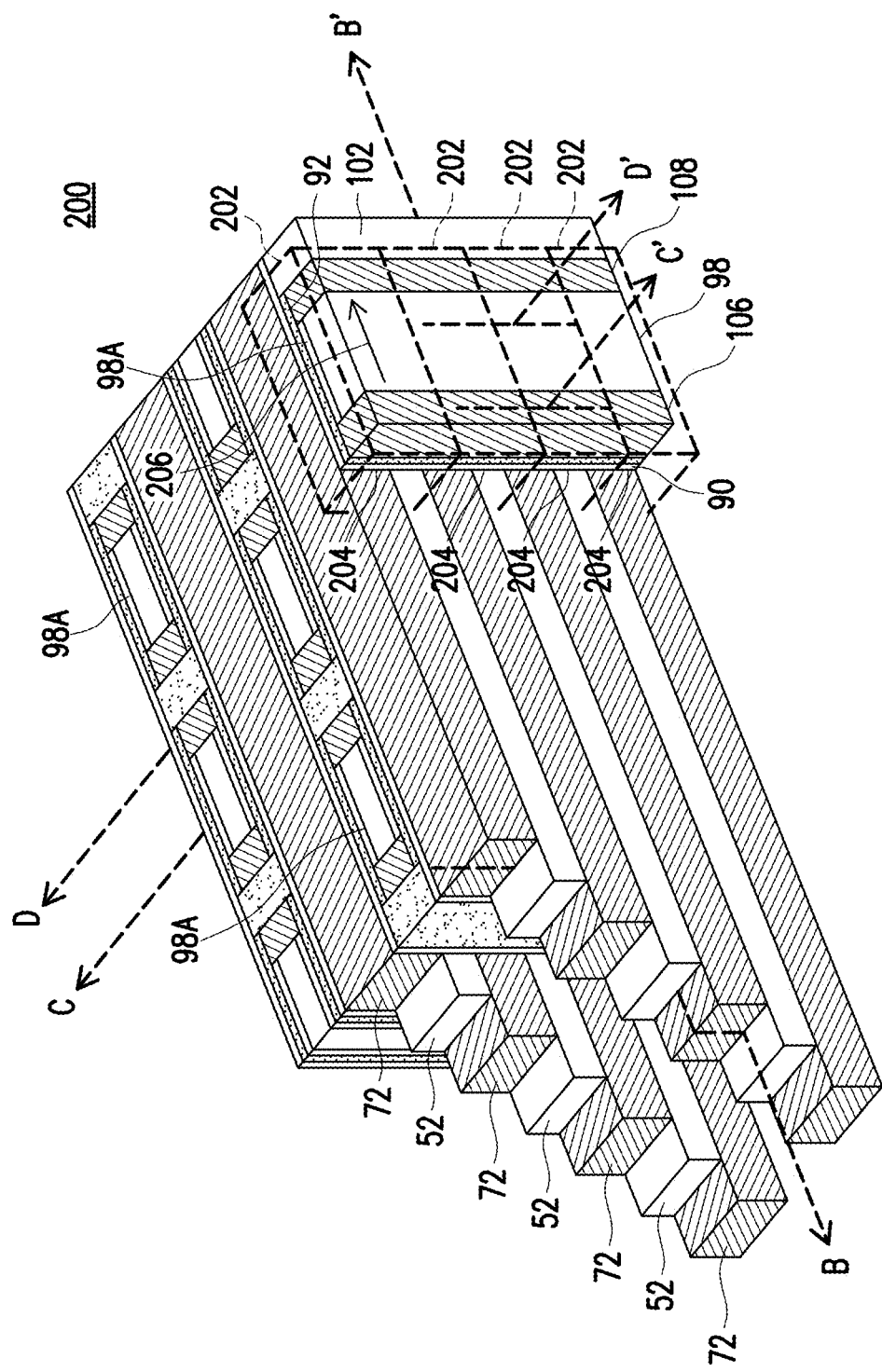
FIGS. 1A, 1B, and 1C illustrate a perspective view, a circuit diagram, and a top down view of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes thin film transistor (TFT) having a word line region acting as a gate electrode, a bit line region acting as a first source/drain electrode, and a source line region acting as a second source/drain electrode. Each TFT further includes an insulating memory film (e.g., as a gate dielectric) and an oxide semiconductor (OS) channel region.

Figure 1B:
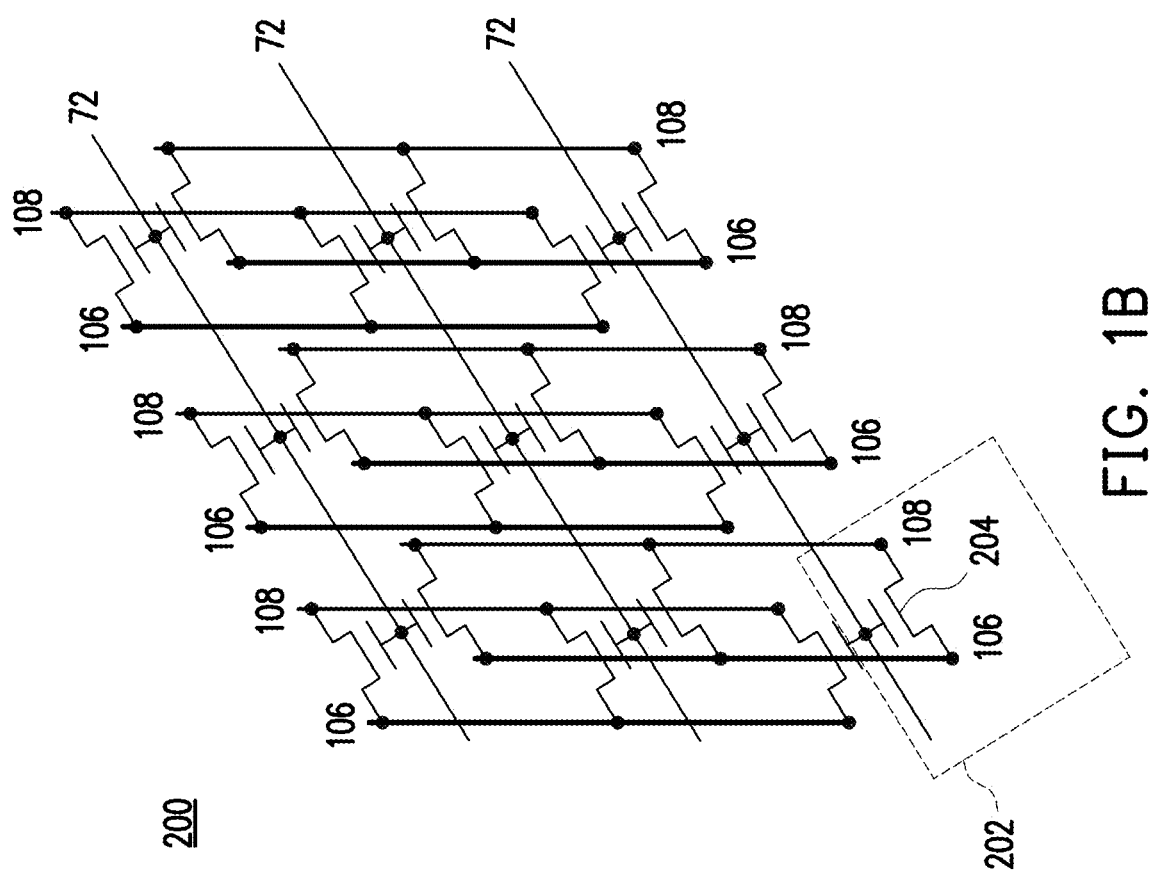
Figure 1C:
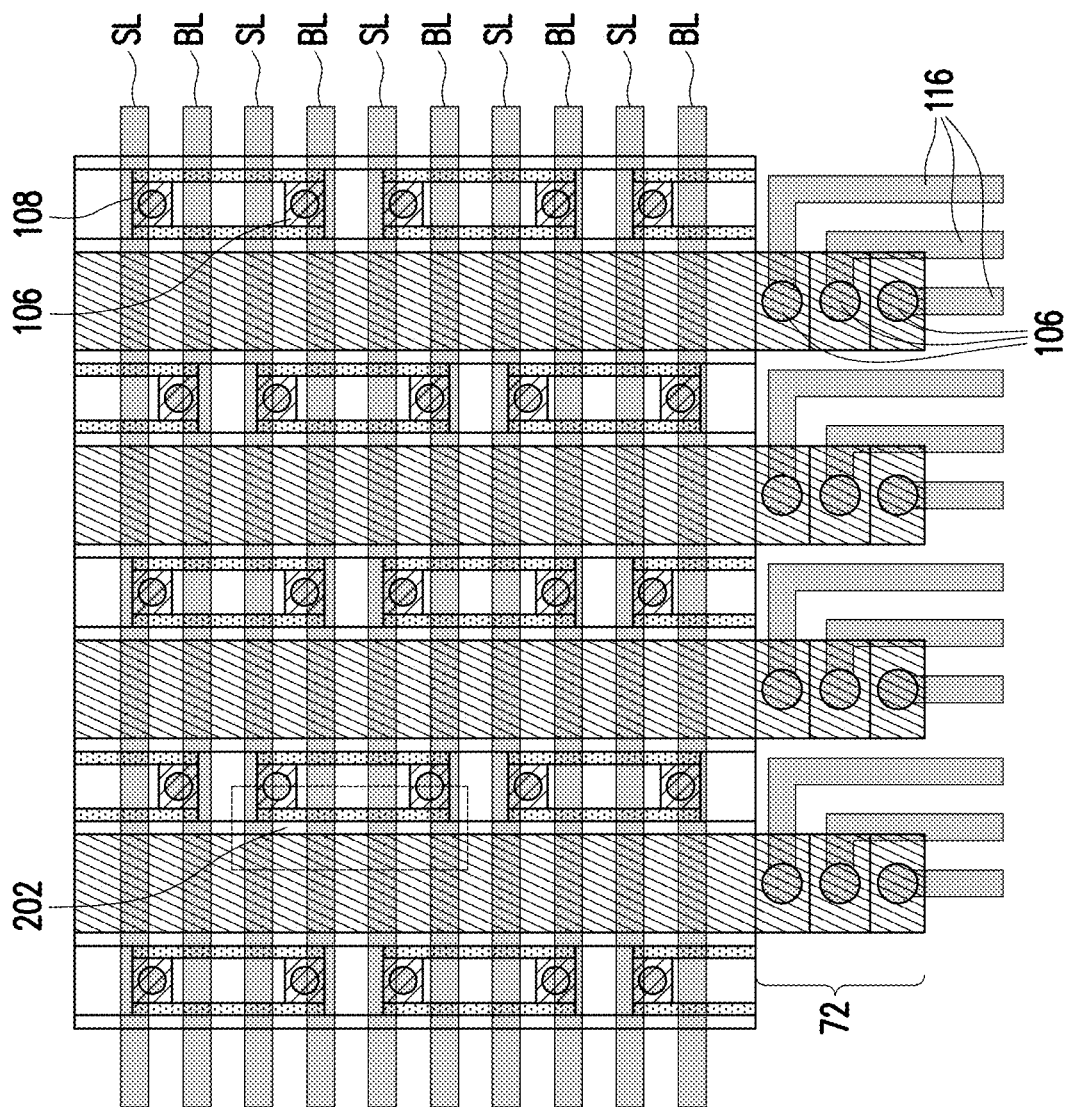

FIGS. 1A, 1B, and 1C illustrate examples of a memory array according to some embodiments. FIG. 1A illustrates an example of a portion of the memory array 200 in a three-dimensional view; FIG. 1B illustrates a circuit diagram of the memory array 200; and FIG. 1C illustrates a top down view of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory array 200 is a flash memory array, such as a NOR flash memory array, or the like. Each memory cell 202 may include a thin film transistor (TFT) 204 with an insulating, memory film 90 as a gate dielectric. In some embodiments, a gate of each TFT 204 is electrically coupled to a respective word line (e.g., conductive line 72), a first source/drain region of each TFT 204 is electrically coupled to a respective bit line (e.g., conductive line 106), and a second source/drain region of each TFT 204 is electrically coupled to a respective source line (e.g., conductive line 108), which electrically couples the second source/drain region to ground. The memory cells 202 in a same horizontal row of the memory array 200 may share a common word line while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG.

1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines) and conductive lines 108 (e.g., source lines). The conductive lines 106 and 108 may each extend in a direction perpendicular to the conductive lines 72. A dielectric material 98 is disposed between and isolates adjacent ones of the conductive lines 106 and the conductive lines 108. In some embodiments, at least a portion of the dielectric material 98 is a low-hydrogen material formed using a hydrogen-comprising precursor that is introduced at a reduced flow rate. For example, at least portions of the dielectric material 98 (e.g., dielectric material 98A) in physical contact with an oxide semiconductor (OS) layer 92 (described below) may have a relatively low hydrogen concentration, such as, a less than 3 atomic percent (at %). The low hydrogen concentration (e.g., in the above range) may reduce hydrogen diffusion into the OS layer 92, thereby reducing defects and improving device stability. For example, by reducing hydrogen diffusion with an embodiment dielectric material 98, the threshold voltage (Vth) curve of the TFTs 204 may shift in a positive bias direction, enhancing stability of the TFTs 204. A relatively low hydrogen concentration can be achieved in the dielectric material 98 by, for example, reducing a flow rate of hydrogen-comprising precursor(s) used to deposit the dielectric material 98. For example, in embodiments where the dielectric material 98 comprises silicon oxide, silicon nitride, or the like, the dielectric material 98 may be deposited by a process with a relatively low $SiH_4$ precursor flow rate to suppress H° or H⁺ diffusion into the dielectric material 98 and the OS layer 92.

Pairs of the conductive lines 106 and 108 along with an intersecting conductive line 72 define boundaries of each memory cell 202, and a dielectric material 102 is disposed between and isolates adjacent pairs of the conductive lines 106 and 108. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

As discussed above, the memory array 200 may also include an oxide semiconductor (OS) layer 92. The OS layer 92 may provide channel regions for the TFTs 204 of the memory cells 202. For example, when an appropriate voltage (e.g., higher than a respective threshold voltage ($V_{th}$) of a corresponding TFT 204) is applied through a corresponding conductive line 72, a region of the OS layer 92 that intersects the conductive line 72 may allow current to flow from the conductive lines 106 to the conductive lines 108 (e.g., in the direction indicated by arrow 206). The OS layer 92 may have a relatively low hydrogen concentration, such as in a range of about $10^{20}$ to about $10^{22}$ atoms per cubic centimeter as measured by Time-of-Flight Secondary Ion Mass Spectrometry (ToF-SIMS) analysis. As a result, stability of the TFTs 204 may be improved compared to TFTs with OS layers having a higher concentration of hydrogen.

A memory film 90 is disposed between the conductive lines 72 and the OS layer 92, and the memory film 90 may provide gate dielectrics for the TFTs 204. In some embodiments, the memory film 90 comprises a ferroelectric material, such as a hafnium oxide, hafnium zirconium oxide, silicon-doped hafnium oxide, or the like. Accordingly, the memory array 200 may also be referred to as a ferroelectric random access memory (FERAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the memory cells 202), and a continuous region of the memory film 90 may extend across a plurality of memory cells 202. Depending on a polarization direction of a particular region of the memory film 90, a threshold voltage of a corresponding TFT 204 varies, and a digital value (e.g., 0 or 1) can be stored. For example, when a region of the memory film 90 has a first electrical polarization direction, the corresponding TFT 204 may have a relatively low threshold voltage, and when the region of the memory film 90 has a second electrical polarization direction, the corresponding TFT 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory film 90 corresponding to the memory cell 202. The write voltage can be applied, for example, by applying appropriate voltages to a corresponding conductive line 72 (e.g., the word line) and the corresponding conductive lines 106/108 (e.g., the bit line/source line). By applying the write voltage across the portion of the memory film 90, a polarization direction of the region of the memory film 90 can be changed. As a result, the corresponding threshold voltage of the corresponding TFT 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the word line). Depending on the polarization direction of the corresponding region of the memory film 90, the TFT 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Cross-section B-B' is along a longitudinal axis of conductive lines 72 and in a direction, for example, parallel to the direction of current flow of the TFTs 204. Cross-section C-C' is perpendicular to cross-section B-B' and is perpendicular to a longitudinal axis of the conductive lines 72. Cross-section C-C' extends through the conductive lines 106. Cross-section D-D' is parallel to cross-section C-C' and extends through the dielectric material 102. Subsequent figures refer to these reference cross-sections for clarity.

Figure 2:
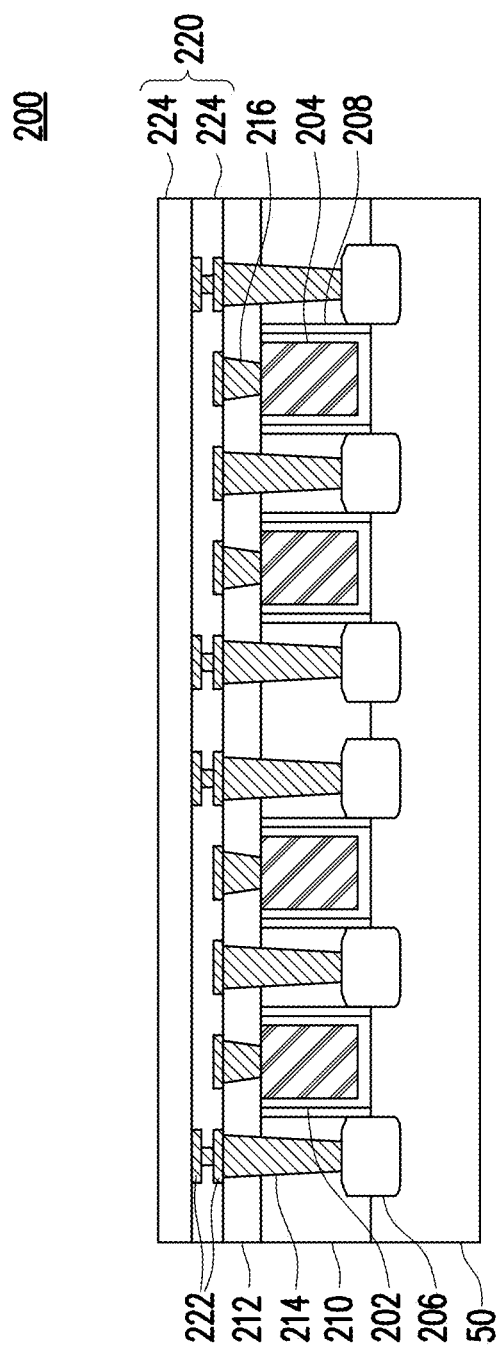

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 202 over top surfaces of the substrate 50 and gate electrodes 204 over the gate dielectric layers 202. Source/drain regions 206 are disposed in the substrate 50 on opposite sides of the gate dielectric layers 202 and the gate electrodes 204. Gate spacers 208 are formed along sidewalls of the gate dielectric layers 202 and separate the source/drain regions 206 from the gate electrodes 204 by appropriate lateral distances. In some embodiments, the transistors may be planar field effect transistors (FETs), fin field effect transistors (finFETs), nano-field effect transistors (nanoFETs), or the like.

A first ILD 210 surrounds and isolates the source/drain regions 206, the gate dielectric layers 202, and the gate electrodes 204 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 204. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 200 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
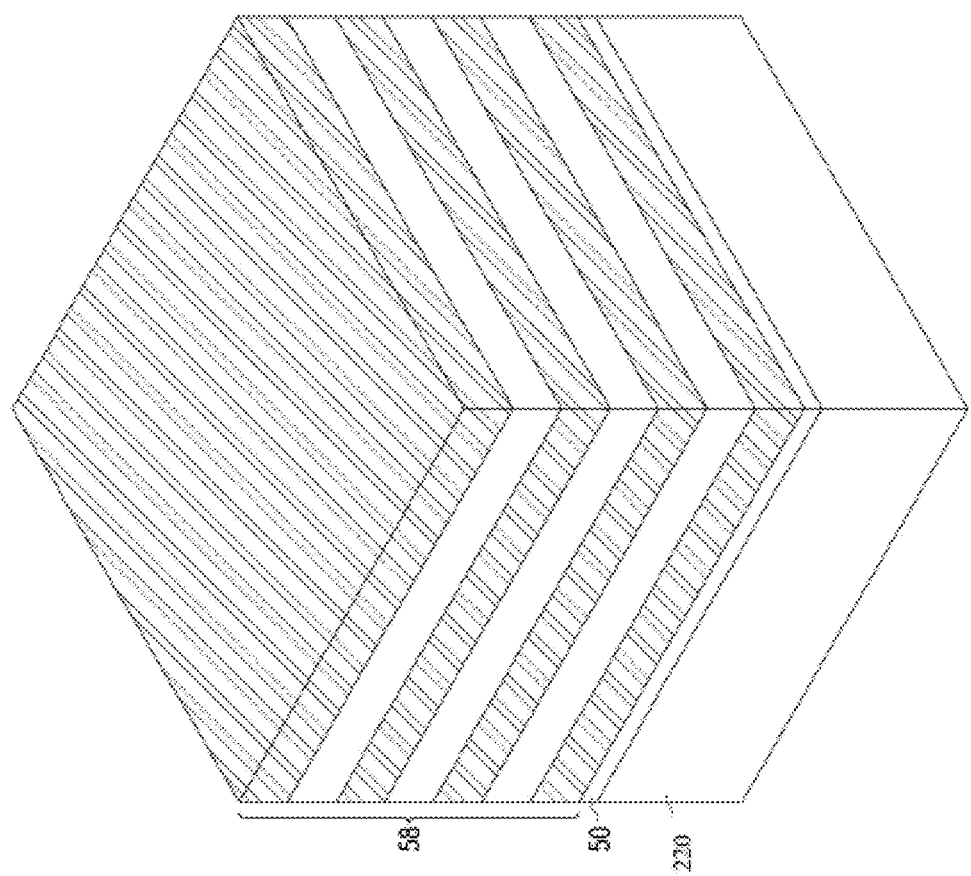
Figure 3B:
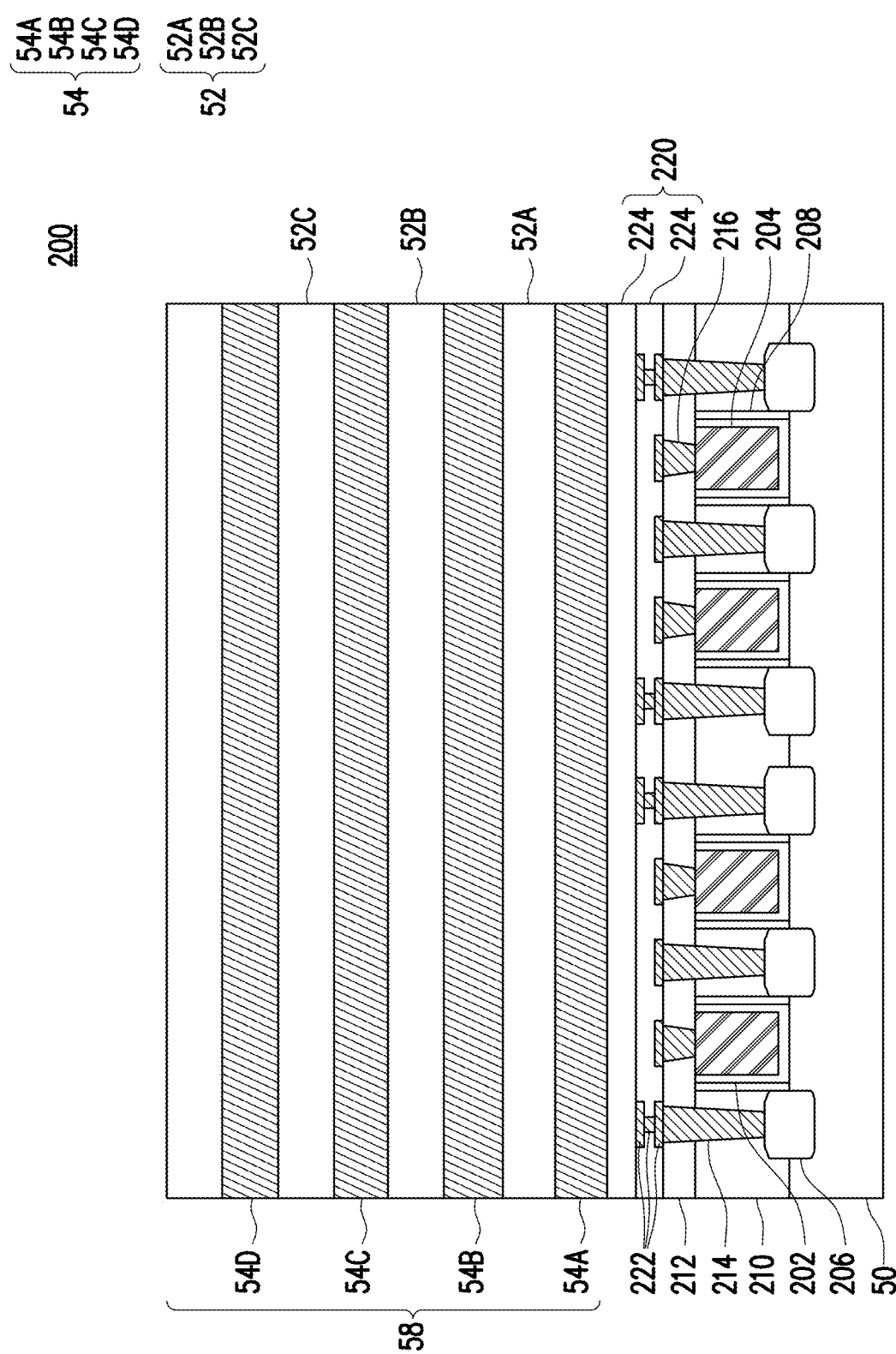

In FIGS. 3A and 3B, a multi-layer stack 58 is formed over the structure of FIG. 2. The substrate 50, the transistors, the ILDs, and the interconnect structure 120 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive lines 72A-D (collectively referred to as conductive layers 54) and dielectric layers 52A-C (collectively referred to as dielectric layers 52). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52.

FIGS. 4 through 12B are views of intermediate stages in the manufacturing a staircase structure of the memory array 200, in accordance with some embodiments. FIGS. 4 through 11 and 12B are illustrated along reference cross-section B-B' illustrated in FIG. 1. FIG. 12A is illustrated in a three-dimensional view.

Figure 4:
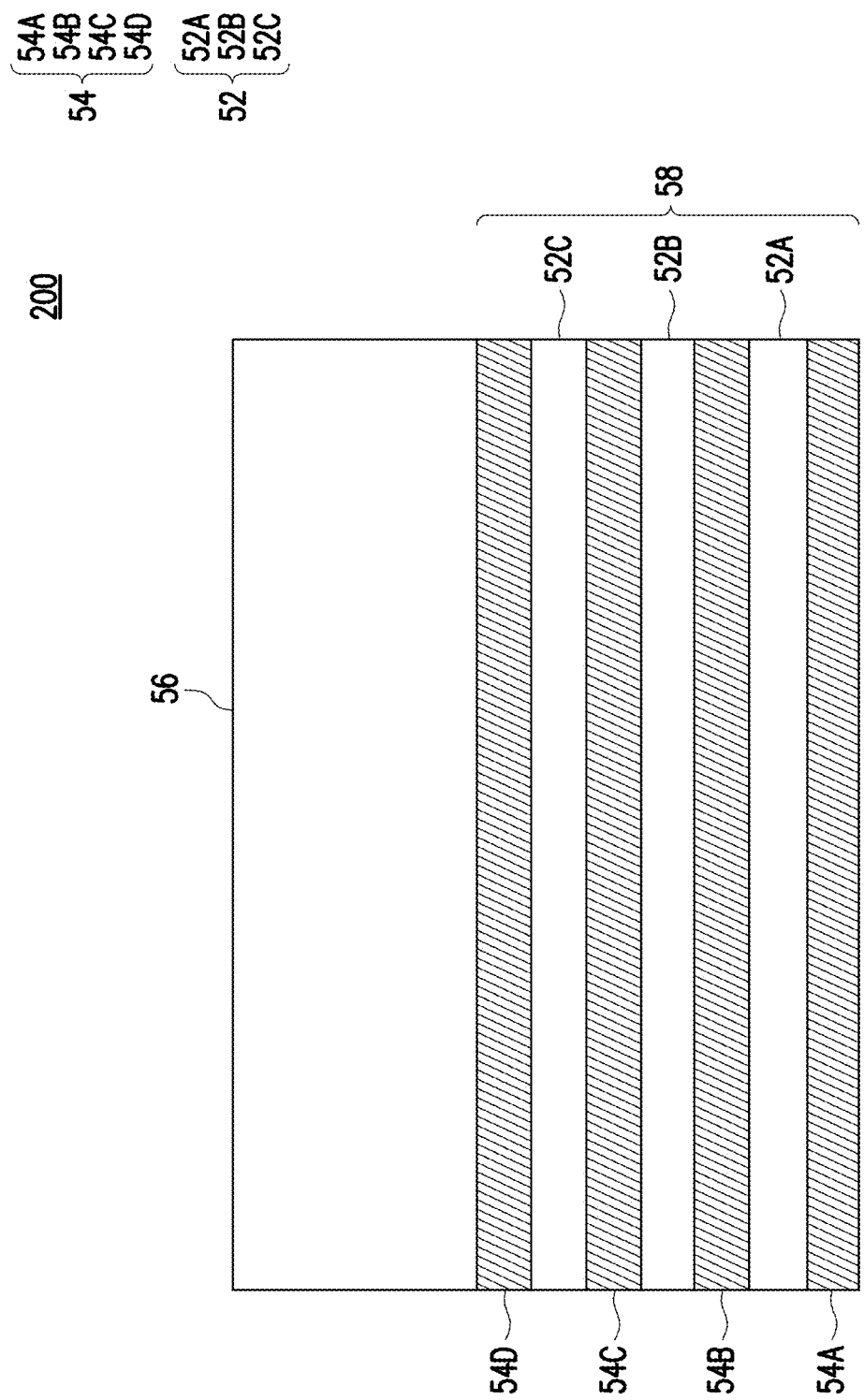

In FIG. 4 a photoresist 56 is formed over the multi-layer stack 58. As discussed above, the multi-layer stack 58 may comprise alternating layers of the conductive layers 54 (labeled 54A, 54B, 54C, and 54D) and the dielectric layers 52 (labeled 52A, 52B, and 52C). The photoresist 56 can be formed by using a spin-on technique.

Figure 5:
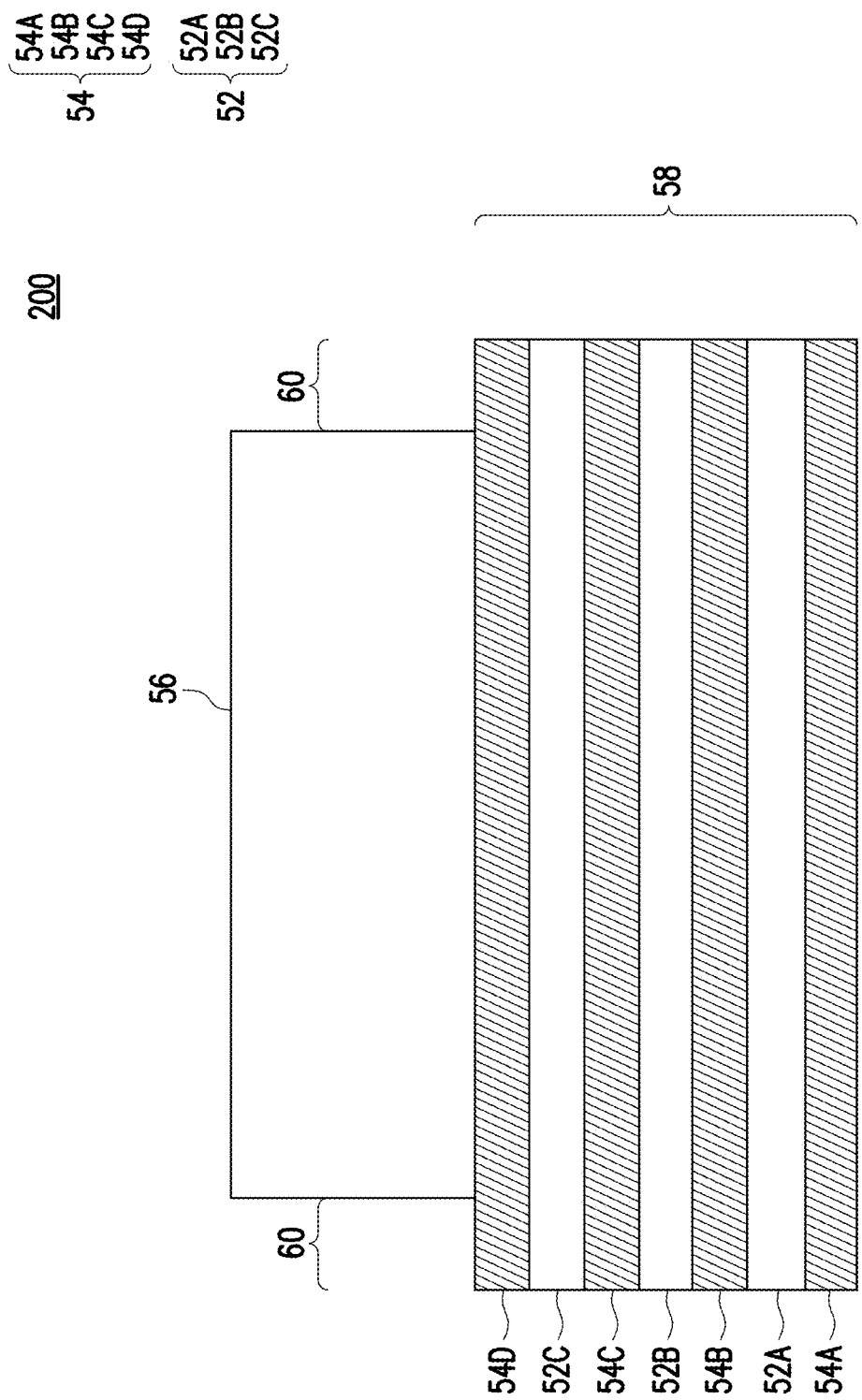
Figure 6:
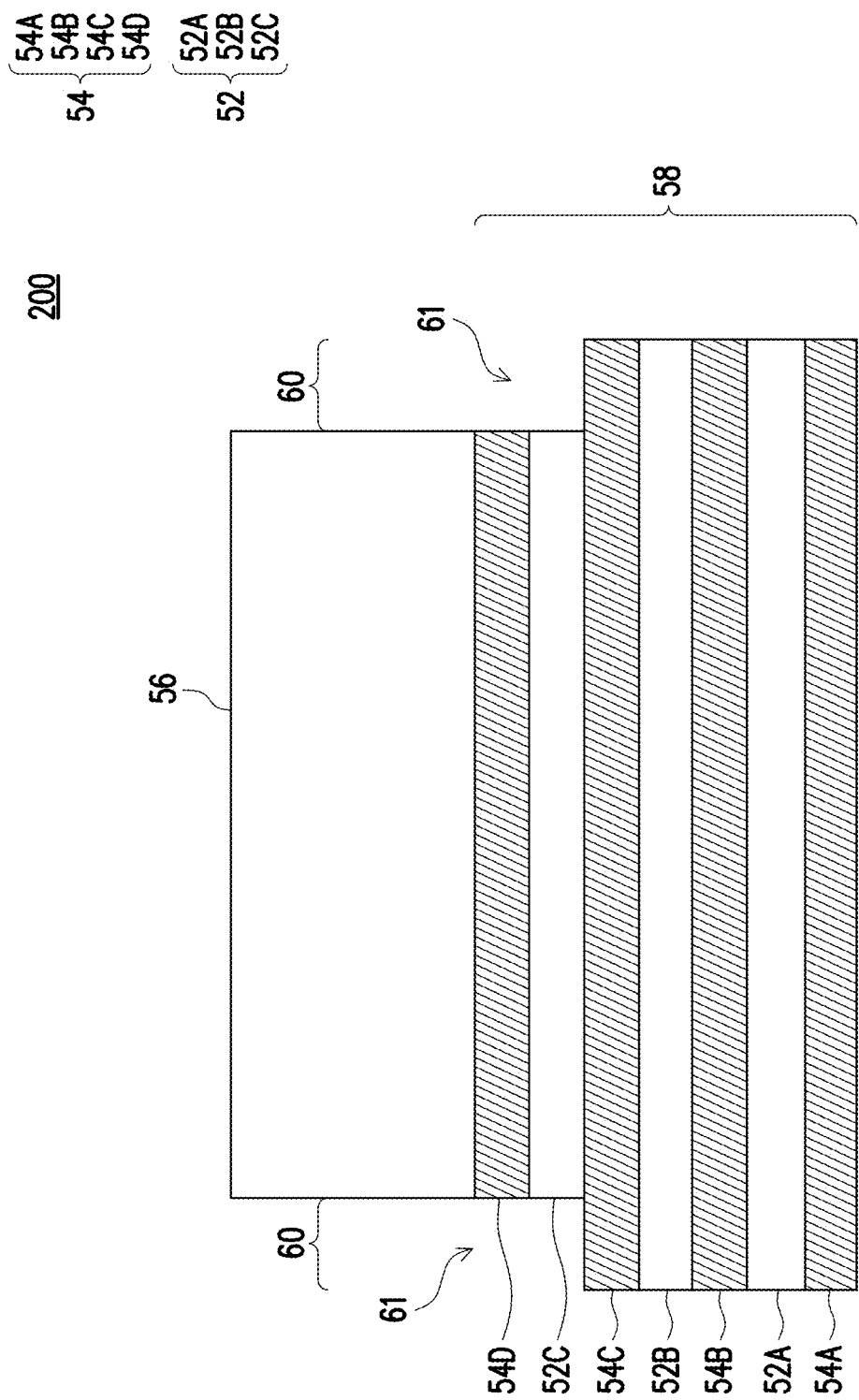

In FIG. 5, the photoresist 56 is patterned to expose the multi-layer stack 58 in regions 60 while masking remaining portions of the multi-layer stack 58. For example, a topmost layer of the multi-layer stack 58 (e.g., conductive layer 54D) may be exposed in the regions 60. The photoresist 56 may be patterned using acceptable photolithography techniques In FIG. 6, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive layer 54D and dielectric layer 52C in the regions 60 and define openings 61. Because the conductive layer 54D and the dielectric layer 52C have different material compositions, etchants used to remove exposed portions of these layers may be different. In some embodiments, the dielectric layer 52C acts as an etch stop layer while etching the conductive layer 54D, and the conductive layer 54C acts as an etch stop layer while etching dielectric layer 52C. As a result, the portions of the conductive layer 54D and the dielectric layer 52C may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive layer 54C is exposed in the regions 60.

Figure 7:
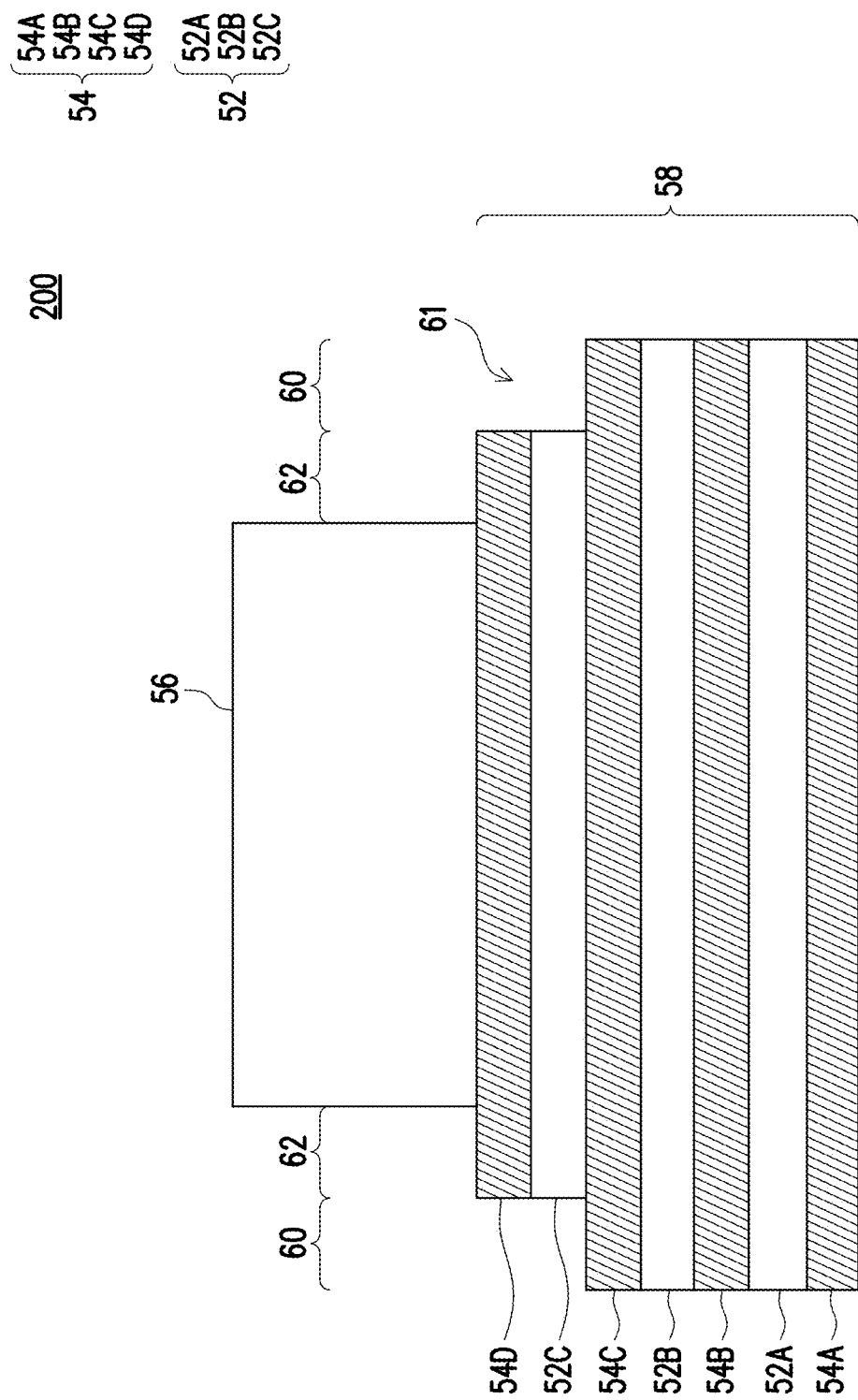

In FIG. 7, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 and 62 may be exposed. For example, a top surface of the conductive layer 54C may be exposed in the regions 60, and a top surface of the conductive layer 54D may be exposed in the regions 62.

Figure 8:
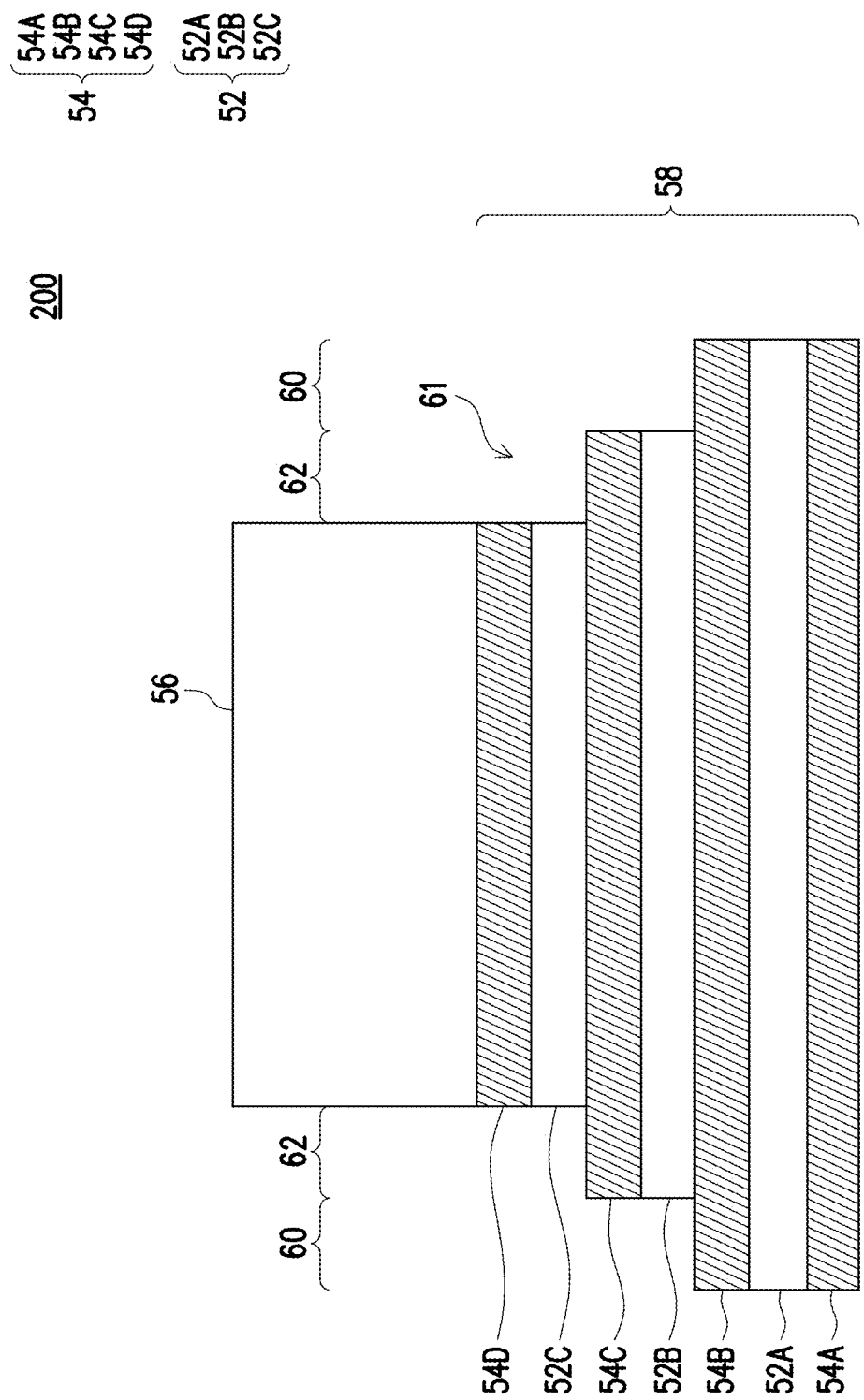

In FIG. 8, portions of the conductive layer 54D, the dielectric layer 52C, the conductive layer 54C, and the dielectric layer 52B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54D/54C and the dielectric layers 52C/52B have different material compositions, etchants used to remove exposed portions of these layers may be different. In some embodiments, the dielectric layer 52C acts as an etch stop layer while etching the conductive layer 54D; the conductive layer 54C acts as an etch stop layer while etching dielectric layer 52C; the dielectric layer 52B acts as an etch stop layer while etching the conductive layer 54C; and the conductive layer 54B acts as an etch stop layer while etching the dielectric layer 52B. As a result, portions of the conductive layers 54D/54C and the dielectric layer 52C/52B may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the conductive layer 54D and dielectric layer 52C (see FIG. 7) may be transferred to the underlying conductive layer 54C and dielectric layer 52B. In the resulting structure, the conductive layer 54B is exposed in the regions 60, and the conductive layer 54C is exposed in the regions 62.

Figure 9:
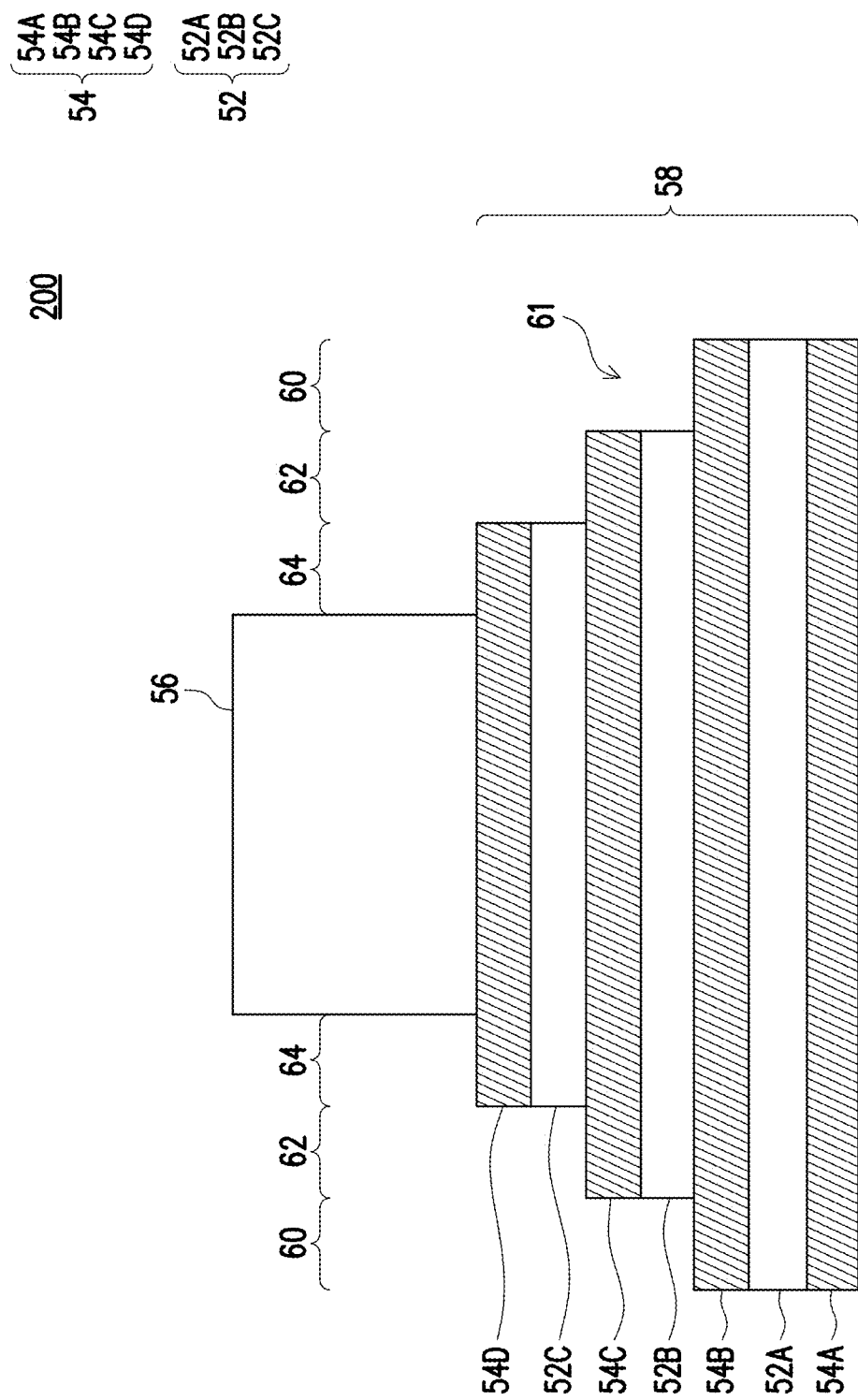

In FIG. 9, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60, 62, and 64 may be exposed. For example, a top surface of the conductive layer 54B may be exposed in the regions 60; a top surface of the conductive layer 54C may be exposed in the regions 62; and a top surface of the conductive layer 54D may be exposed in the regions 64.

Figure 10:
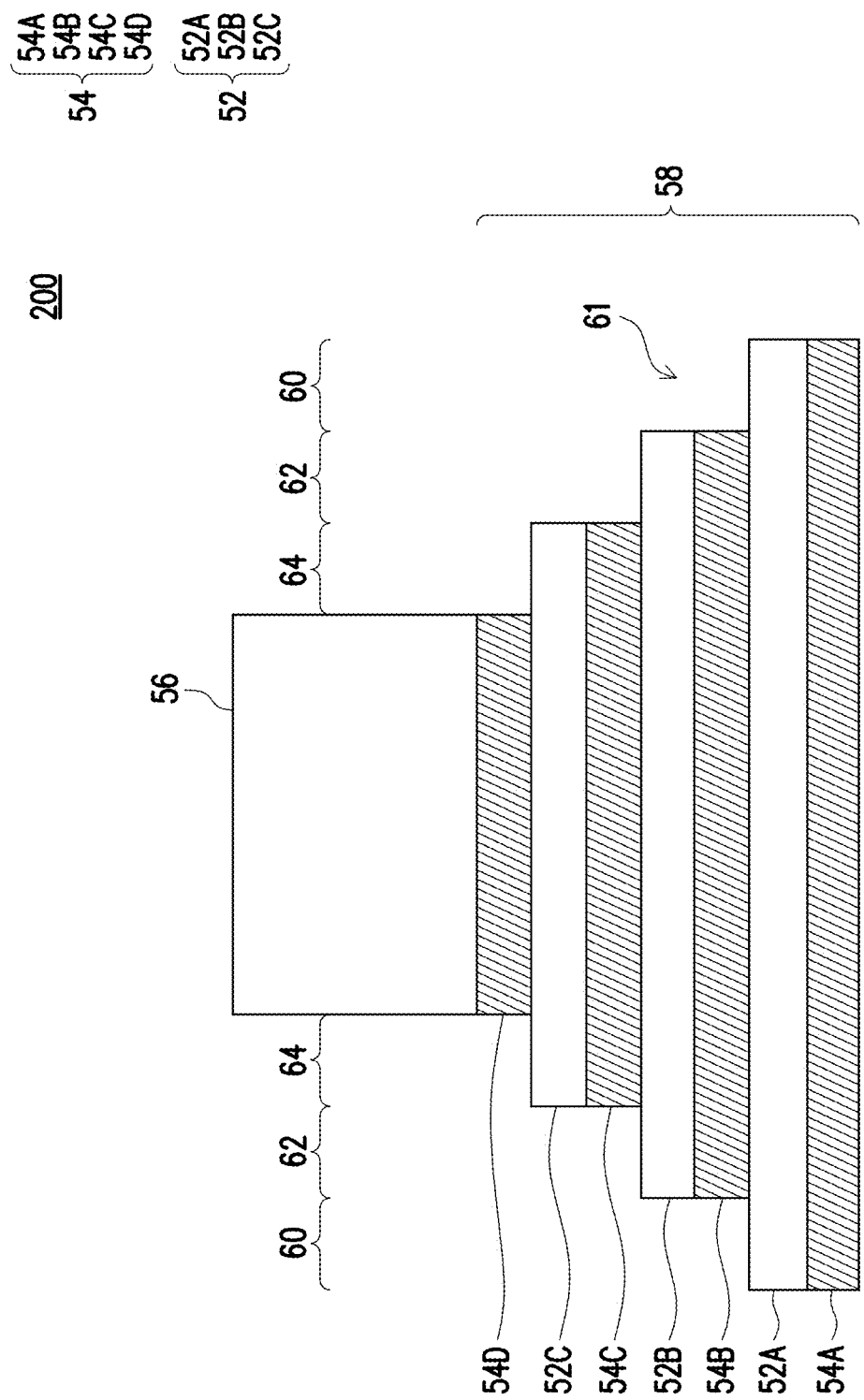

In FIG. 10, portions of the conductive layers 54D, 54C, and 54B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the dielectric layer 52C acts as an etch stop layer while etching the conductive layer 54D; the dielectric layer 52B acts as an etch stop layer while etching the conductive layer 54C; and the dielectric layer 52A acts as an etch stop layer etching the conductive layer 54B. As a result, portions of the conductive layers 54D, 54C, and 54B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the dielectric layers 52C/52B (see FIG. 9) may be transferred to the underlying conductive layers 54C/54B. In the resulting structure, the dielectric layer 52A is exposed in the regions 60; the dielectric layer 52B is exposed in the regions 62; and the dielectric layer 52C is exposed in the regions 64.

Figure 11:
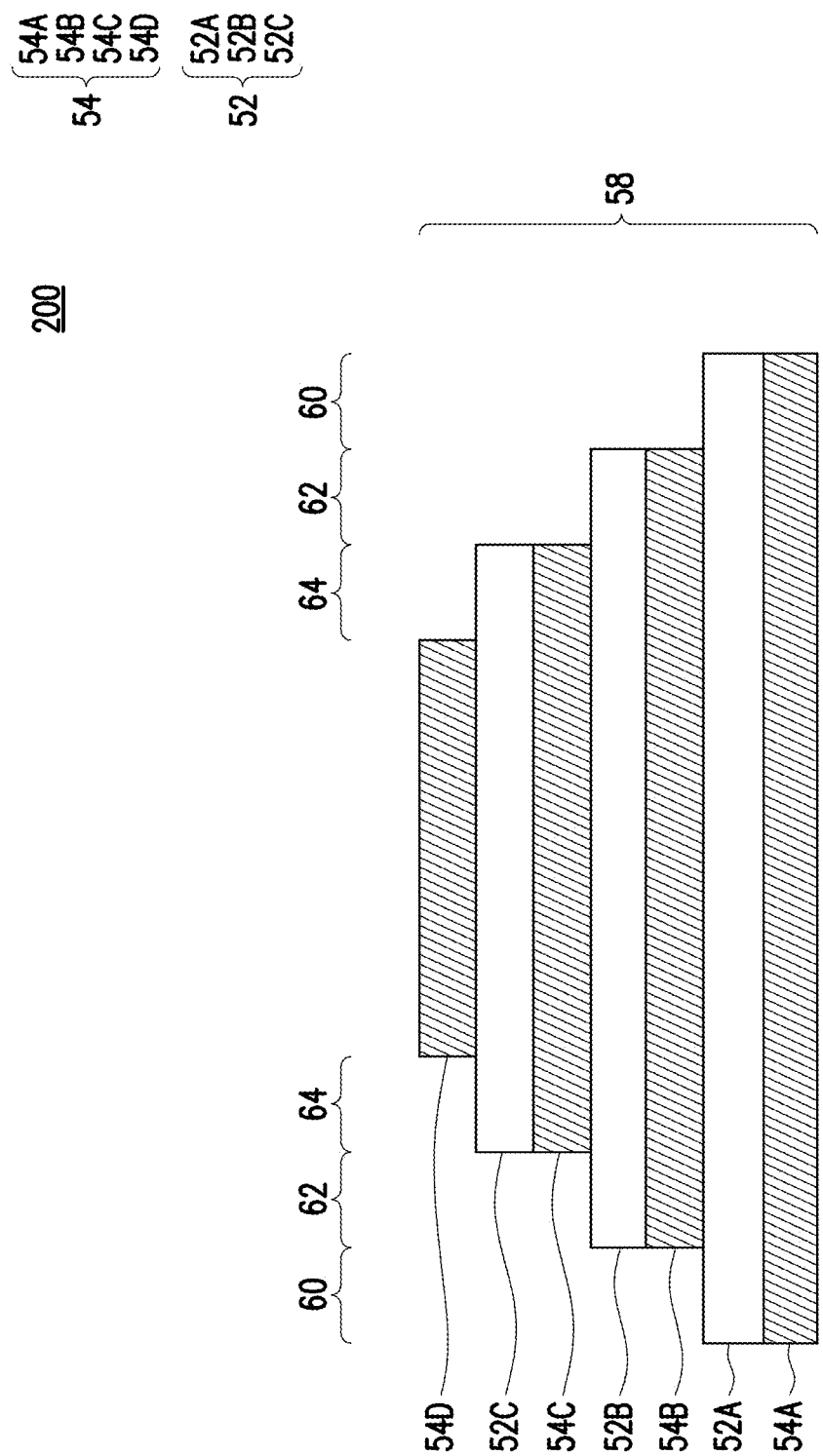
Figure 12A:
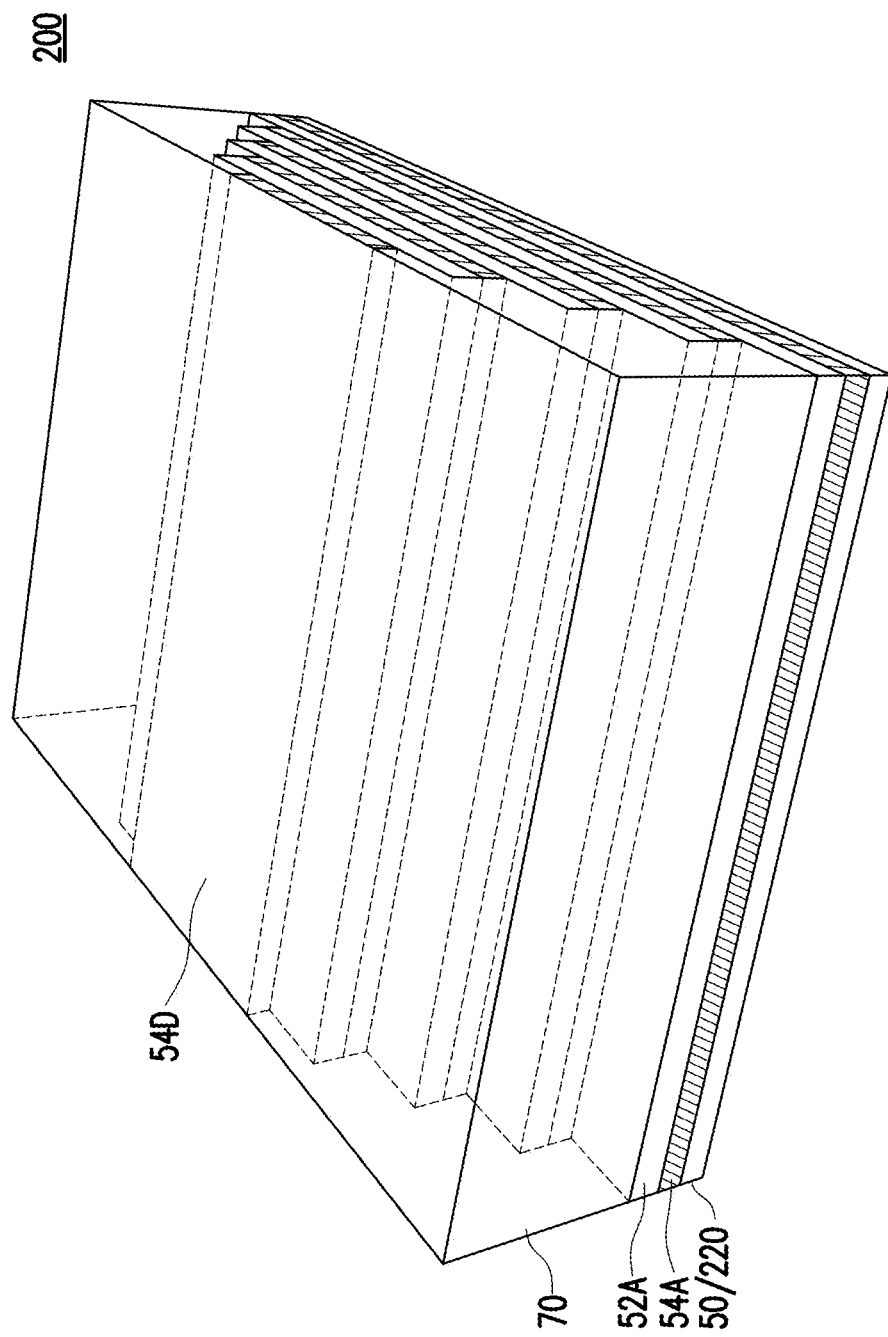
Figure 12B:
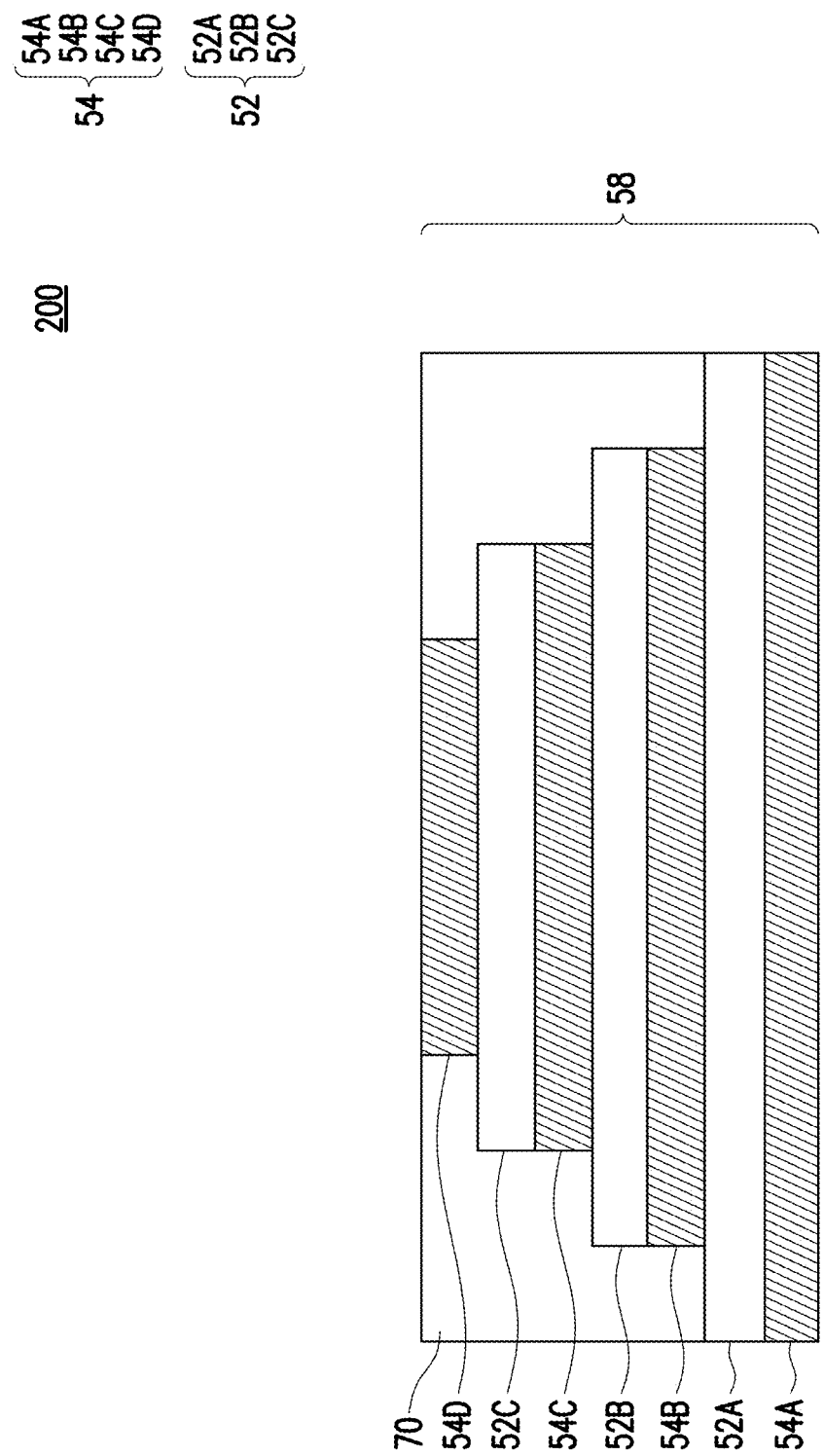

In FIG. 11, the photoresist 56 may be removed, such as by an acceptable ashing or wet strip process. Thus, a staircase structure 68 is formed. The staircase structure comprises a stack of alternating ones of the conductive layers 54 and the dielectric layers 52. Lower conductive layers 54 are wider and extend laterally past upper conductive layers 54, and a width of each of the conductive layers 54 increases in a direction towards the substrate 50. For example, the conductive layer 54A may longer than the conductive layer 54B; the conductive layer 54B may be longer than the conductive layer 54C; and the conductive layer 54C may be longer than the conductive layer 54D. As a result, conductive contacts can be made from above the staircase structure 68 to each of the conductive layers 54 in subsequent processing steps.

In FIG. 12, an inter-metal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive layers 54 as well as sidewalls of the dielectric layers 52. Further, the IMD 70 may contact top surfaces of each of the dielectric layers 52.

As further illustrated in FIG. 12, a removal process is then applied to the IMD 70 to remove excess dielectric material over the multi-layer stack 58. In some embodiments, a planarization process such as a chemical mechanical polish (CMP), an etch-back process, combinations thereof, or the like may be utilized. The planarization process exposes the multi-layer stack 58 such that top surfaces of the multi-layer stack 58 and IMD 70 are level after the planarization process is complete.

FIGS. 13 through 17B are views of intermediate stages in the manufacturing of the memory array 200, in accordance with some embodiments. In FIGS. 13 through 17B the multi-layer stack 58 is formed and trenches are formed in the multi-layer stack 58, thereby defining the conductive lines 72. The conductive lines 72 may correspond to word lines in the memory array 200, and the conductive lines 72 may further provide gate electrodes for the resulting TFTs of the memory array 200. FIG. 17A is illustrated in a three-dimensional view. FIGS. 13 through 16 and 17B are illustrated along reference cross-section C-C' illustrated in FIG. 1A.

Figure 13:
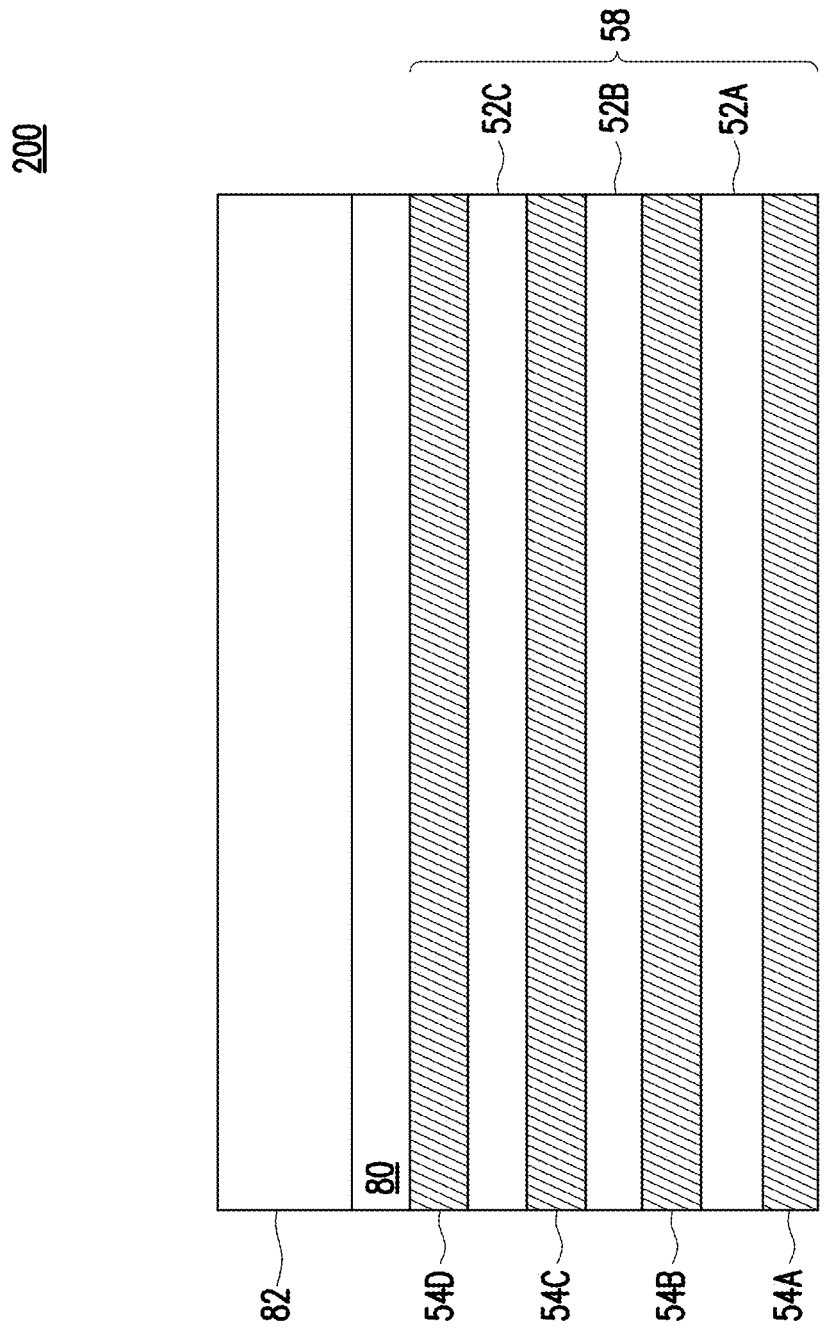

In FIG. 13, a hard mask 80 and a photoresist 82 are deposited over the multi-layer stack 58. The hard mask layer 80 may include, for example, silicon nitride, silicon oxynitride, or the like, which may be deposited by CVD, PVD, ALD, PECVD, or the like. The photoresist 82 can be formed by using a spin-on technique, for example.

Figure 14:
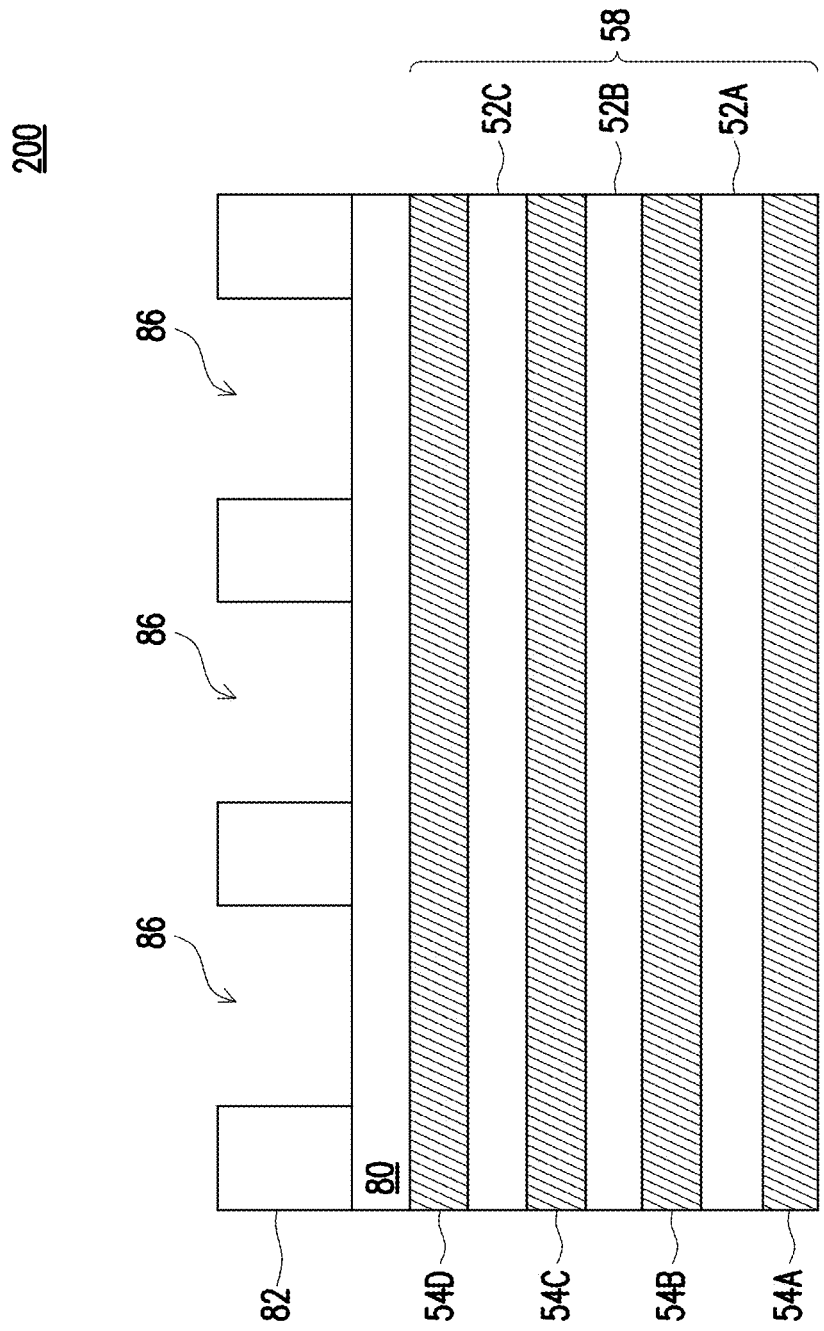

In FIG. 14, the photoresist 82 is patterned to form trenches 86. The photoresists can be patterned using acceptable photolithography techniques. For example, the photoresist 82 be exposed to light for patterning. After the exposure process, the photoresist 82 may be developed to remove exposed or unexposed portions of the photo resist depending on whether a negative or positive resist is used, thereby defining a patterning of the form trenches 86.

Figure 15:
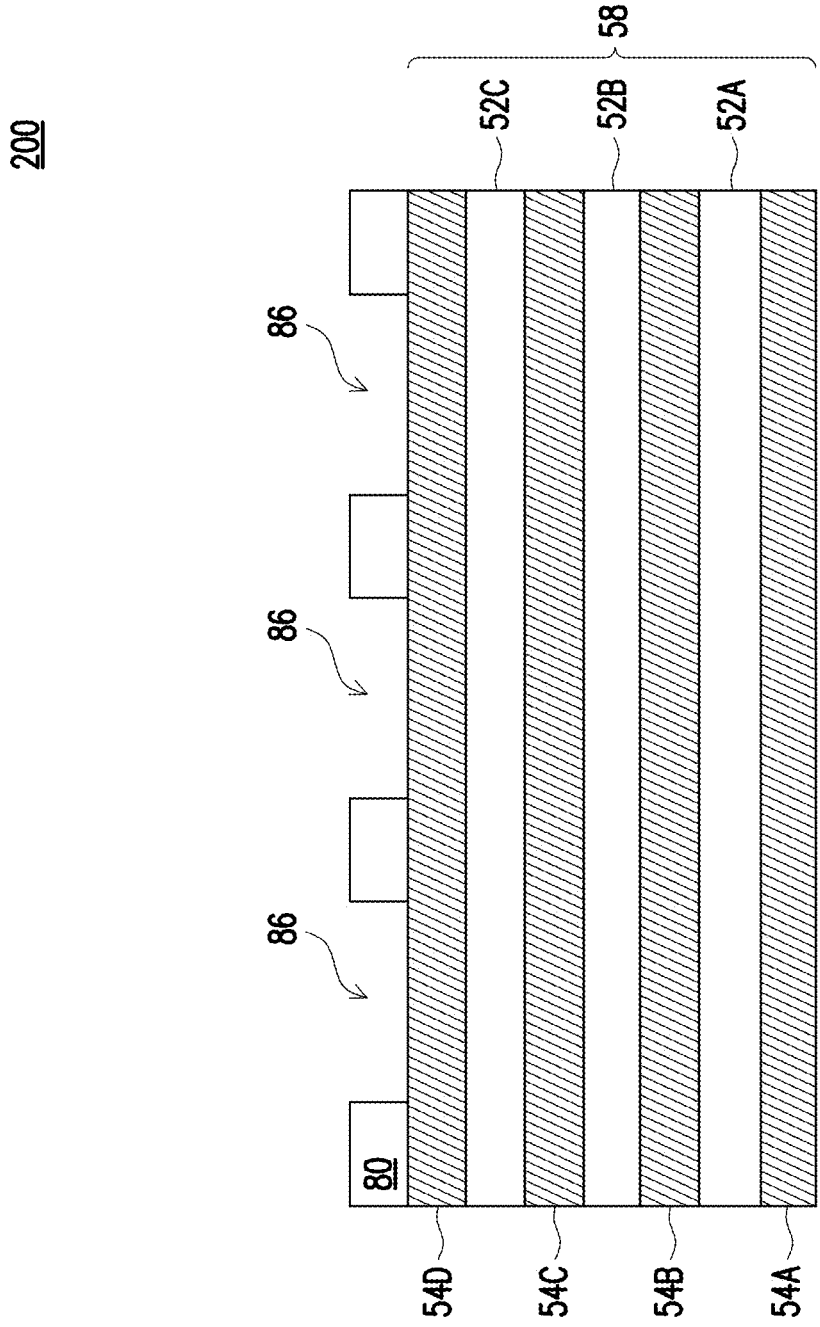

In FIG. 15, a pattern of the photoresist 82 is transferred to the hard mask 80 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 80. The photoresist 82 may be removed by an ashing process, for example.

Figure 16:
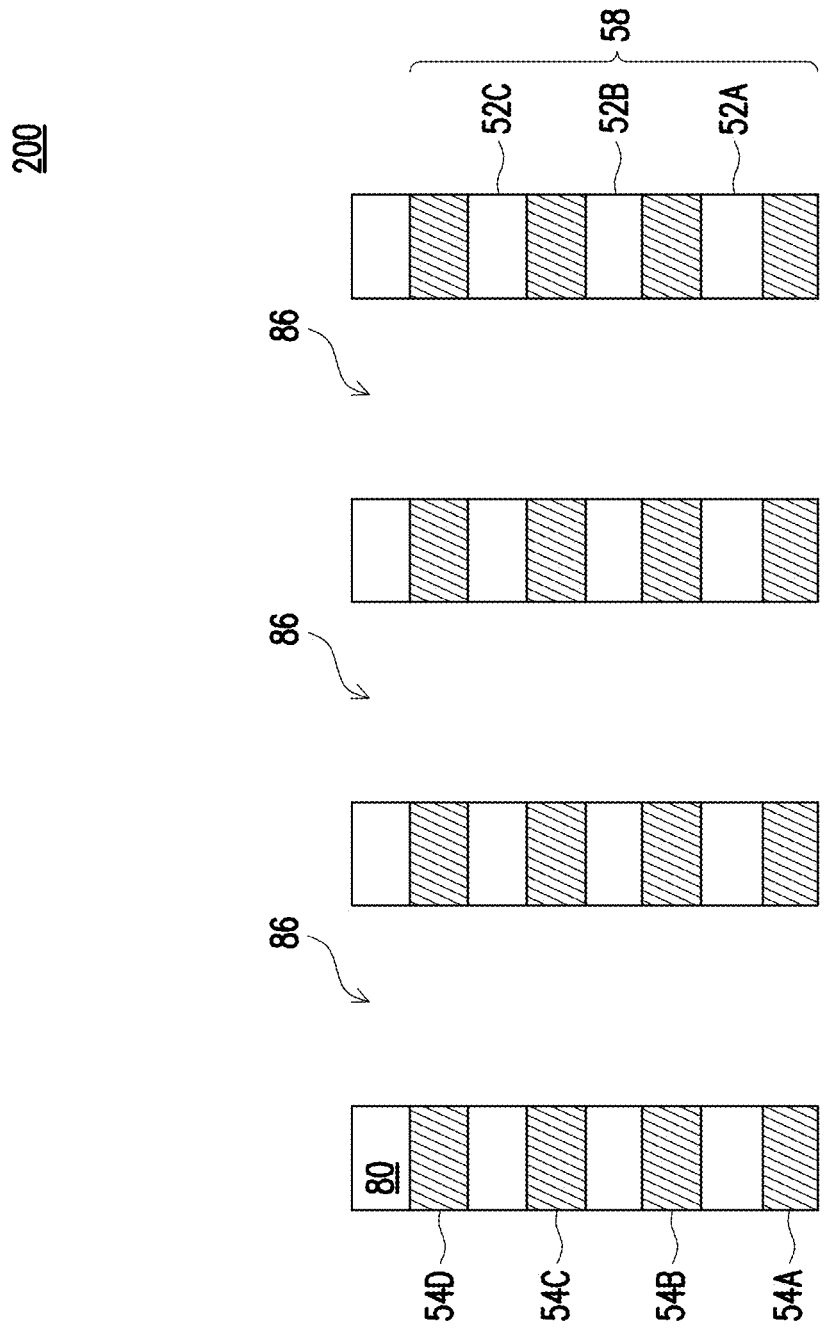
Figure 17A:
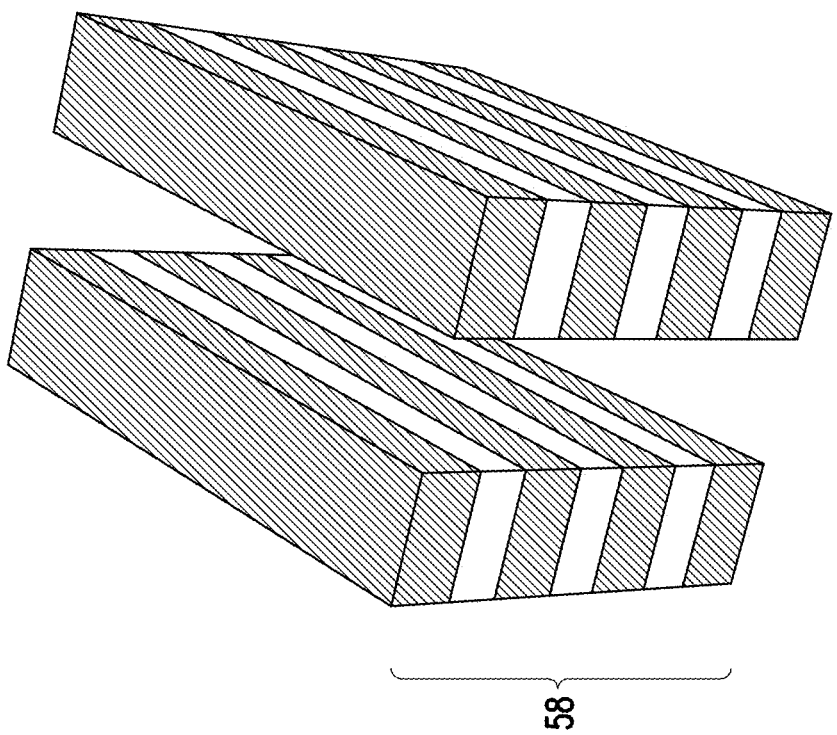
Figure 17B:
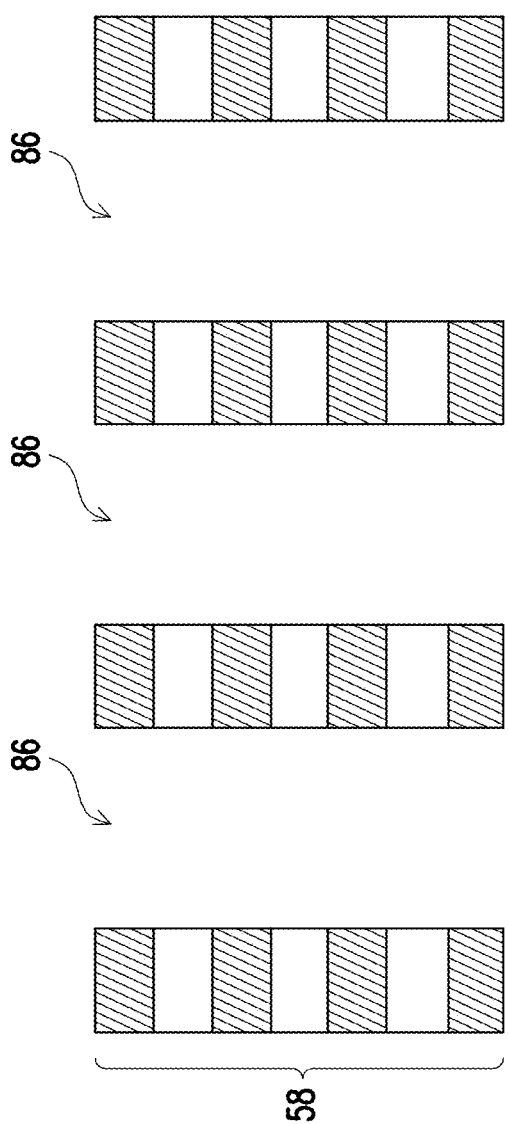

In FIG. 16, a pattern of the hard mask 80 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other. Subsequently, in FIGS. 17A and 17B, the hard mask 80 may then be removed by an acceptable process, such as a wet etching process, a dry etching process, a planarization process, combinations thereof, or the like. Due to the staircase shape of the multi-layered stack 58 (see e.g., FIG. 12), the conductive lines 72 may have varying lengths that increase in a direction towards the substrate 50. For example, the conductive lines 72A may be longer than the conductive lines 72B; the conductive lines 72B may be longer than the conductive lines 72C; and the conductive lines 72C may be longer than the conductive lines 72D.

Figure 18A:
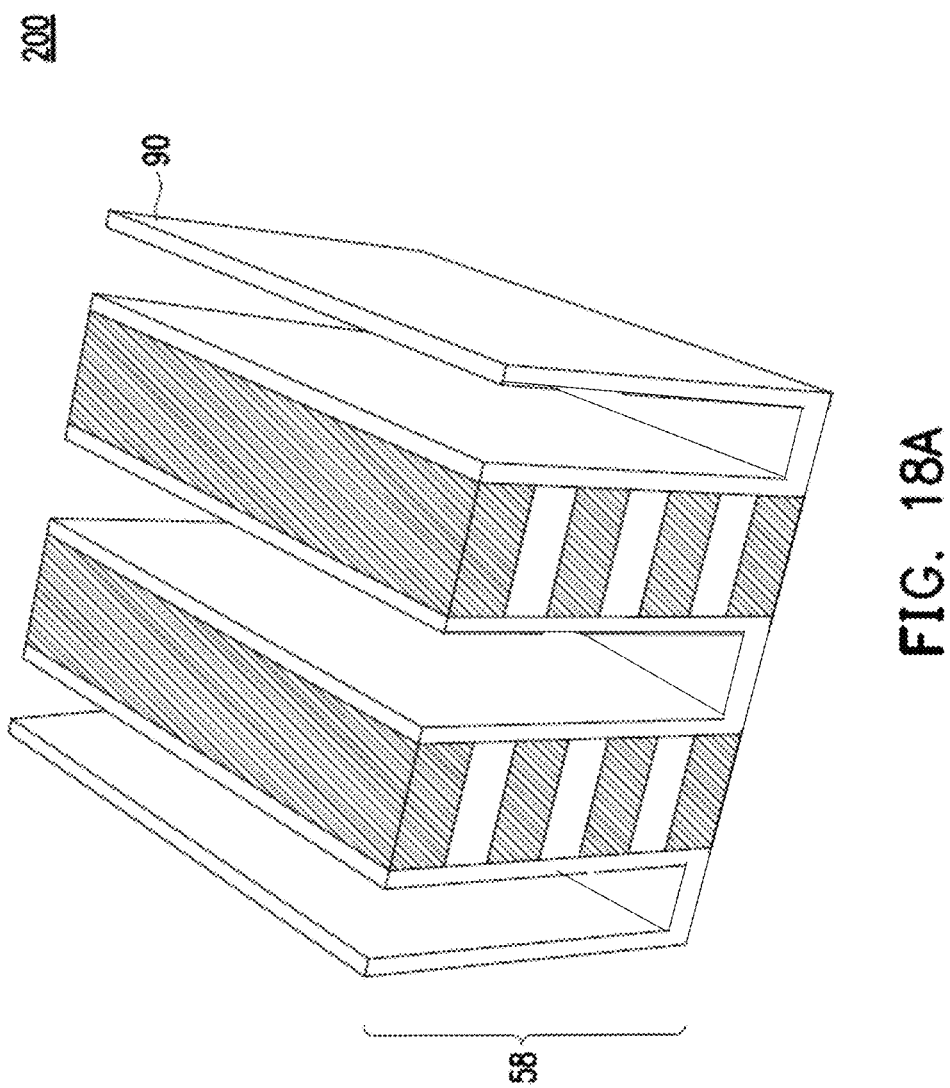
Figure 21:
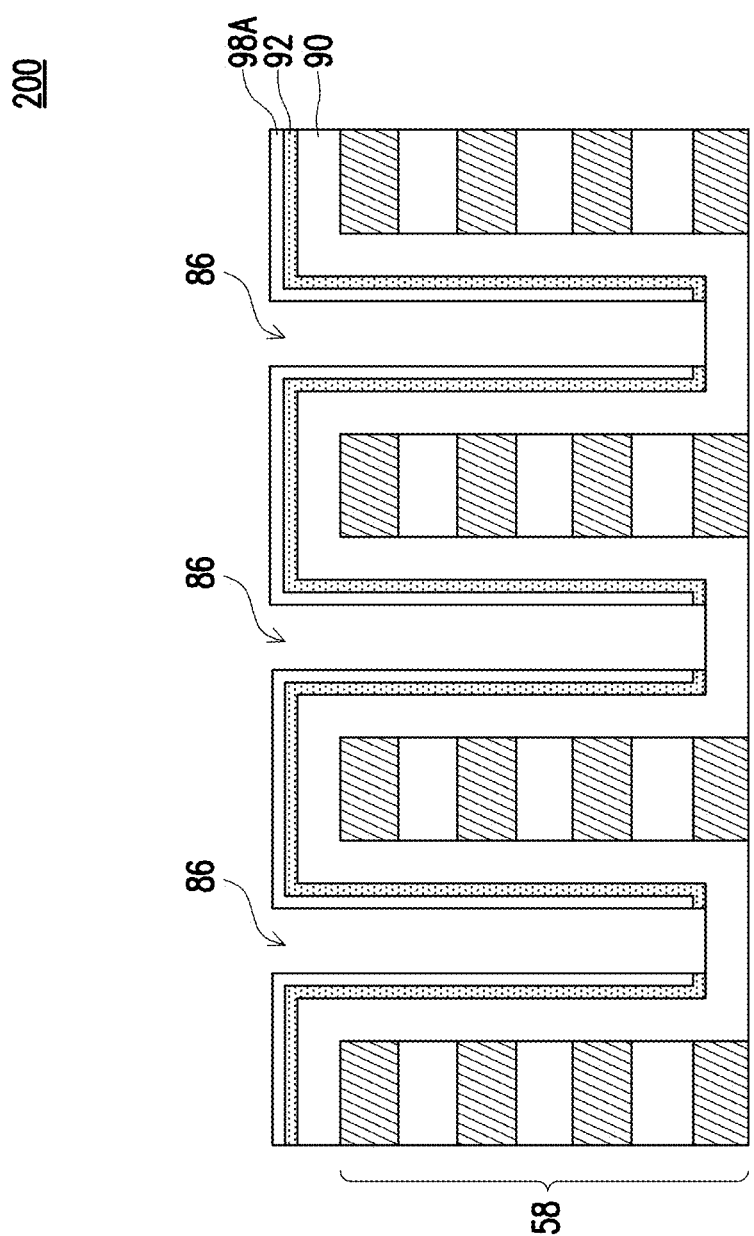
Figure 22A:
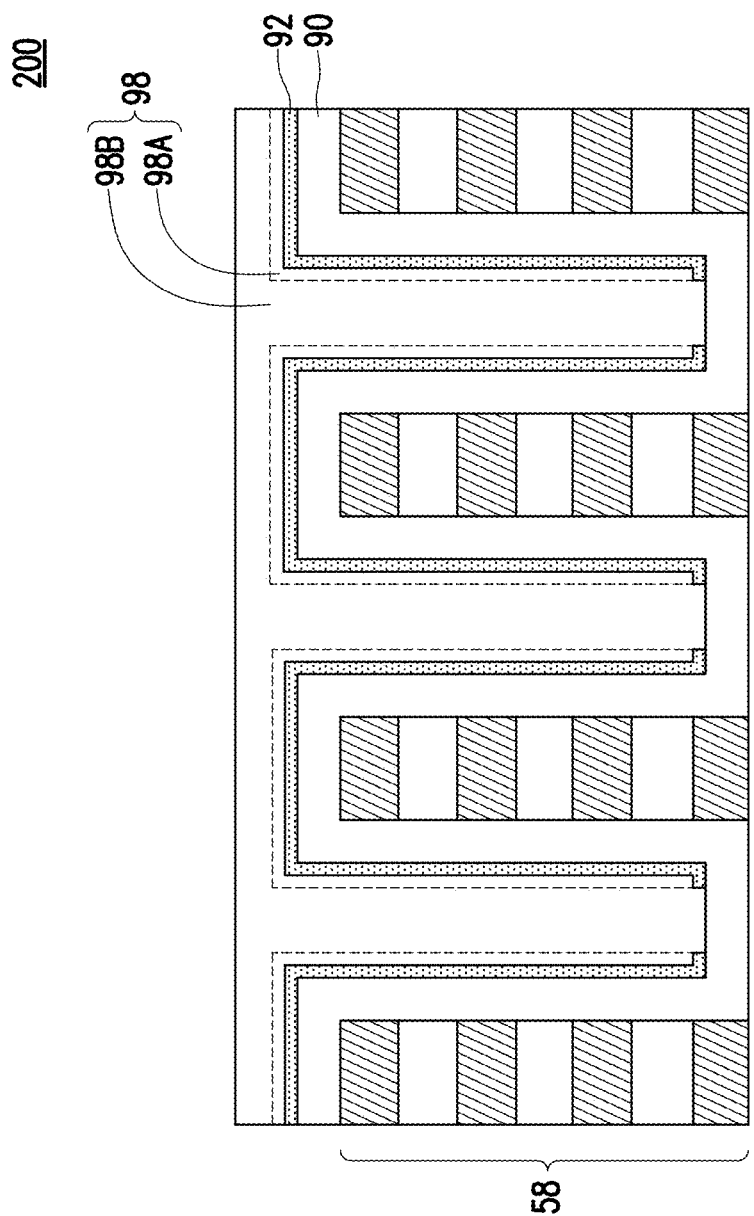
Figure 22B:
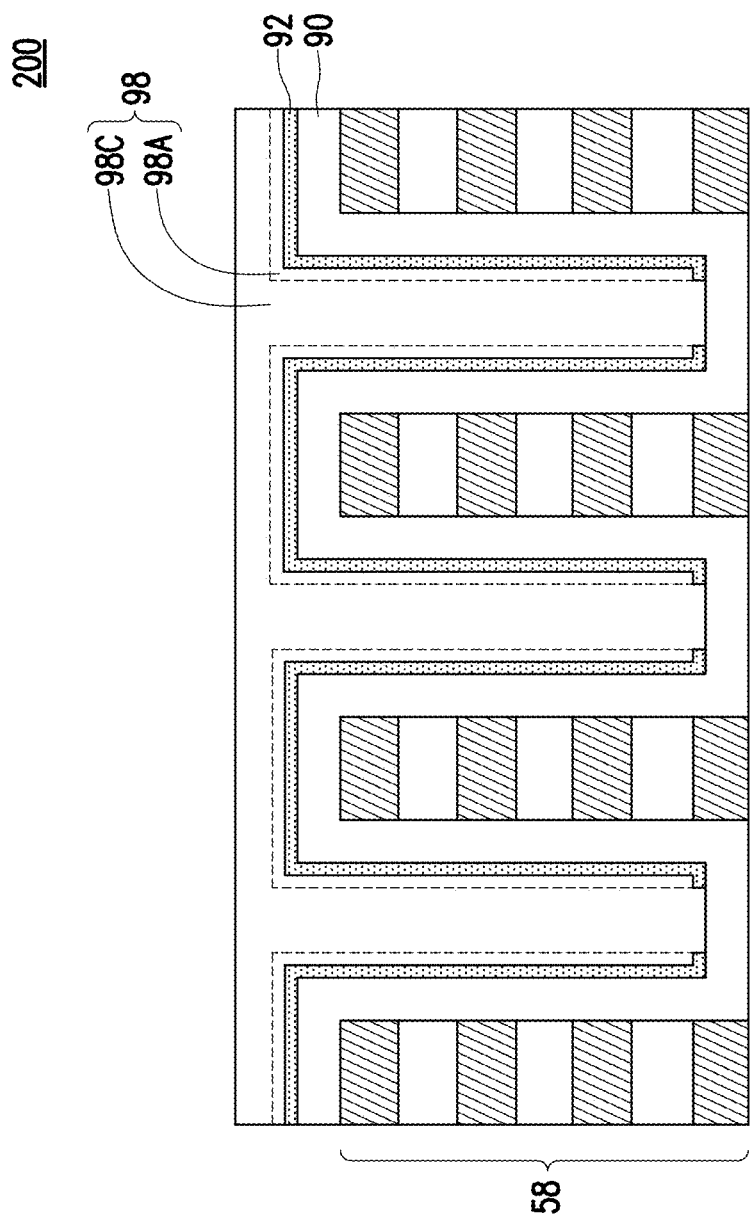
Figure 23B:
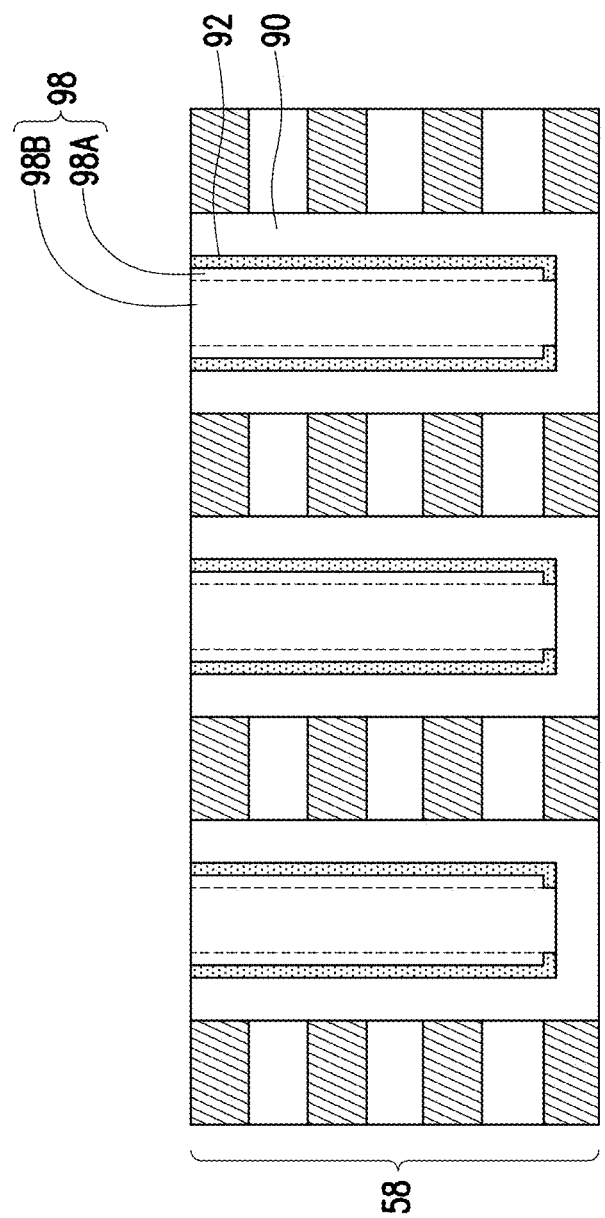
Figure 23C:
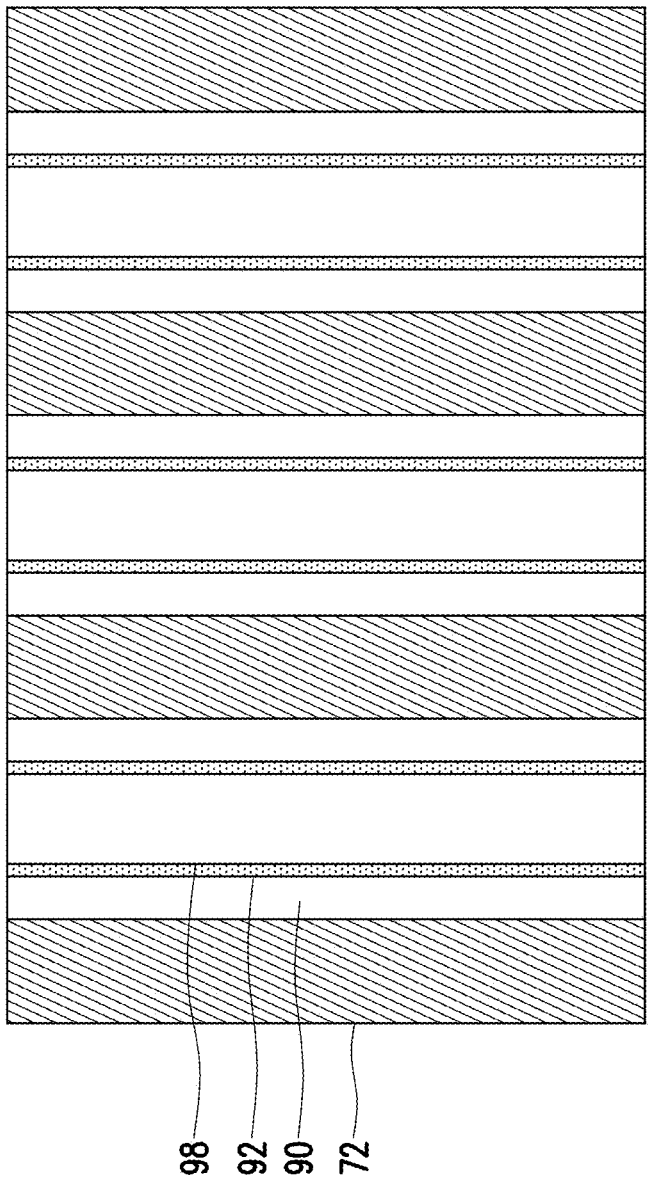

FIGS. 18A-19B, 20, 21, 22A, 22B and 23A-23C illustrate forming and patterning channel regions for the TFTs 204 (see FIG. 1A) in the trenches 86. FIGS. 18A, 19A, and 23A are illustrated in a three-dimensional view. In FIGS. 18B, 19B, 20, 21, 22A, 22B, and 23B cross-sectional views are provided along line C-C' of FIG. 1A. FIG. 23C illustrates a corresponding top-down view of the TFT structure.

Figure 18B:
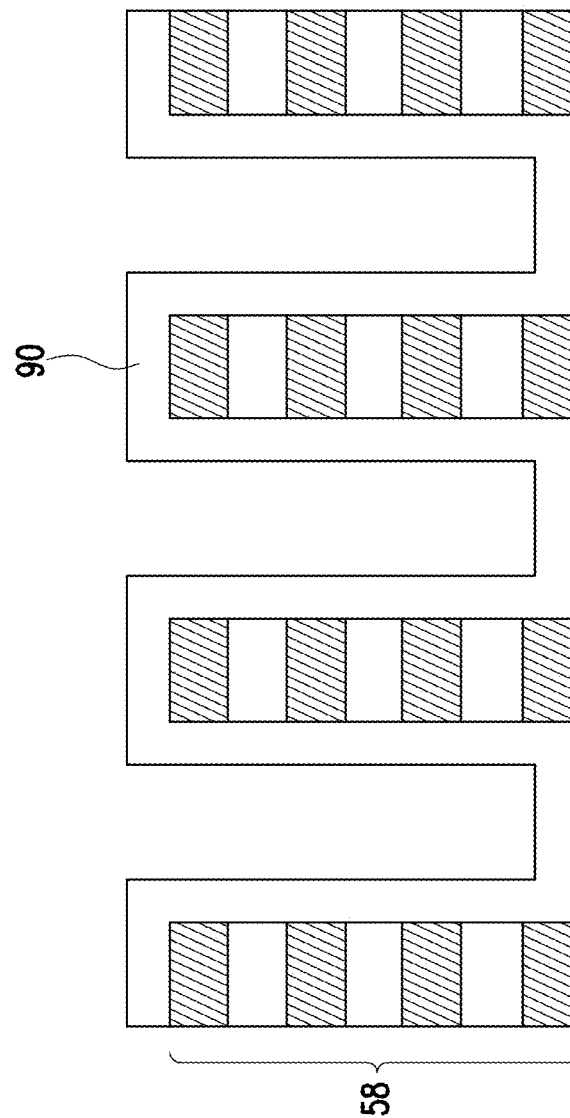

In FIGS. 18A and 18B, a memory film 90 is conformally deposited in the trenches 86. The memory film 90 may have a material that is capable of storing a bit, such as material capable of switching between two different polarization directions by applying an appropriate voltage differential across the memory film 90. For example, the polarization of the memory film 90 may change due to an electric field resulting from applying the voltage differential.

For example, the memory film 90 may be a high-k dielectric material, such as a hafnium (Hf) based dielectric material, or the like. In some embodiments, the memory film 90 comprises a ferroelectric material, such as, hafnium oxide, hafnium zirconium oxide, silicon-doped hafnium oxide, or the like. In other embodiments, the memory 90 may be a multilayer structure comprising a layer of $SiN_x$ between two $SiO_x$ layers (e.g., an ONO structure). In still other embodiments, the memory film 90 may comprise a different ferroelectric material or a different type of memory material. The memory film 90 may be deposited by CVD, PVD, ALD, PECVD, or the like to extend along sidewalls and a bottom surface of the trenches 86. After the memory film 90 is deposited, an annealing step (e.g., at a temperature range of about 300° C. to about 600° C.) in may be performed to achieve a desired crystalline phase, improve film quality, and reduce film-related defects/impurities for the memory film 90. In some embodiments, the annealing step may further be below 400° C. to meet a BEOL thermal budget and reduce defects that may result in other features from high-temperature annealing processes.

Figure 19A:
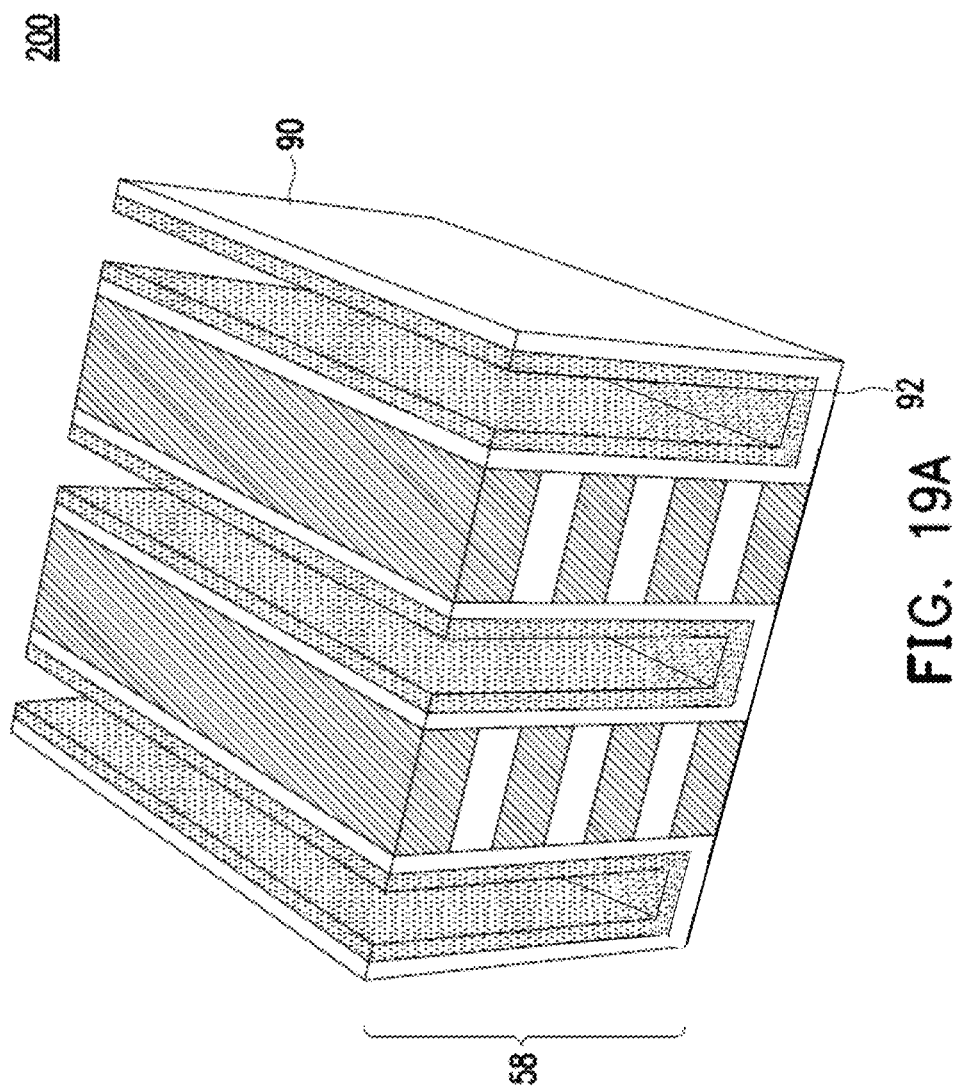
Figure 19B:
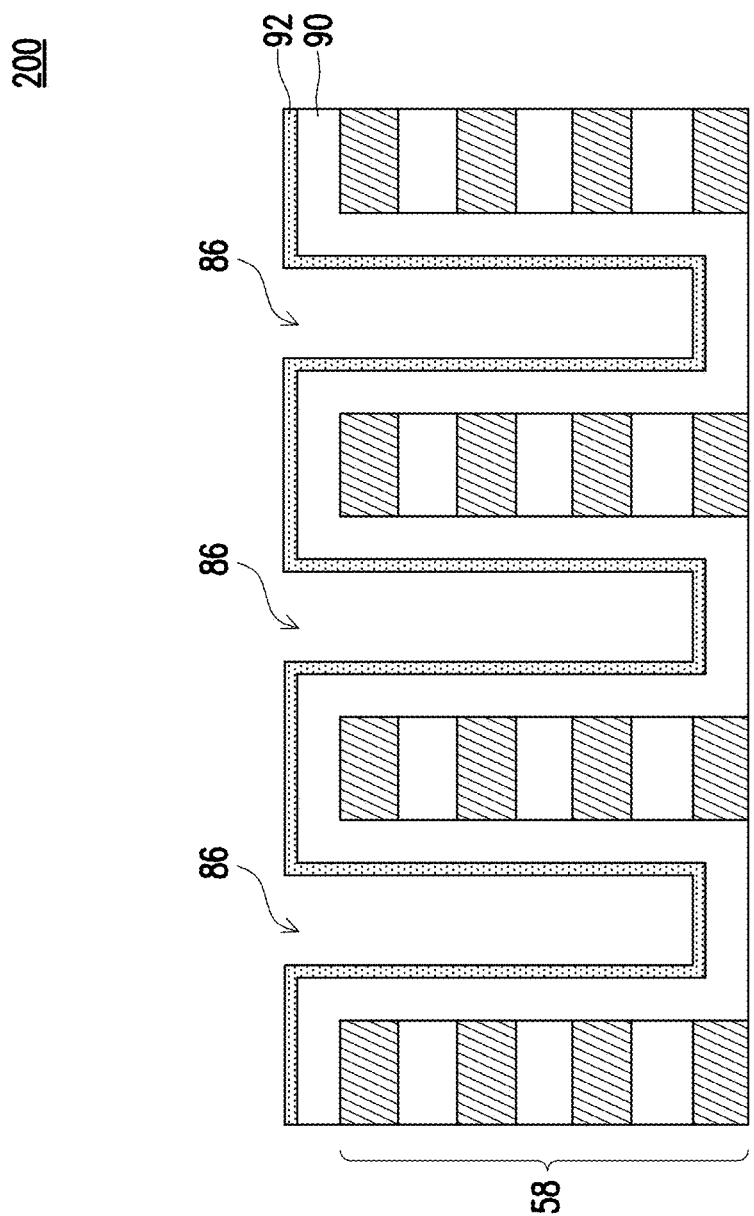

In FIGS. 19A and 19B, the OS layer 92 is conformally deposited in the trenches 86 over the memory film 90. The OS layer 92 comprises a material suitable for providing a channel region for a TFT (e.g., TFTs 204, see FIG. 1A). In some embodiments, the OS layer 92 comprises an indium-comprising material, such as $In_xGa_yZn_zMO$, where M may be Ti, Al, Ag, Si, Sn, or the like. X, Y, and Z may each be any value between 0 and 1. In other embodiments, a different semiconductor material may be used for the OS layer 92. The OS layer 92 may be deposited by CVD, PVD, ALD, PECVD, or the like. The OS layer 92 may extend along sidewalls and a bottom surface of the trenches 86 over the FE layer 90. After the OS layer 92 is deposited, an annealing step (e.g., at a temperature range of about 300° C. to about 450° C. or in a range of about 300° C. to about 400° C.) in oxygen-related ambient may be performed to activate the charge carriers of the OS layer 92.

Figure 20:
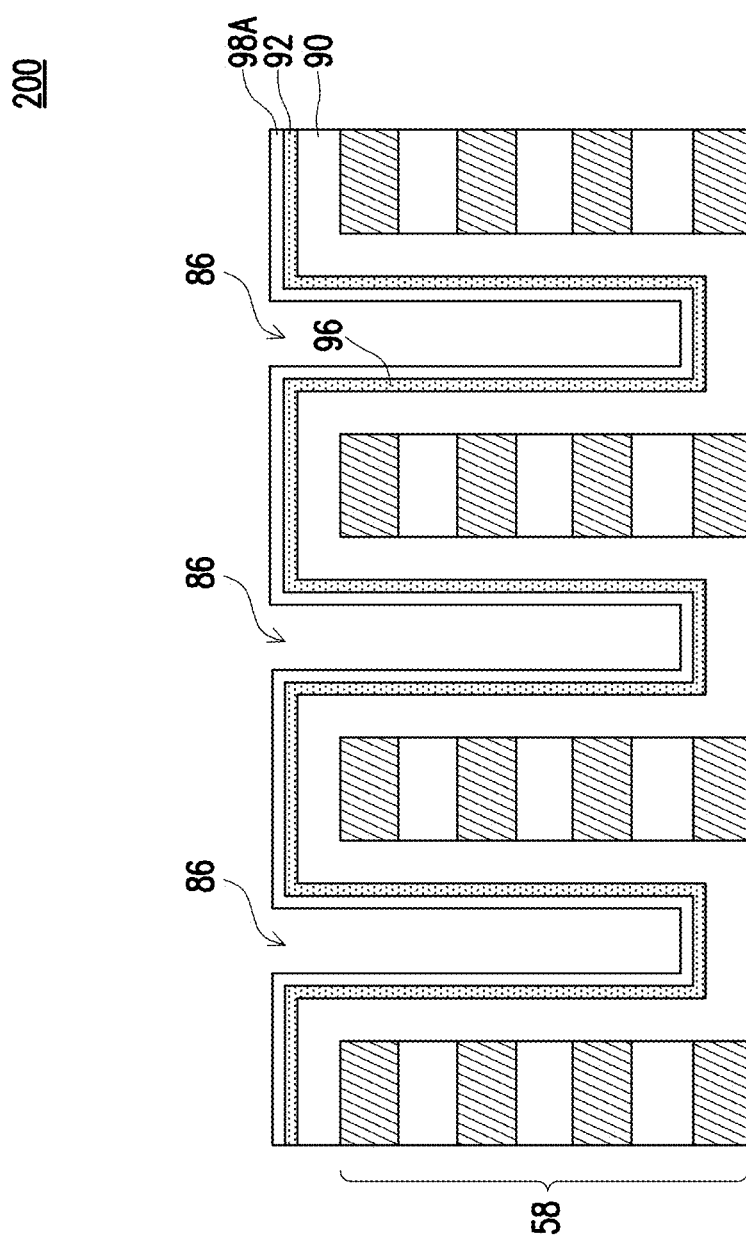

In FIG. 20, a dielectric material 98A is deposited on sidewalls and a bottom surface of the trenches 86 and over the OS layer 92. The dielectric material 98A may comprise, for example, silicon oxide, silicon nitride, silicon oxynitride, or the like, which may be deposited by CVD, PVD, ALD, PECVD, or the like. In some embodiments, depositing the dielectric material 98A may comprise reducing a flow of a hydrogen-comprising precursor so that the dielectric material 98A is formed with a relatively low hydrogen concentration. For example, in embodiments where the dielectric material 98A is a silicon-comprising insulating material (e.g., silicon oxide, silicon nitride, silicon oxynitride, or the like), a first hydrogen-comprising precursor (e.g., silane ($SiH_4$), Tetraethyl Silicate (TEOS), or the like) and a second hydrogen-free precursor may be simultaneously supplied during the deposition process. Because the first hydrogen-comprising precursor is used. The second hydrogen-free precursor may be, for example, $N_2O$ when the dielectric material 98A comprises silicon oxide. A flowrate of the first hydrogen-comping precursor is used, hydrogen ions (e.g., $H^+$) and/or hydrogen species)($H°$) may diffuse into OS layer 92 through the dielectric material 98A, causing instability in the resulting transistor. Accordingly, various embodiments improve transistor stability by reducing a flowrate of the first hydrogen-comprising precursor. For example, a ratio of a flowrate of the second hydrogen-free precursor to a flowrate of the first hydrogen-comprising precursor may be at least 60. It has been observed that maintaining a precursor flowrate in the above ratio, hydrogen diffusion into the OS layer 92 may be reduced to a desired level and device stability may be improved.

Figure 32B:
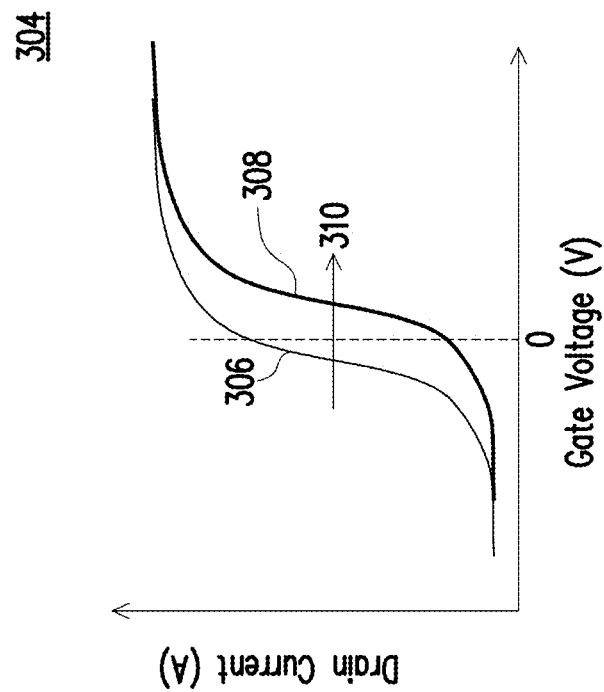
FIGS. 32A and 32B illustrate characteristics of a device in accordance with some embodiments.
Figure 32A:
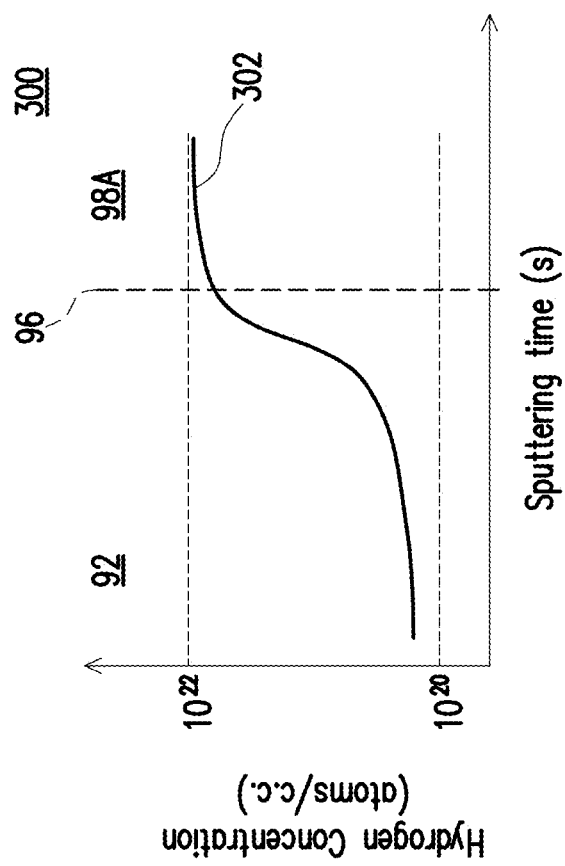

In some embodiments, a hydrogen concentration of the OS layer 92 after the dielectric material 98A is deposited may be in a range of about $10^{20}$ atoms per cubic centimeter to about $10^{22}$ atoms per cubic centimeter as measured by Time-of-Flight Secondary Ion Mass Spectrometry (ToF-SIMS). FIG. 32A illustrates a graph 300 of hydrogen concentrations (e.g., curve 302) in the OS layer 92 and the dielectric material 98A according to some embodiments. In graph 300, the x-axis indicates sputtering time, which corresponds to a detection time (e.g., distance) during the ToF-SIMs analysis. By maintaining a hydrogen concentration of the OS layer 92 in this range, a threshold voltage characteristic curve of the resulting transistor 204 may shift in a positive bias direction, enhancing stability of the transistor. For example, FIG. 32B illustrates a graph 304 depicting a threshold voltage characteristic curve 306 of a first transistor and a threshold voltage characteristic curve 308 of a second transistor. The first transistor (e.g., corresponding to curve 306) has a channel region (e.g., OS layer) with a hydrogen concentration over the above range, and the second transistor (e.g., corresponding to curve 308) has a channel region with a hydrogen concentration in the above range. Arrow 310 indicates the positive bias direction shift of the threshold voltage characteristic curve 308 compared to the threshold voltage characteristic curve 306.

As a result of embodiment deposition processes, a hydrogen concentration in the dielectric material 98A may be relatively low. For example, a hydrogen concentration of the dielectric material 98A may be greater than 0 and less than 5 at % when the dielectric material 98A comprises silicon oxide (e.g., $SiO_x$). As another example, an overall hydrogen concentration of the dielectric material 98A may be greater than 0 and less than 10 at % when the dielectric material 98A comprises silicon nitride (e.g., $SiN_x$). An overall hydrogen concentration at an interface 96 between the OS layer 92 and the dielectric material 98A may be less than about 3 at %. Maintaining hydrogen concentrations of the dielectric material 98A within these ranges may achieve advantages, such as reduced diffusion into the OS layer 92 and improved transistor stability.

In FIG. 21, bottom portions of the dielectric material 98A in the trenches 86 are removed using a combination of photolithography and etching, for example. The etching may be any acceptable etch process, such as by wet or dry etching, a reactive ion etch (RIE), neutral beam etch (NBE), the like, or a combination thereof. The etching may be anisotropic.

Subsequently, as also illustrated by FIG. 21, the dielectric material 98A may be used as an etch mask to etch through a bottom portion of the OS layer 92 in the trenches 86. The etching may be any acceptable etch process, such as by wet or dry etching, a reactive ion etch (RIE), neutral beam etch (NBE), the like, or a combination thereof. The etching may be anisotropic. Etching the OS layer 92 may expose portions of the memory film 90 on a bottom surface of the trenches 86. Thus, portions of the OS layer 92 on opposing sidewalls of the trenches 86 may be separated from each other, which improves isolation between the memory cells 202 of the memory array 200 (see FIG. 1A).

In FIGS. 22A and 22B, an additional dielectric material 98B or dielectric material 98C may be deposited to fill remaining portions of the trenches 86. In the embodiment of FIG. 22A, the dielectric material 98B may have a same material composition and be formed using a like process as the dielectric material 98A. For example, the dielectric material 98B may be formed using a deposition process with a relatively low flowrate for a hydrogen comprising precursor. In some embodiments the dielectric material 98B may be formed with a deposition process where a ratio of a flowrate of a hydrogen-free precursor (e.g., $N_2O$) to a flowrate of a hydrogen-comprising precursor (e.g., $SiH_4$) is at least 60. In some embodiments, a respective ratio of the flowrate of the hydrogen-free precursor to the flowrate of the hydrogen-comprising precursor may be the same for depositing the dielectric material 98B as depositing the dielectric material 98A. As a result, a hydrogen concentration of the dielectric material 98B is relatively low. For example, an overall hydrogen concentration of the dielectric material 98B may be greater than 0 and less than 5 at % when the dielectric material 98B comprises silicon oxide (e.g., $SiO_x$). As another example, an overall hydrogen concentration of the dielectric material 98B may be greater than 0 and less than 10 at % when the dielectric material 98B comprises silicon nitride (e.g., $SiN_x$).

FIG. 22B illustrates an alternate embodiment memory array 200' where a dielectric material 98C is deposited to fill remaining portions of the trenches 86 instead of the dielectric material 98B. The dielectric material 98C may have a different material composition and be formed using a different process than the dielectric material 98A. The dielectric material 98C may comprise, for example, silicon oxide, silicon nitride, silicon oxynitride, or the like, which may be deposited by CVD, PVD, ALD, PECVD, or the like. However, depositing the dielectric material 98C may comprise increasing a flow of a hydrogen-comprising precursor compared to the dielectric material 98A. As a result, the dielectric material 98C is formed with a relatively high hydrogen concentration. For example, in embodiments where the dielectric material 98C is a silicon-comprising insulating material (e.g., silicon oxide, silicon nitride, silicon oxynitride, or the like), a third hydrogen-comprising precursor (e.g., $SiH_4$, TEOS, or the like) and a fourth hydrogen-free precursor may be simultaneously flowed during the deposition process. The fourth hydrogen-free precursor may be, for example, $N_2O$ when the dielectric material 98C comprises silicon oxide. For example, a ratio of a flowrate of the second hydrogen-free precursor to a flowrate of the first hydrogen-comprising precursor may greater 60, such as up to 70. It has been observed that maintaining a precursor flowrate in the above ratio, a hydrogen concentration of the dielectric material 98C may be greater than a hydrogen concentration of the dielectric material 98A. For example, an overall hydrogen concentration of the dielectric material 98C may be in a range of about $1 \times 10^{21}$ atoms/cm$^3$ to $1 \times 10^{22}$ atoms/cm$^3$ when the dielectric material 98C comprises silicon oxide (e.g., $SiO_x$). As another example, an overall hydrogen concentration of the dielectric material 98C may be greater than $1 \times 10^{22}$ atoms/cm$^3$ when the dielectric material 98C comprises silicon nitride (e.g., $SiN_x$). Because the relatively low-hydrogen concentration dielectric material 98A separates the relatively high-hydrogen concentration dielectric material 98C and the OS layer 92, a high hydrogen concentration in the dielectric material 98C may not significantly degrade device performance in the resulting transistor, and the benefits described above may still be achieved.

Figure 33A:
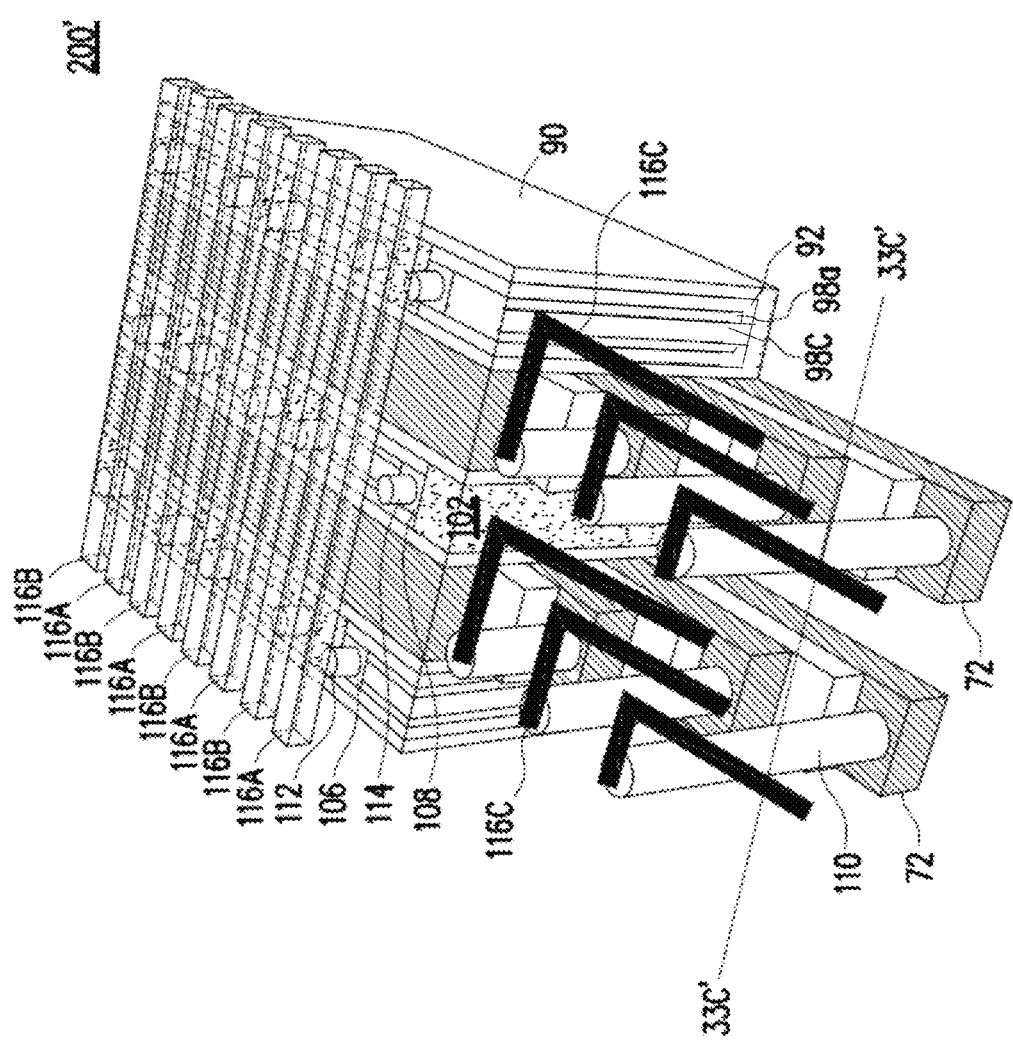
FIGS. 33A, 33B, 33C, and 33D illustrates illustrate a memory array in accordance with some embodiments.
Figure 33B:
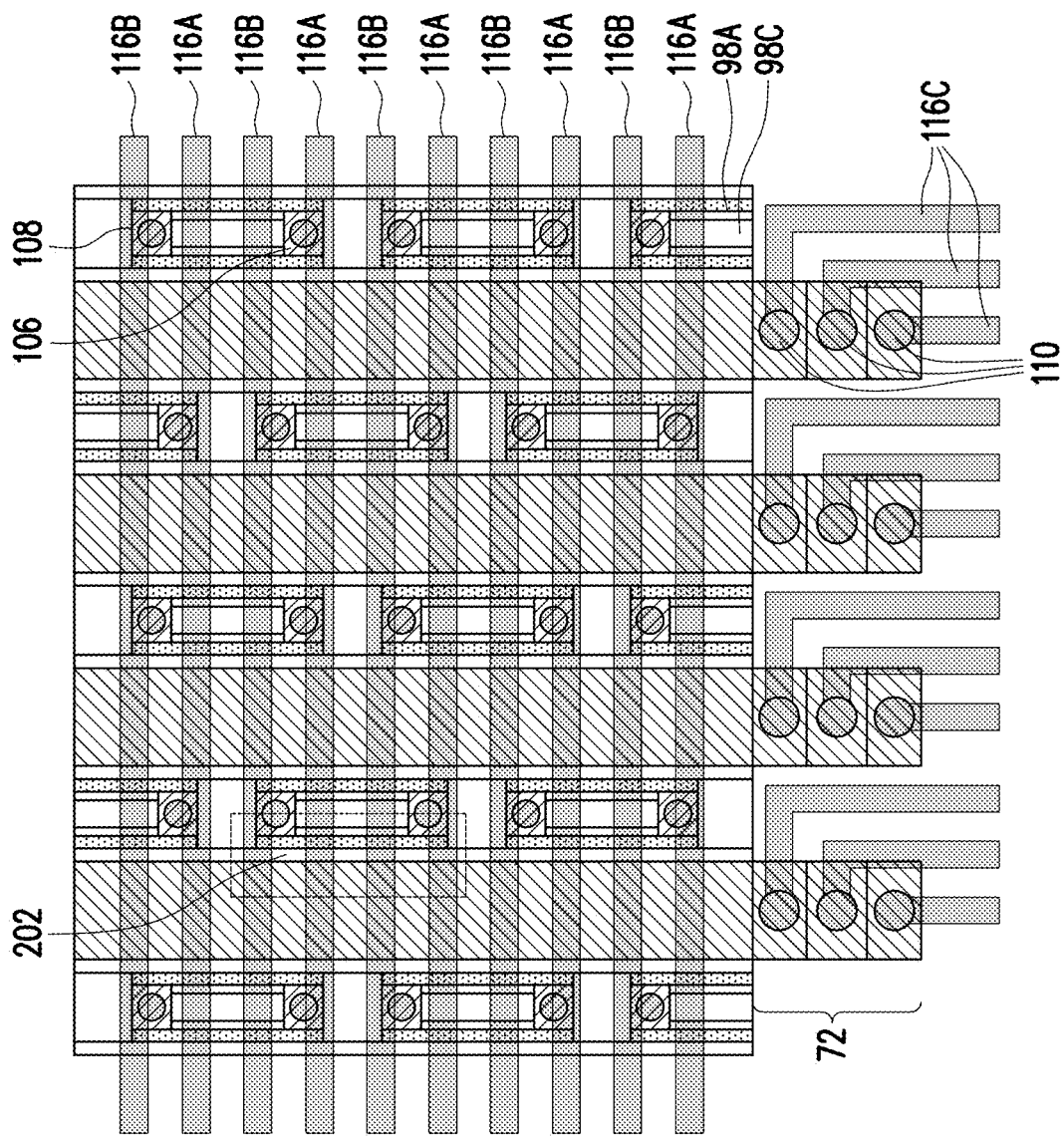
Figure 33C:
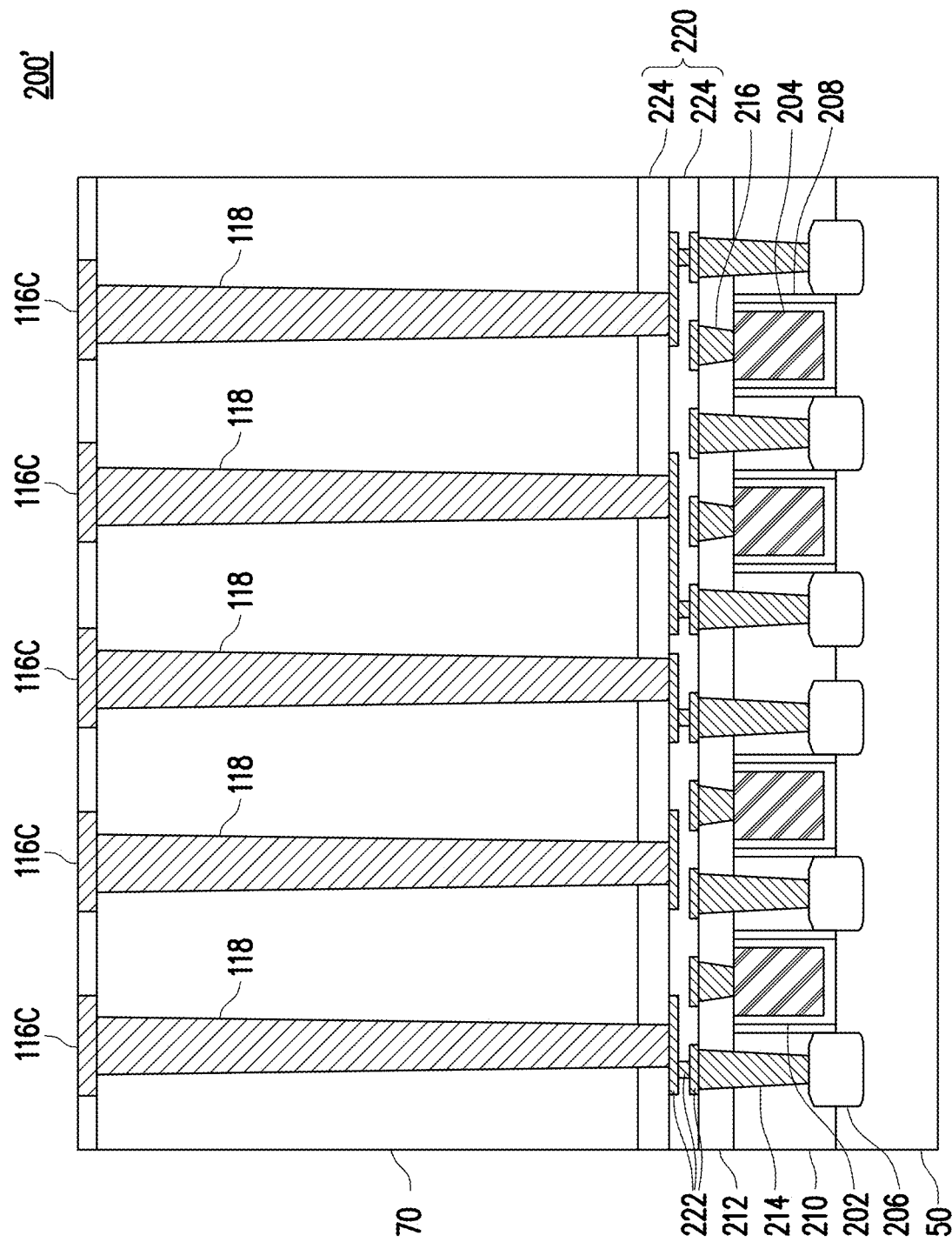

Subsequent figures illustrate further processing based on the embodiment of FIG. 22A (e.g., where the dielectric material 98B and the dielectric material 98A have a same material composition) for ease of illustration. The dielectric material 98B and the dielectric material 98A may be referred to collectively as the dielectric material 98 herein after. It should be understood that similar processing may be applied to the embodiment of FIG. 22B (e.g., wherein the dielectric material 98C and the dielectric material 98A have different material compositions). FIGS. 33A through 33C illustrate the memory array 200' according to the embodiment of FIG. 22B.

In FIGS. 23A through 23C, a removal process is then applied to the dielectric material 98, the OS layer 92, and the memory film 90 to remove excess material over the multi-layer stack 58. In some embodiments, a planarization process such as a chemical mechanical polish (CMP), an etch-back process, combinations thereof, or the like may be utilized. The planarization process exposes the multi-layer stack 58 such that top surface of the multi-layer stack 58 is level after the planarization process is complete. FIG. 23C illustrates a corresponding top-down view of the structure illustrated in FIG. 23A.

FIGS. 24A through 27C illustrate intermediate steps of manufacturing conductive lines 106 and 108 (e.g., source lines and bit lines) in the memory array 200. The conductive lines 106 and 108 may extend along a direction perpendicular to the conductive lines 72 such that individual cells of the memory array 200 may be selected for read and write operations. In FIGS. 24A through 27C, figures ending in "A" illustrate a 3D view; figures ending in "B" illustrate a top down view, and figures ending in "C" illustrate a corresponding cross-sectional view parallel to line C-C' of FIG. 1A.

Figure 24A:
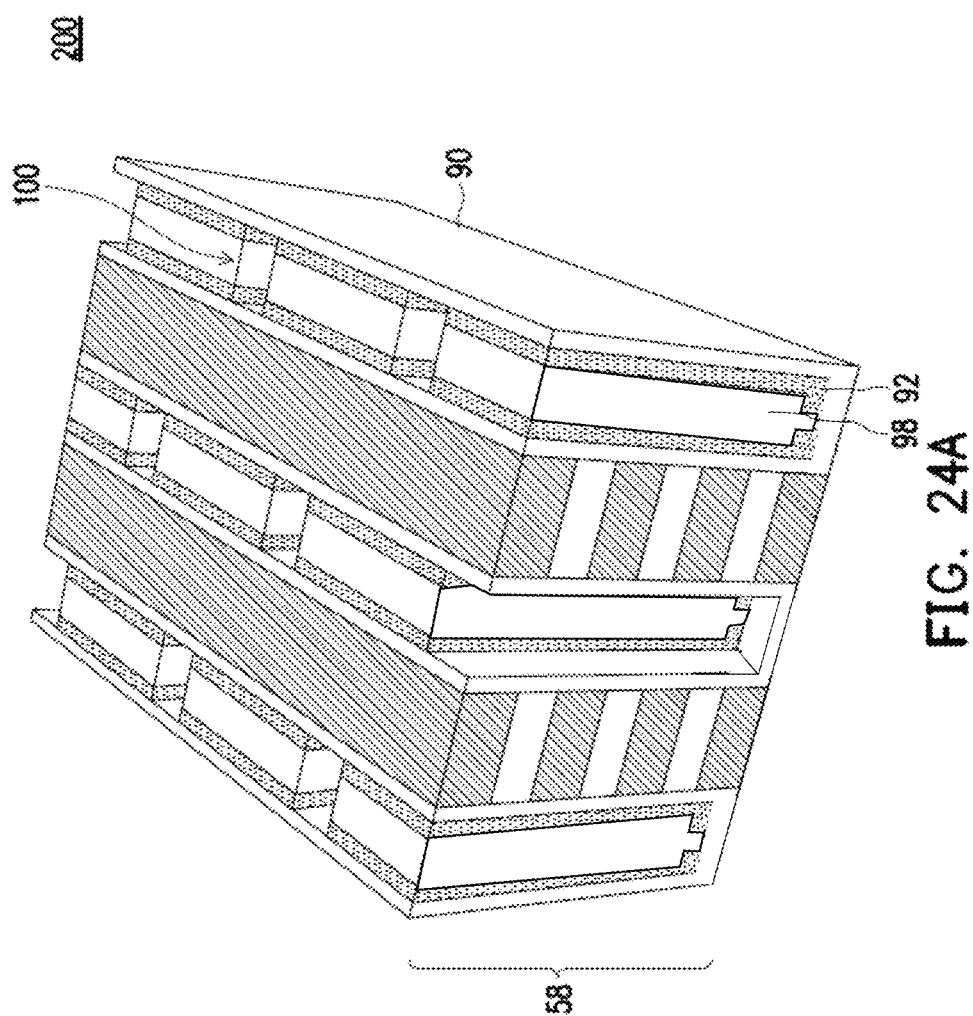
Figure 24B:
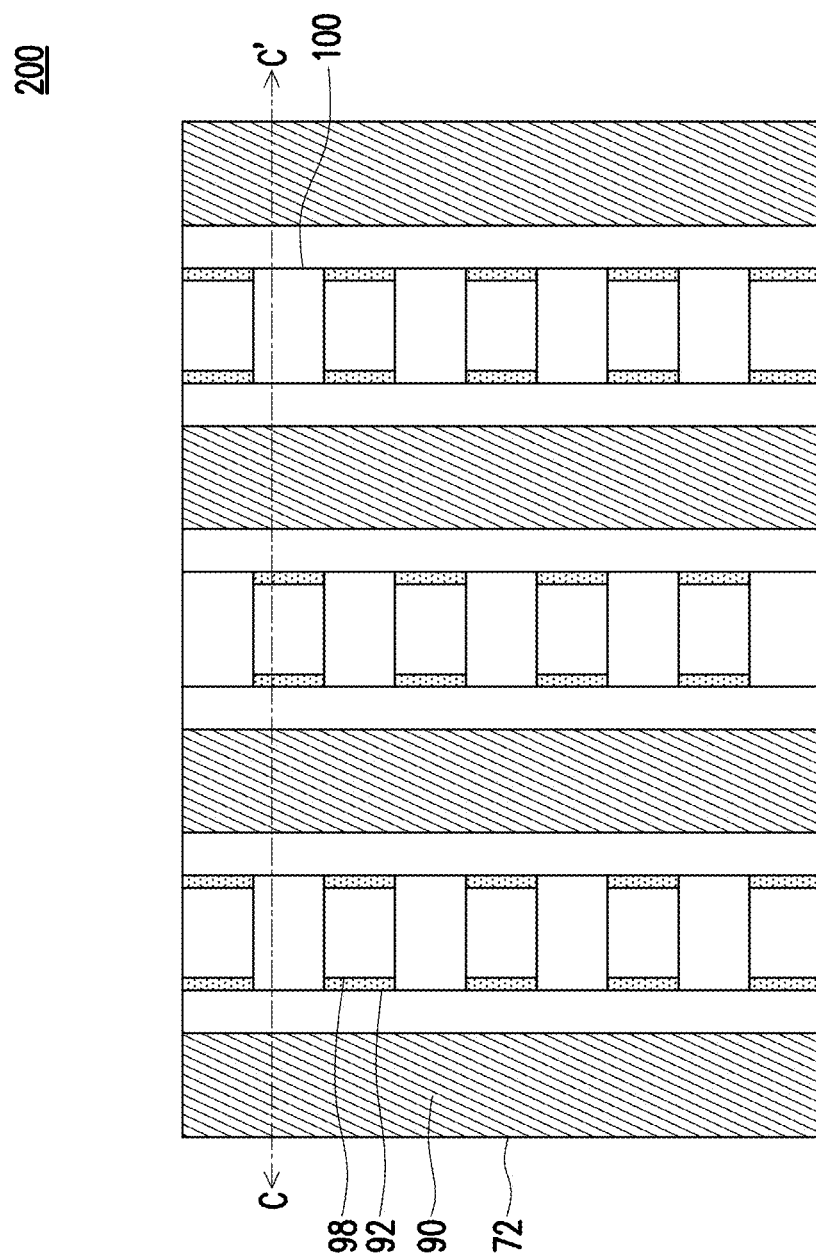
Figure 24C:
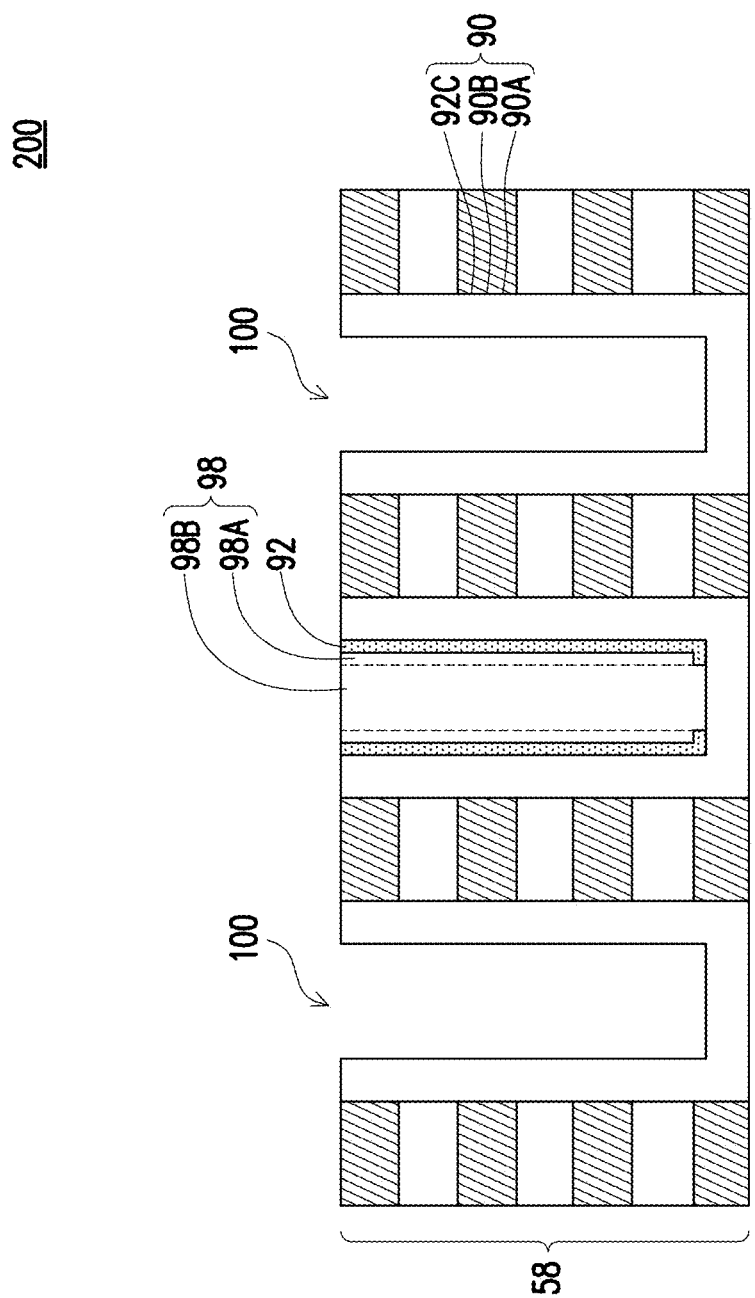

In FIGS. 24A, 24B, and 24C, trenches 100 are patterned through the OS layer 92 and the dielectric material 98 (including the dielectric material 98A and the dielectric material 98B). FIG. 24C illustrates a cross-section view of line C-C' in FIG. 24B. Patterning the trenches 100 may be performed through a combination of photolithography and etching, for example. The trenches 100 may be disposed between opposing sidewalls of the memory film 90, and the trenches 100 may physically separate adjacent stacks of memory cells in the memory array 200 (see FIG. 1A).

Figure 25A:
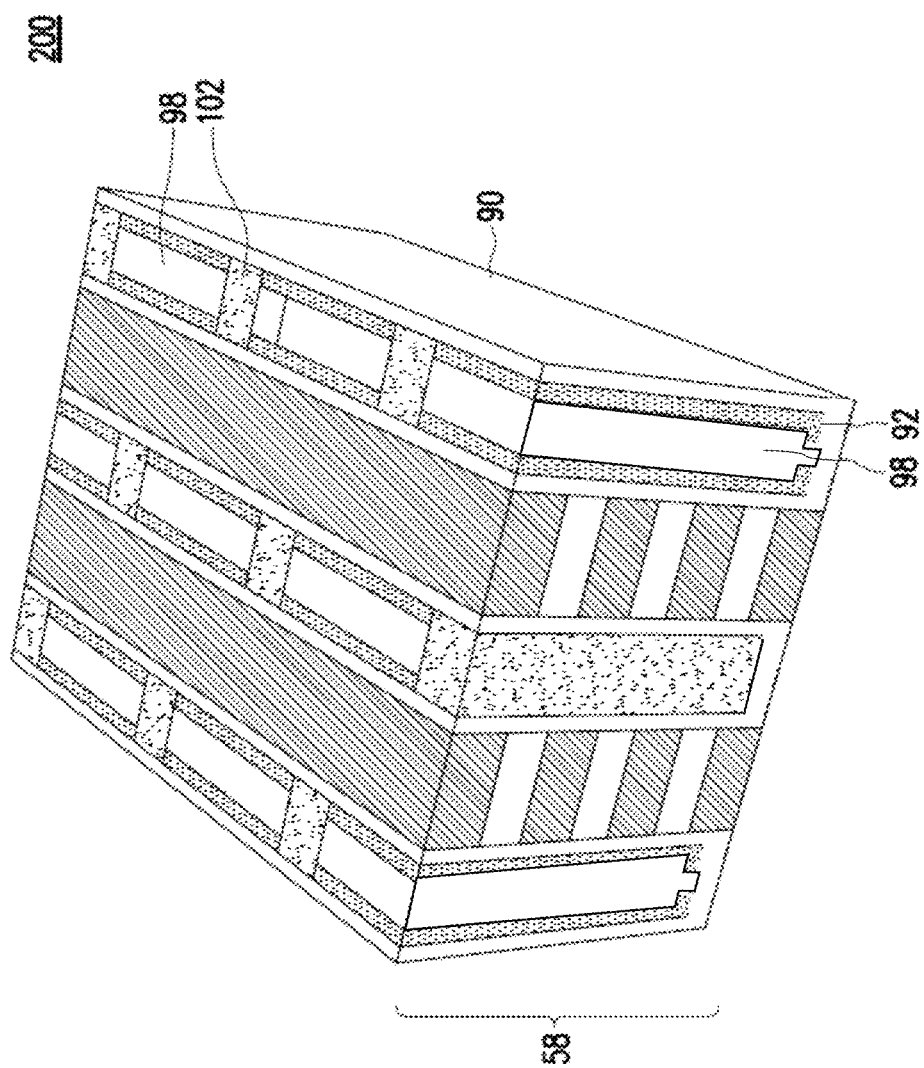
Figure 25B:
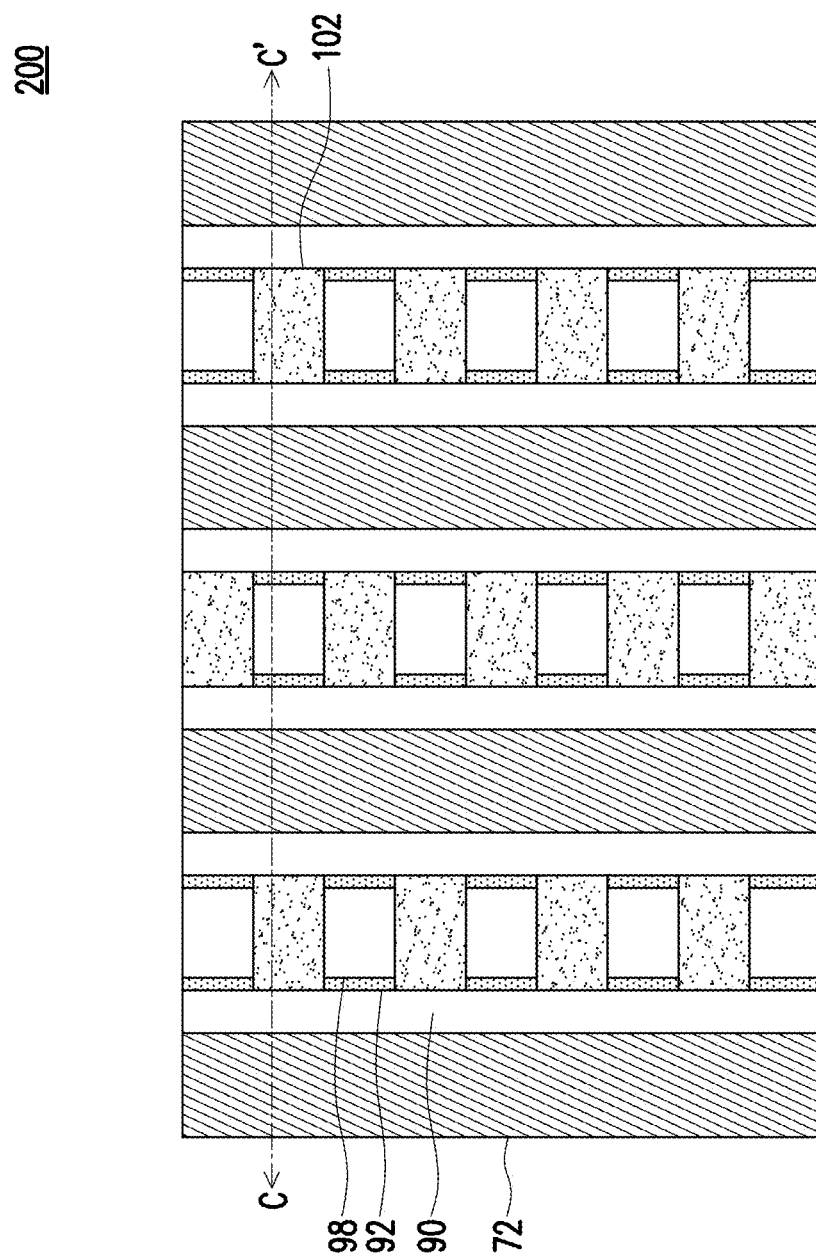
Figure 25C:
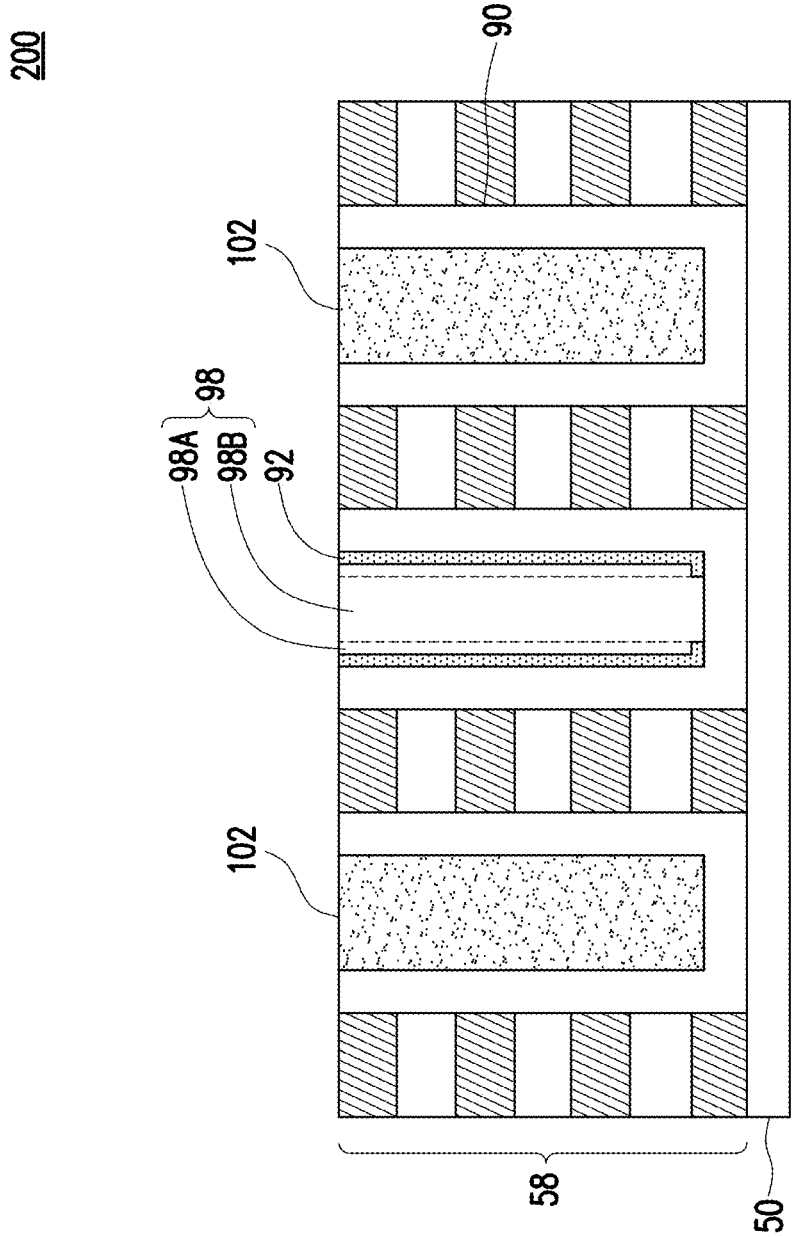

In FIGS. 25A, 25B, and 25C, a dielectric material 102 is deposited in and fills the trenches 100. FIG. 25C illustrates a cross-sectional view of line C-C' in FIG. 25B. The dielectric layer 102 may include, for example, silicon oxide, silicon nitride, silicon oxynitride, or the like, which may be deposited by CVD, PVD, ALD, PECVD, or the like. The dielectric layer 102 may extend along sidewalls and a bottom surface of the trenches 86 over the OS layer 92. After deposition, a planarization process (e.g., a CMP, etch back, or the like) may be performed to remove excess portions of the dielectric material 102. In the resulting structure, top surfaces of the multi-layer stack 58, the memory film 90, the OS layer 92, and the dielectric material 102 may be substantially level (e.g., within process variations). In some embodiments, materials of the dielectric materials 98 and 102 may be selected so that they may be etched selectively relative each other. For example, in some embodiments, the dielectric material 98 is an oxide and the dielectric material 102 is a nitride. In some embodiments, the dielectric material 98 is a nitride and the dielectric material 102 is an oxide. Other materials are also possible.

Figure 26A:
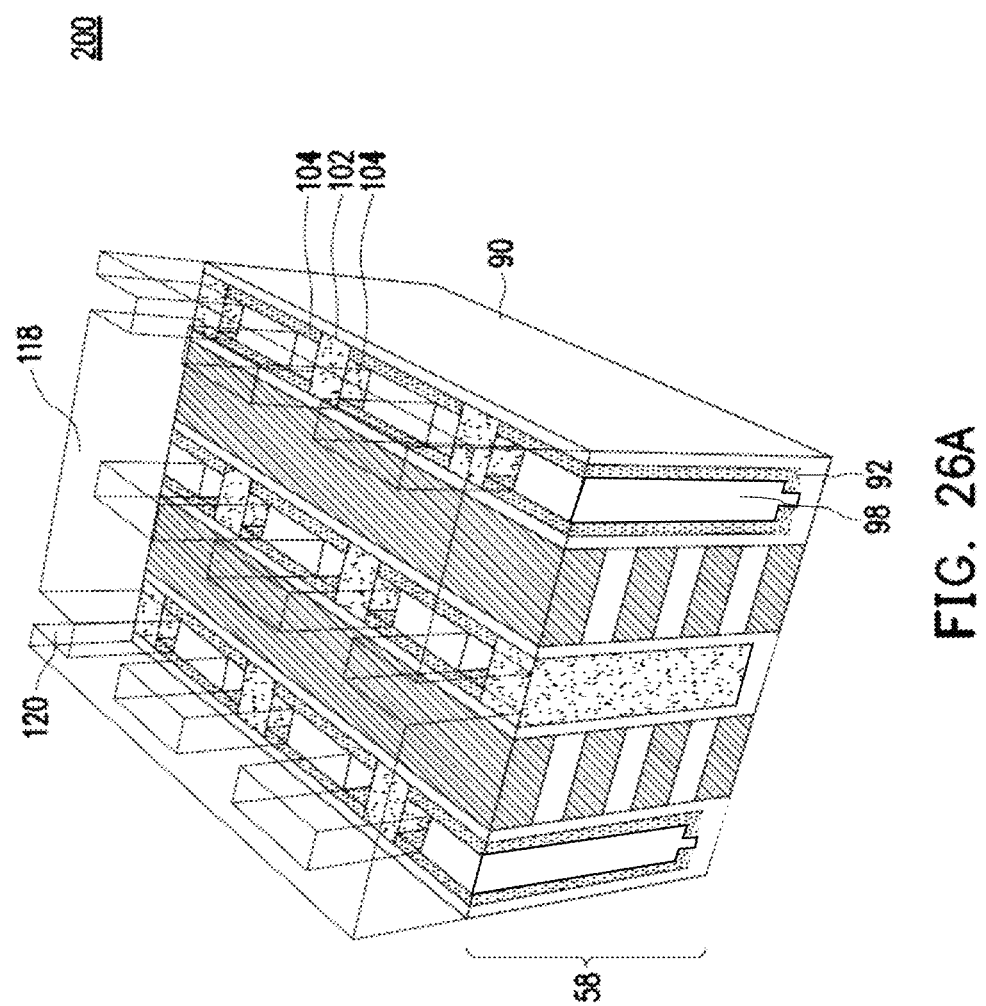
Figure 26B:
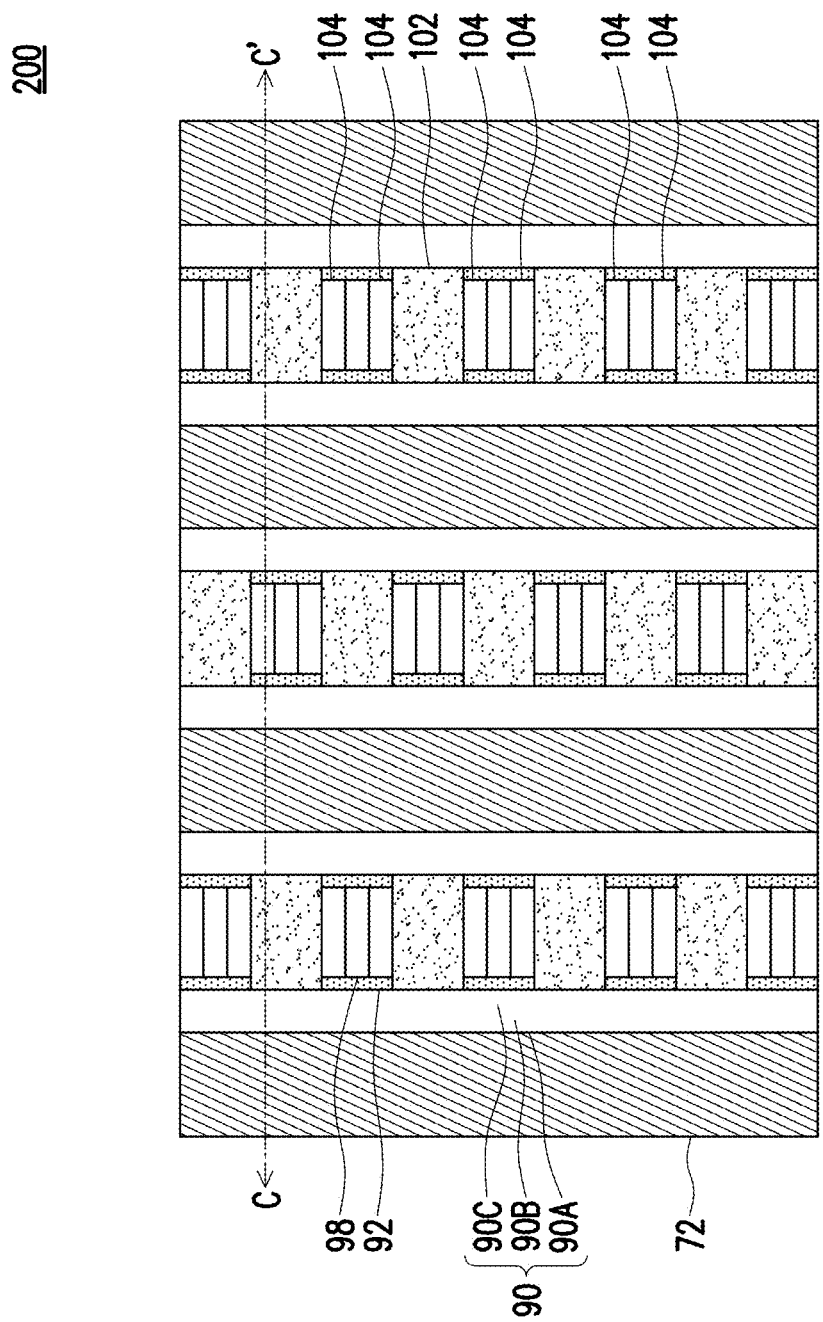
Figure 26C:
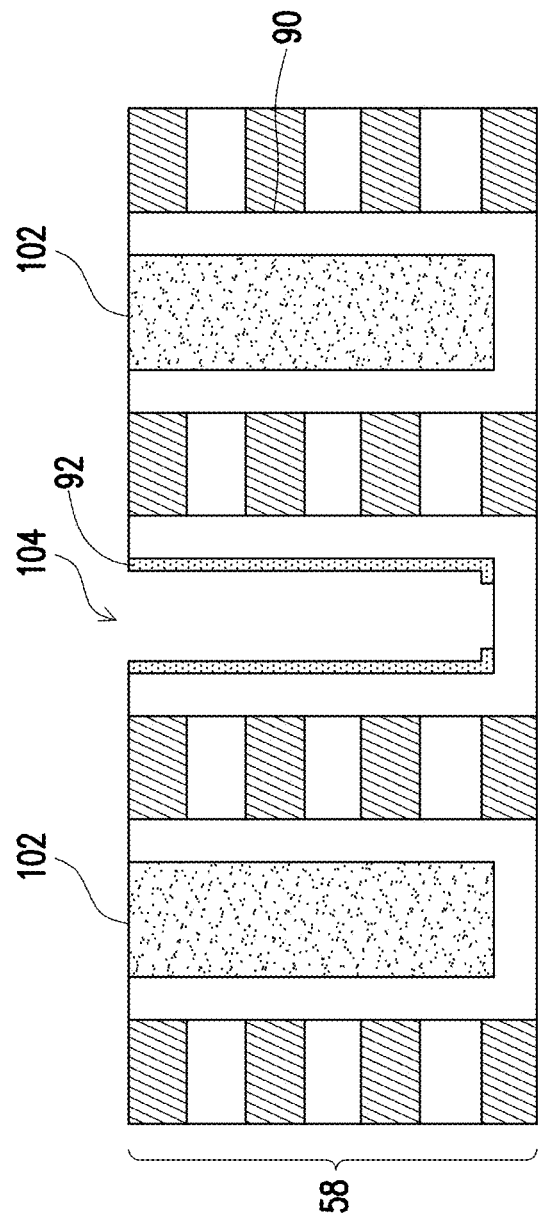

In FIGS. 26A, 26B, and 26C, trenches 104 are patterned for the conductive lines 106 and 108. FIG. 26C illustrates a cross-sectional view of line C-C' in FIG. 26B. The trenches 104 are patterned by patterning the dielectric material 98 (including the dielectric material 98A and the dielectric material 98C) using a combination of photolithography and etching, for example.

For example, a photoresist 118 may be deposited over the multi-layer stack 58, the dielectric material 98, the dielectric material 102, the OS layer 92, and the memory film 90. The photoresist 118 can be formed by using a spin-on technique, for example. The photoresist 118 is patterned to define openings 120. Each of the openings 120 may overlap a corresponding region of the dielectric material 102, and each of the openings 120 may further partially expose two separate regions of the dielectric material 98. For example, each opening 120 may expose a region of the dielectric material 102; partially expose a first region of the dielectric material 98; and partially expose a second region of the dielectric material 98 that is separated from the first region of the dielectric material 98 by the region of the dielectric material 102. In this way, each of the openings 120 may define a pattern of a conductive line 106 and an adjacent conductive line 108 that are separated by the dielectric material 102. The photoresists can be patterned using acceptable photolithography techniques. For example, the photoresist 118 be exposed to light for patterning. After the exposure process, the photoresist 118 may be developed to remove exposed or unexposed portions of the photoresist depending on whether a negative or positive resist is used, thereby defining a patterning of the form openings 120.

Subsequently, portions of the dielectric material 98 exposed by the openings 120 may be removed by etching, for example. The etching may be any acceptable etch process, such as by wet or dry etching, a reactive ion etch (RIE), neutral beam etch (NBE), the like, or a combination thereof. The etching may be anisotropic. The etching process may use an etchant that etches the dielectric material 98 without significantly etching the dielectric material 102. As a result, even though the openings 120 expose the dielectric material 102, the dielectric material 102 may not be significantly removed. A pattern of the trenches 104 may correspond to the conductive lines 106 and 108 (see FIGS. 27A, 27B, and 27C). For example, a portion of the dielectric material 98 may remain between each pair of the trenches 104, and the dielectric material 102 may be disposed between adjacent pairs of the trenches 104. After the trenches 104 are patterned, the photoresist 120 may be removed by ashing, for example.

Figure 27B:
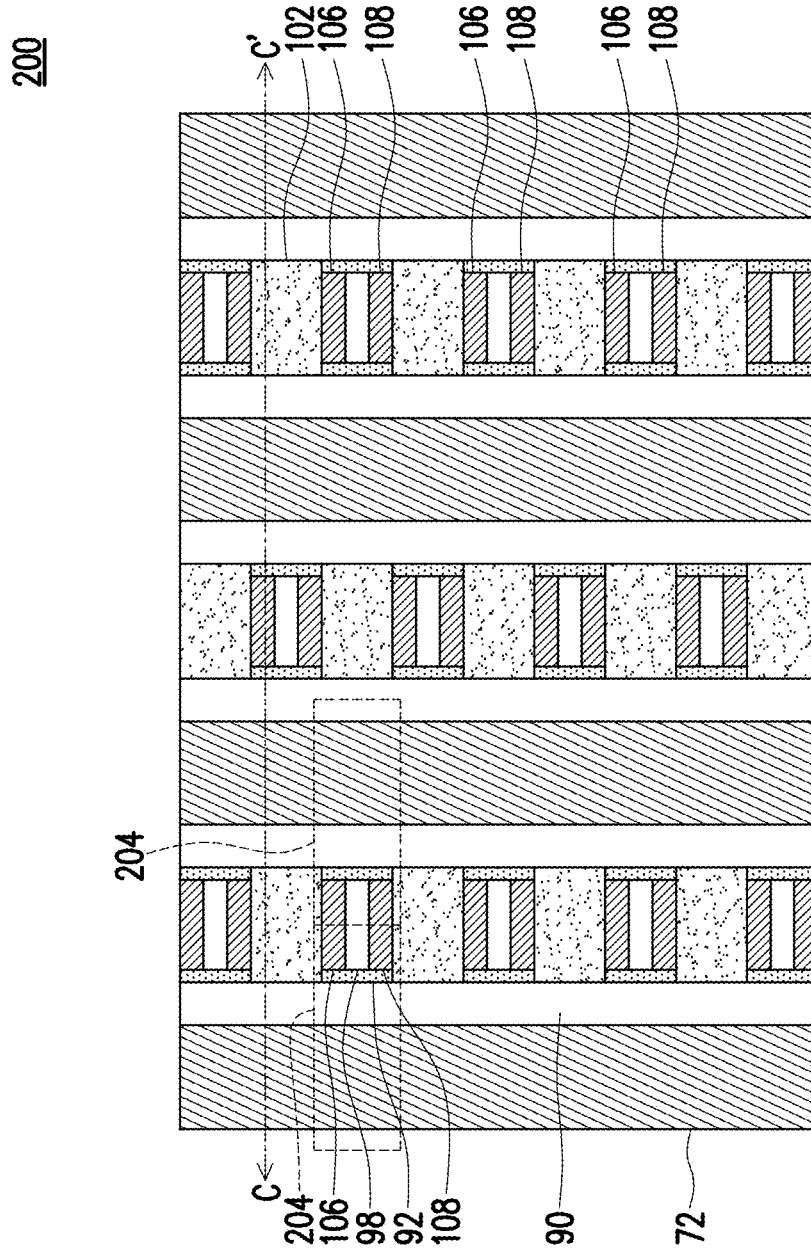
Figure 27C:
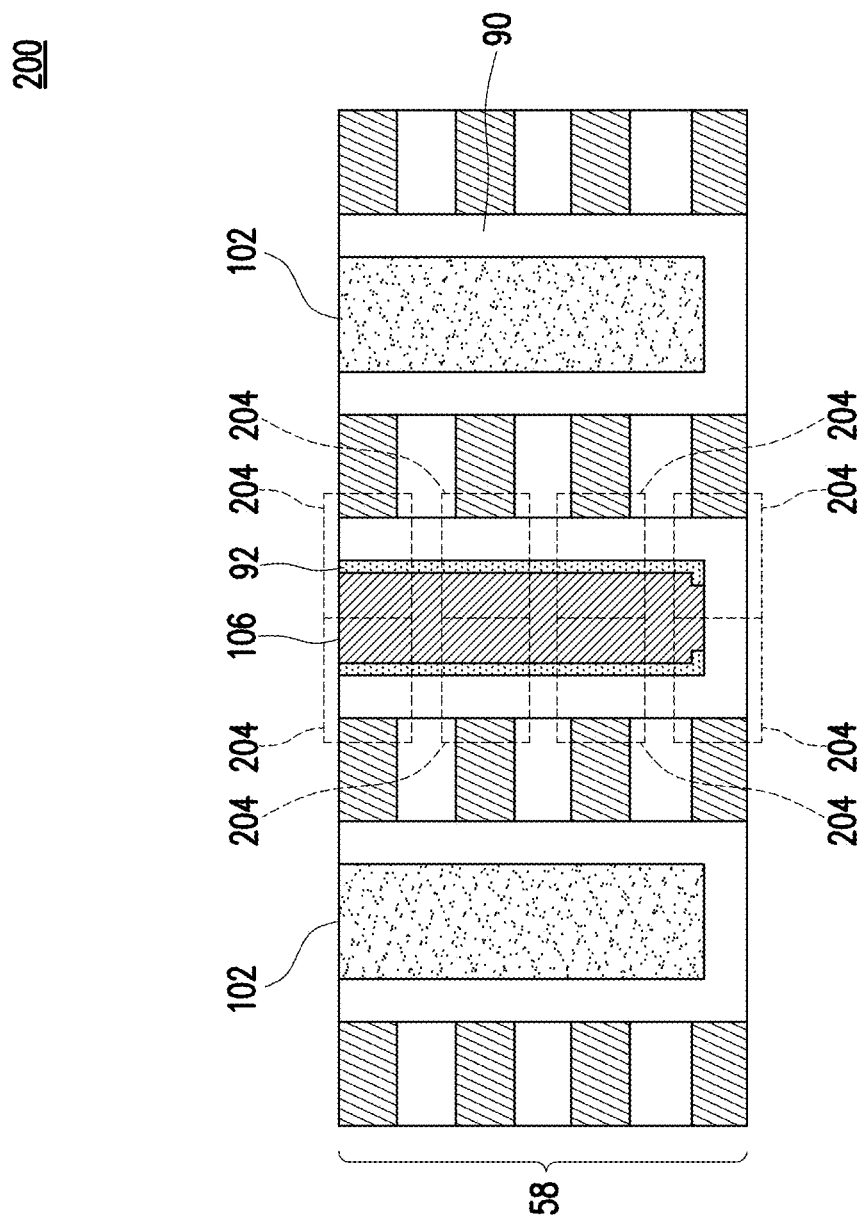

In FIGS. 27A, 27B, and 27C the trenches 104 are filled with a conductive material to form the conductive lines 106 and 108. FIG. 27C illustrates a cross-sectional view of line C-C' in FIG. 27B. The conductive lines 106 and 108 may each comprise a conductive material, such as, copper, titanium, titanium nitride, tantalum, tantalum nitride, tungsten, ruthenium, aluminum, combinations thereof, or the like, which may be each formed using, for example, CVD, ALD, PVD, PECVD, or the like. After the conductive lines 106 and 108 are deposited, a planarization (e.g., a CMP, etch back, or the like) may be performed to remove excess portions of the conductive material, thereby forming the conductive lines 106 and 108. In the resulting structure, top surfaces of the multi-layer stack 58, the memory film 90, the OS layer 92, the conductive lines 106, and the conductive lines 108 may be substantially level (e.g., within process variations). The conductive lines 106 may correspond to bit lines in the memory array, and the conductive lines 108 may correspond to source lines in the memory array 200. Although FIG. 27C illustrates a cross-sectional view that only shows the conductive lines 106, a cross-sectional view of the conductive lines 108 may be similar.

Thus stacked TFTs 204 may be formed in the memory array 200. Each TFT 204 comprises a gate electrode (e.g., a portion of a corresponding conductive line 72), a gate dielectric (e.g., a portion of a corresponding memory film 90), a channel region (e.g., a portion of a corresponding OS layer 92), and source and drain electrodes (e.g., portions of corresponding conductive lines 106 and 108). The dielectric material 102 isolates adjacent TFTs 204 in a same column and at a same vertical level. The TFTs 204 may be disposed in an array of vertically stacked rows and columns.

Figure 28A:
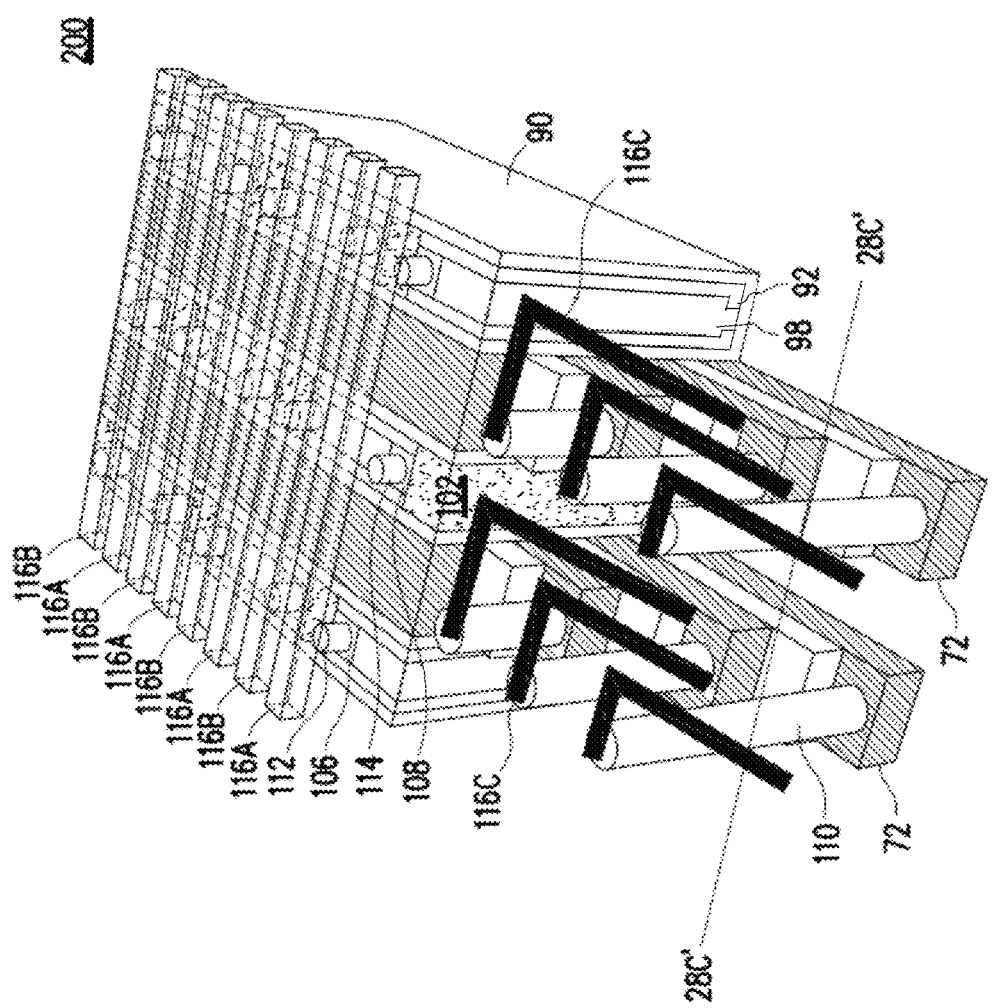
Figure 28B:
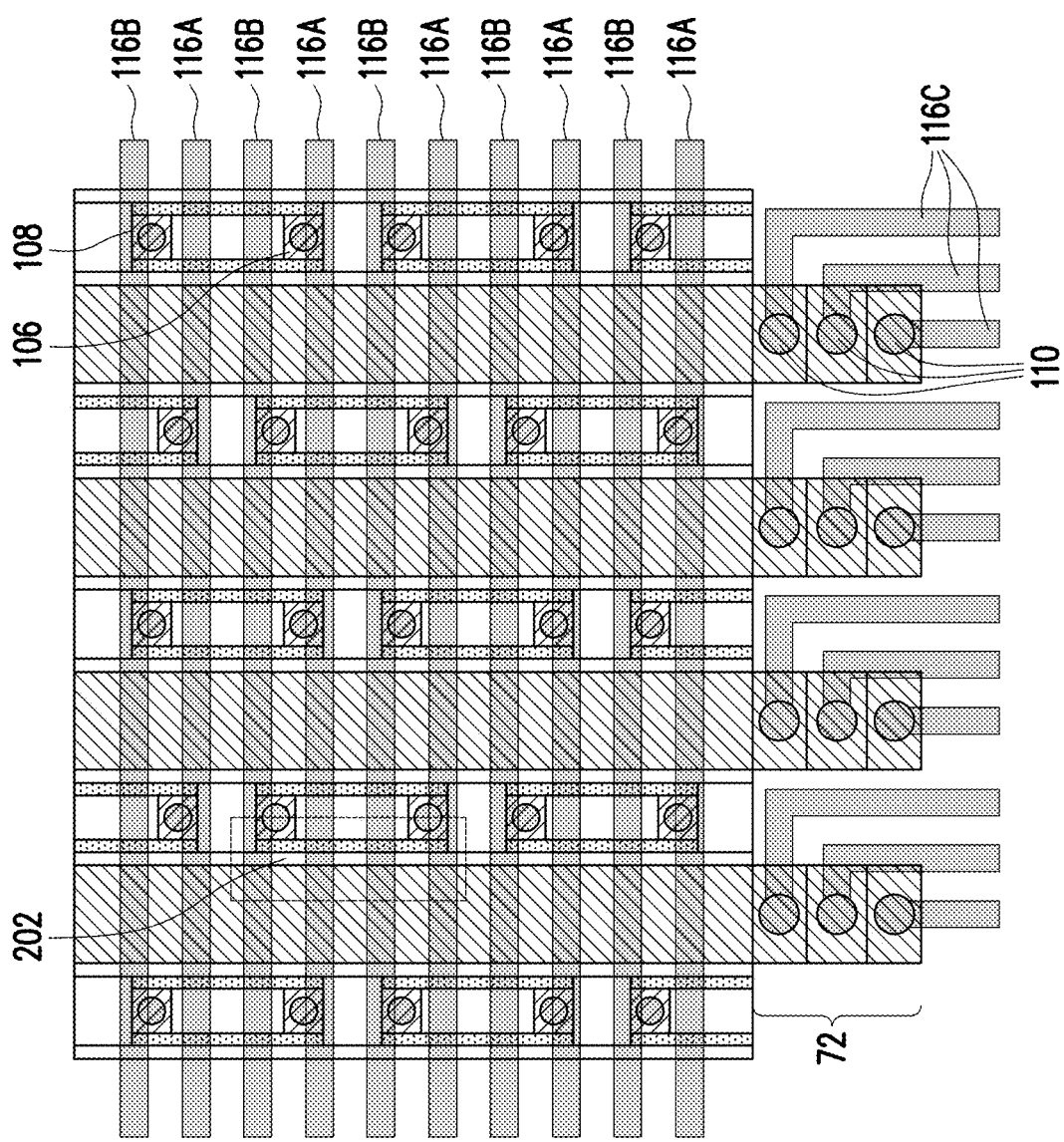
Figure 28C:
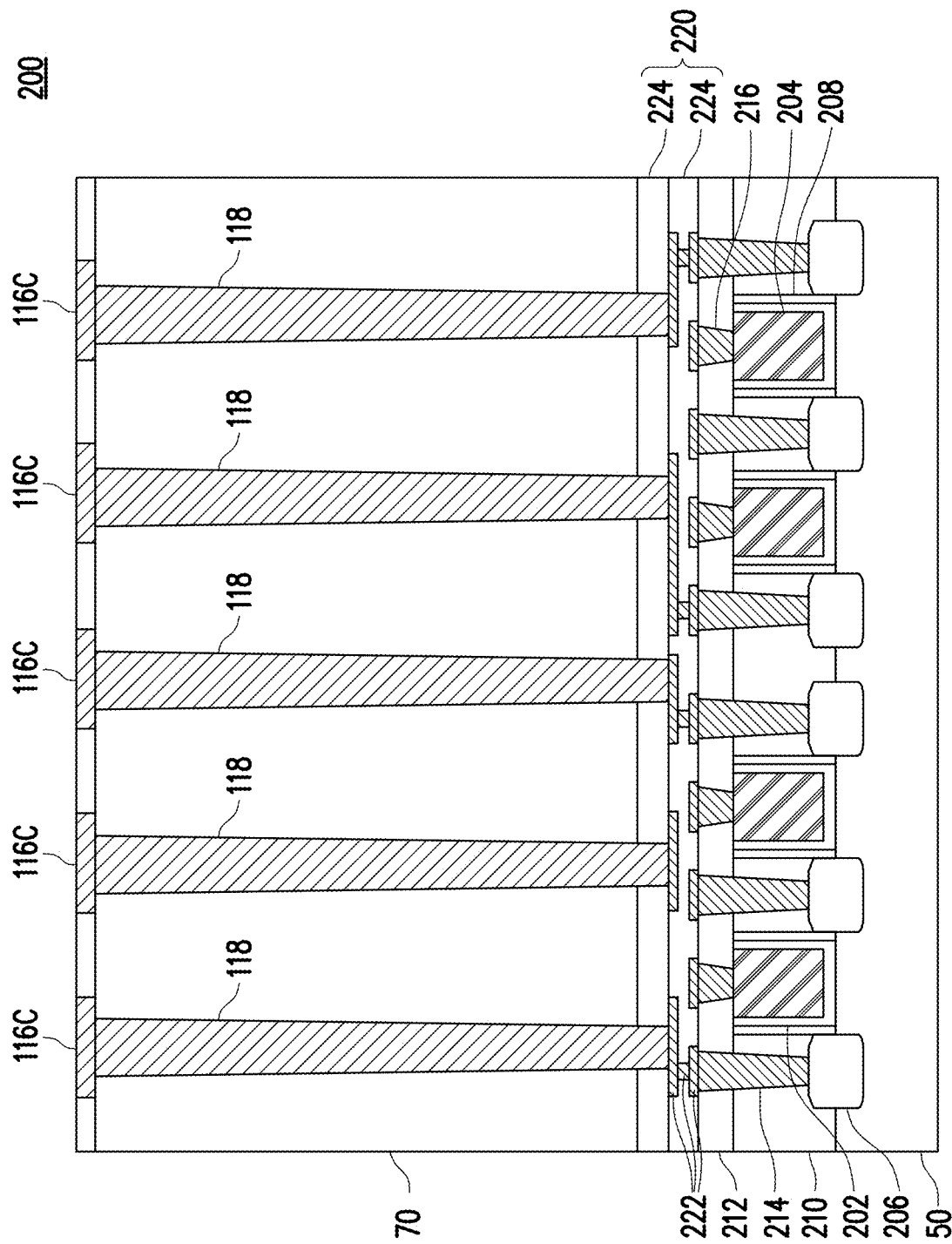
Figure 28D:
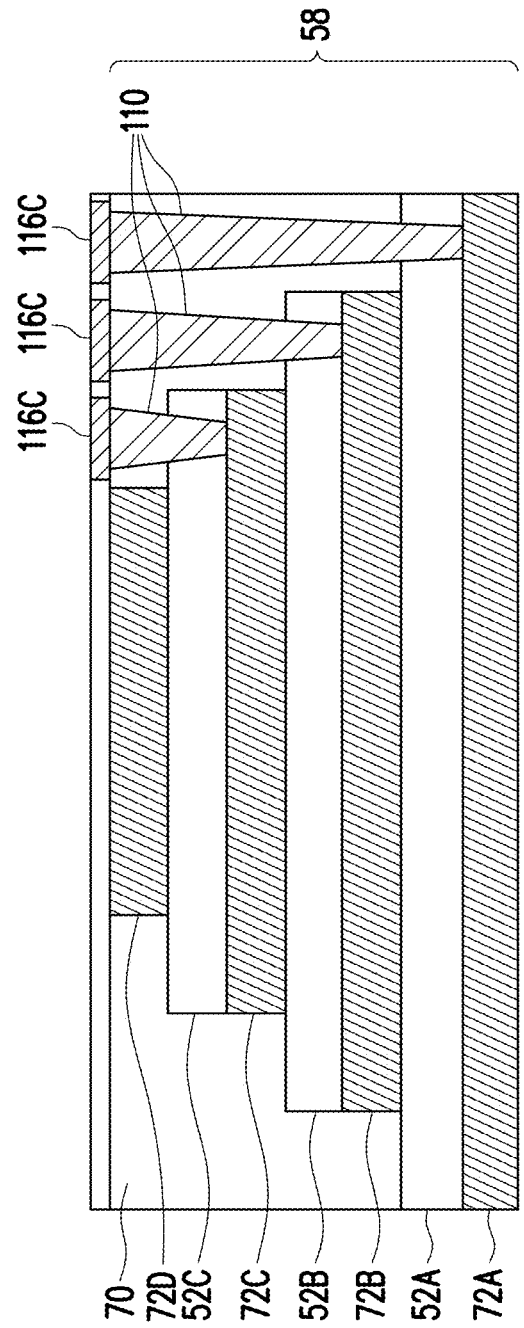

In FIGS. 28A, 28B, 28C, and 28D, contacts 110 are made to the conductive lines 72, the conductive lines 106, and the conductive lines 108. FIG. 28A illustrates a perspective view of the memory array 200; FIG. 28B illustrates a top-down view of the memory array 200; and FIG. 28C illustrates a cross-sectional view of the device and underlying substrate along the line 28C'-28C' of FIG. 28A; and FIG. 28D illustrates a cross-sectional view of the device along line B-B' of FIG. 1A. In some embodiments, the staircase shape of the conductive lines 72 may provide a surface on each of the conductive lines 72 for the conductive contacts 110 to land on. Forming the contacts 110 may include patterning openings in the IMD 70 and the dielectric layers 52 to expose portions of the conductive layers 54 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the contacts 110 in the openings.

As also illustrated by the perspective view of FIG. 28A, conductive contacts 112 and 114 may also be made to the conductive lines 106 and the conductive lines 108, respectively. The conductive contacts 110, 112, and 114 may be electrically connected to conductive lines 116A, 116B, and 116C, respectively, which connect the memory array to an underlying/overlying circuitry (e.g., control circuitry) and/or signal, power, and ground lines in the semiconductor die. For example, conductive vias 118 may extend through the IMD 70 to electrically connect conductive lines 116C to the underlying circuity of the interconnect structure 220 and the active devices on the substrate 50 as illustrated by FIG. 28C. Other conductive vias may be formed through the IMD 70 to electrically connect the conductive lines 116A and 116B to the underlying circuitry of the interconnect structure 220. In alternate embodiments, routing and/or power lines to and from the memory array may be provided by an interconnect structure formed over the memory array 200 in addition to or in lieu of the interconnect structure 220. Accordingly, the memory array 200 may be completed.

Figure 29:
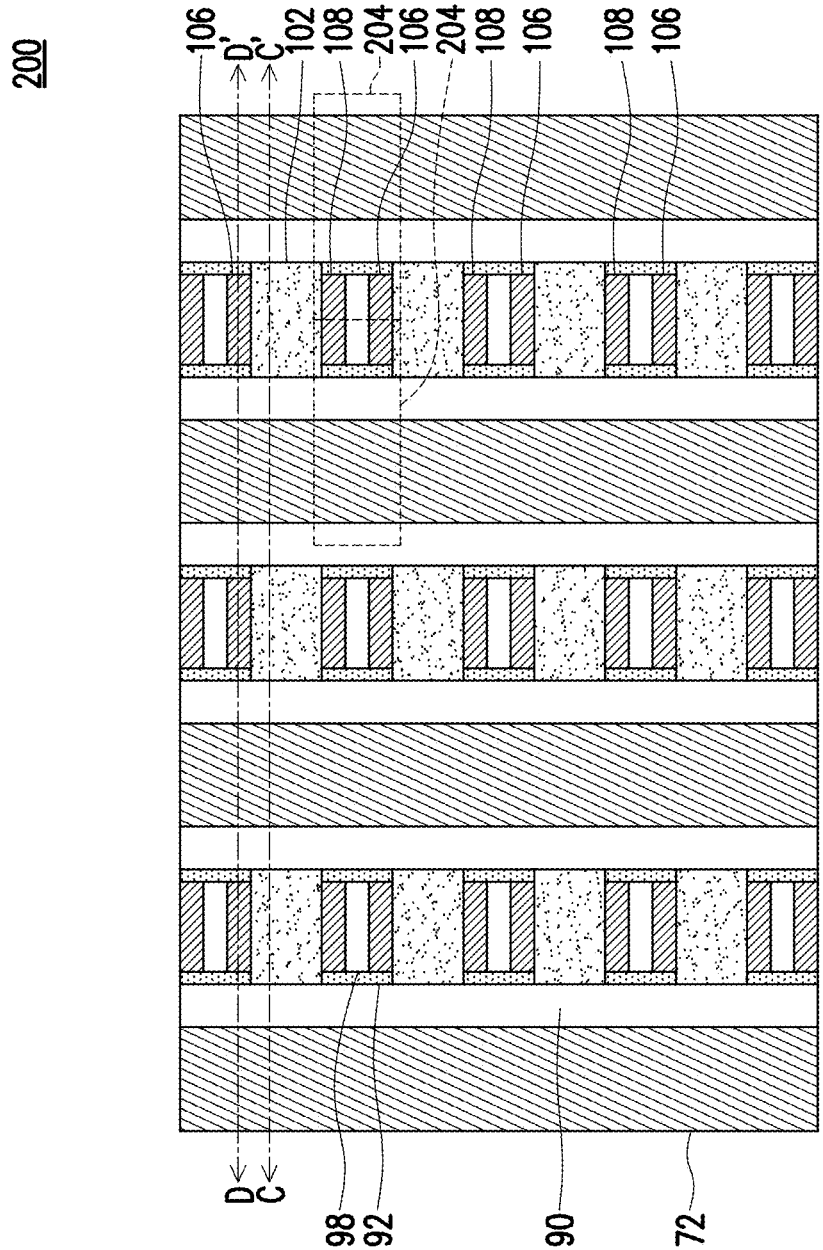
FIGS. 29, 30, and 31 illustrate varying views of a memory array in accordance with some embodiments.
Figure 30:
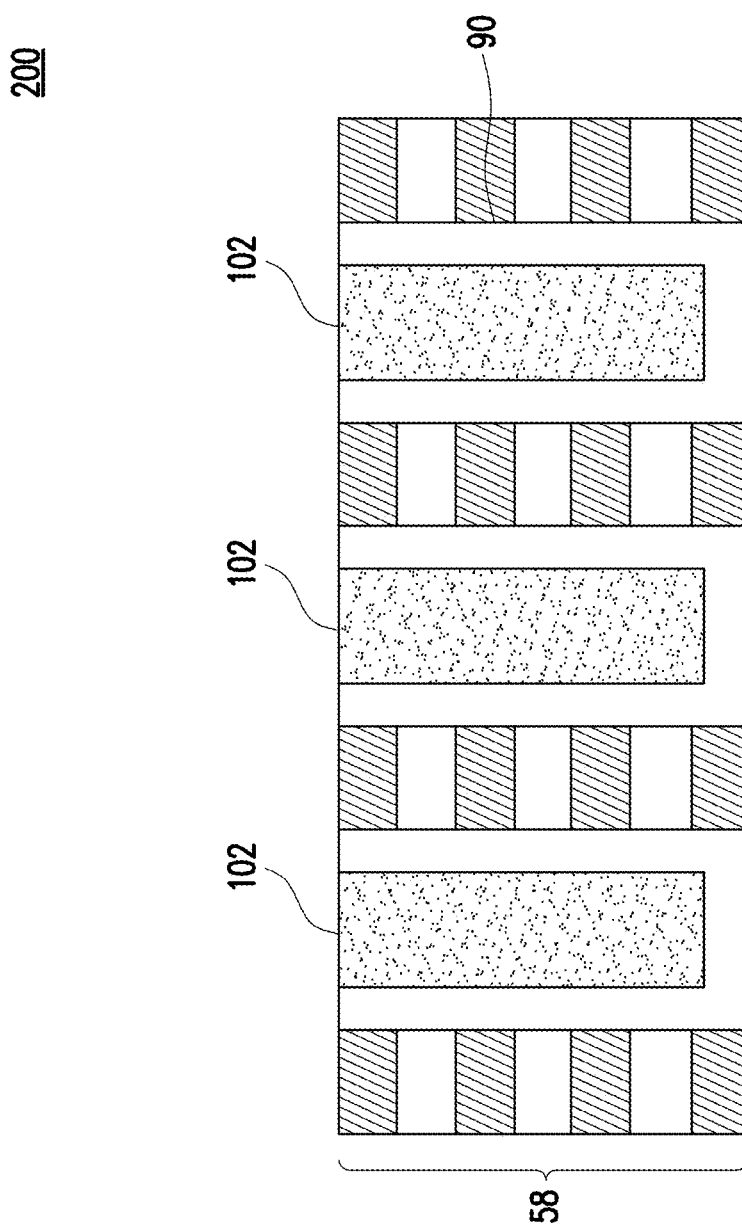
Figure 31:
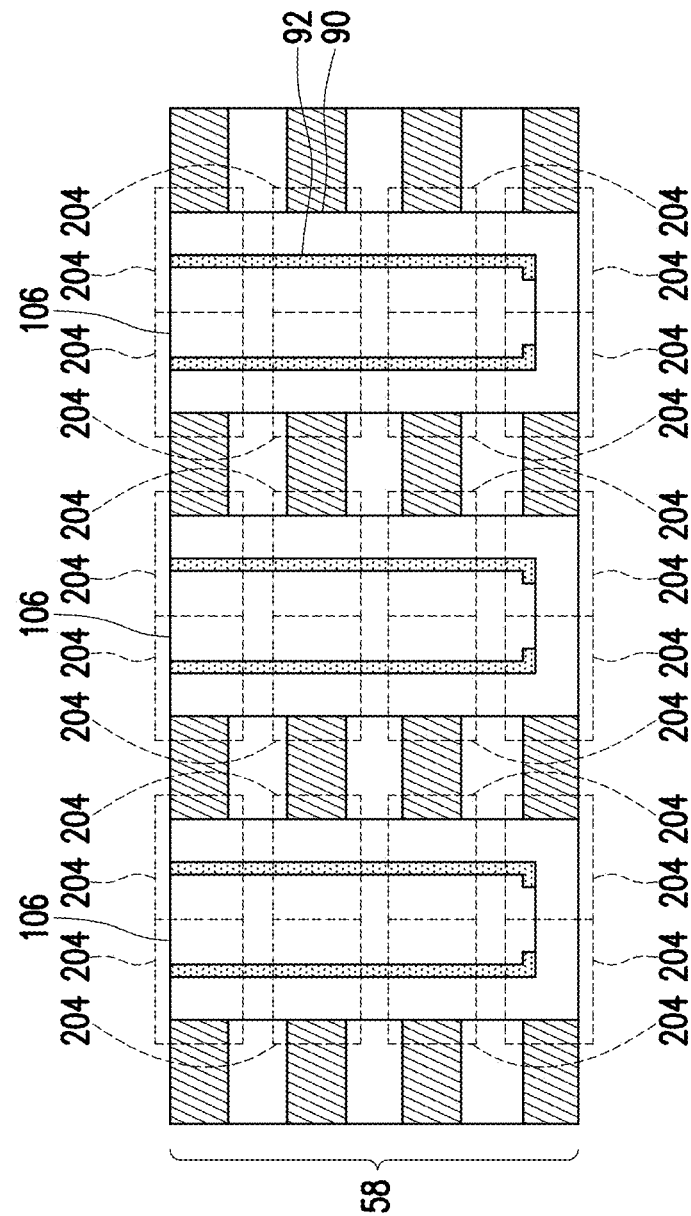

Although the embodiments of FIGS. 2 through 28B illustrate a particular pattern for the conductive lines 106 and 108, other configurations are also possible. For example, in these embodiments, the conductive lines 106 and 108 have a staggered pattern. In some embodiments, the conductive lines 106 and 108 in a same row of the array are all aligned with each other. FIG. 29 illustrates a top-down view, and FIG. 30 illustrates a cross-sectional view along line C-C' of FIG. 29. FIG. 31 illustrates a cross-sectional view along line D-D' of FIG. 29. In FIGS. 29, 30, and 31, like reference numerals indicate like elements formed by like processes as the elements of FIGS. 2 through 28B.

Figure 33D:
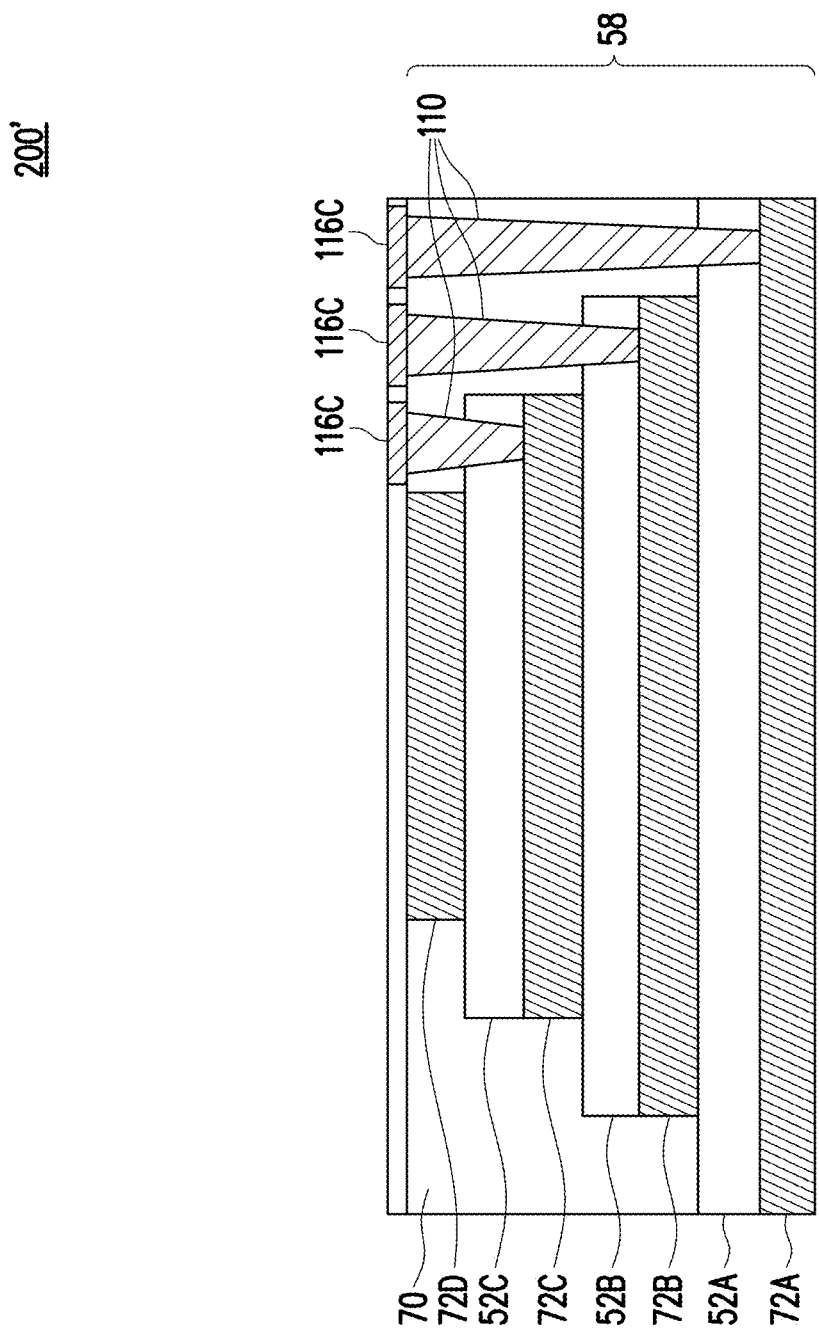

FIGS. 33A, 33B, 33C, and 33D illustrate memory array 200' according to an alternate embodiment illustrated and described above with respect to FIG. 22B. FIG. 33A illustrates a perspective view of the memory array 200; FIG. 33B illustrates a top-down view of the memory array 200; and FIG. 33C illustrates a cross-sectional view of the device and underlying substrate along the line 30C'-30C' of FIG. 33A; and FIG. 33D illustrates a cross-sectional view of the device along line B-B' of FIG. 1A. The memory array 200' may be similar to the memory array 200 where like reference numerals indicate like elements formed using like processes. However, the dielectric material 98B is replaced with a dielectric material 98C, and the dielectric material 98C has a different material composition than the dielectric material 98A. For example, as described above, a hydrogen concentration of the dielectric material 98C may be higher than the dielectric material 98A. This can be achieved, for example, by increasing a flowrate of a hydrogen-comprising precursor while depositing the dielectric material 98C compared to depositing the dielectric material 98A.

Various embodiments provide a 3D memory array with vertically stacked memory cells. The memory cells each comprise a TFT with a memory film, gate dielectric material and an oxide semiconductor channel region. The TFT comprises source/drain electrodes, which are also source lines and bits lines in the memory array. A dielectric material is disposed between and isolates adjacent ones of the source/drain electrodes. In some embodiments, at least a portion of the dielectric material is a low-hydrogen material formed using a hydrogen-comprising precursor that is introduced at a reduced flowrate. For example, at least portions of the dielectric material (e.g., layer) in physical contact with channel region of the TFT may have a relatively low hydrogen concentration, such as, a less than 3 at %. The low hydrogen concentration (e.g., in the above range) may reduce hydrogen diffusion into the channel region, thereby reducing defects and improving stability. A relatively low hydrogen concentration can be achieved in the dielectric material by, for example, reducing a flowrate of a hydrogen-comprising precursor used to deposit the dielectric material.

In some embodiments, a memory cell includes a thin film transistor over a semiconductor substrate. The thin film transistor includes a memory film contacting a word line; and an oxide semiconductor (OS) layer contacting a source line and a bit line, wherein the memory film is disposed between the OS layer and the word line; and a dielectric material separating the source line and the bit line. The dielectric material forms an interface with the OS layer. The dielectric material comprises hydrogen, and a hydrogen concentration at the interface between the dielectric material and the OS layer is no more than 3 atomic percent (at %). Optionally, in some embodiments, the dielectric material comprises: a first dielectric material contacting the OS layer, the first dielectric material extending continuously from the source line to the bit line; and a second dielectric material on an opposing side of the first dielectric material as the OS layer, the second dielectric material extending continuously from the source line to the bit line, a hydrogen concentration of the second dielectric material being greater than a hydrogen concentration of the first dielectric material. Optionally, in some embodiments, the dielectric material comprises silicon oxide, and an overall hydrogen concentration of the dielectric material is greater than 0 at % and less than 5 at %. Optionally, in some embodiments, the dielectric material comprises silicon nitride, and an overall hydrogen concentration of the dielectric material is greater than 0 at % and less than 10 at %. Optionally, in some embodiments, the OS layer comprises hydrogen. Optionally, in some embodiments, a hydrogen concentration of the OS layer is in a range of $10^{20}$ atoms per cubic centimeter to $10^{22}$ atoms per cubic centimeter. Optionally, in some embodiments, a longitudinal axis of the word line extends parallel to a major surface of a semiconductor substrate, a longitudinal axis of the source line extends perpendicular to the major surface of the semiconductor substrate, and a longitudinal axis of the bit line extends perpendicular to the major surface of the semiconductor substrate.

In some embodiments, a device includes: a semiconductor substrate; a first memory cell over the semiconductor substrate, the first memory cell comprising a first thin film transistor, wherein the first thin film transistor comprises: a gate electrode comprising a portion of a first word line; a first portion of a ferroelectric material, the first portion of the ferroelectric material being on a sidewall of the first word line; and a first channel region on a sidewall of the ferroelectric material, the first channel region comprising hydrogen, and a hydrogen concentration of the first channel region being in a range of $10^{20}$ atoms per cubic centimeter to $10^{22}$ atoms per cubic centimeter; a source line, wherein a first portion of the source line provides a first source/drain electrode for the first thin film transistor; a bit line, wherein a first portion of the bit line provides a second source/drain electrode for the first thin film transistor; a first dielectric material separating the source line and the bit line, wherein the first dielectric material physically contacts the first channel region; and a second memory cell over the first memory cell. Optionally, in some embodiments, the second memory cell comprising a second thin film transistor, wherein a second portion of the source line provides a first source/drain electrode for the second thin film transistor, and wherein a second portion of the bit line provides a second source/drain electrode for the second thin film transistor. Optionally, in some embodiments, the device further includes a second word line under the first word line, wherein a gate electrode of the second thin film transistor comprises a portion of the second word line, and wherein the first word line is longer than the second word line. Optionally, in some embodiments, a hydrogen concentration at an interface between the first dielectric material and the first channel region is less than 3 atomic percent. Optionally, in some embodiments, the device further includes a second dielectric material separating the source line and the bit line, the second dielectric material being separated from the first channel region by the first dielectric material, and the first dielectric material has a different material composition than the second dielectric material. Optionally, in some embodiments, a hydrogen concentration of the second dielectric material is greater than a hydrogen concentration of the first dielectric material.

In some embodiments, a method includes patterning a first trench extending through a first conductive line; depositing a memory film along sidewalls and a bottom surface of the first trench; depositing an oxide semiconductor (OS) layer over the memory film, the OS layer extending along the sidewalls and the bottom surface of the first trench; depositing a first dielectric material over and contacting the OS layer, wherein depositing the first dielectric material comprises simultaneously supplying a first hydrogen-comprising precursor at a first flowrate and a second hydrogen-free precursor at a second flowrate, and wherein a ratio of the second flowrate of the second hydrogen-free precursor to the first flowrate of the first hydrogen-comprising precursor is at least 60; and depositing a second dielectric material over the first dielectric material to fill a remaining portion of the first trench. Optionally, in some embodiments, depositing the second dielectric material comprises simultaneously supplying a third hydrogen-comprising precursor at a third flowrate and a fourth hydrogen-free precursor at a fourth flowrate, and wherein a ratio of the fourth flowrate of the fourth hydrogen-free precursor to the third flowrate of the third hydrogen-comprising precursor is the same as a ratio of the second flowrate of the second hydrogen-free precursor to the first flowrate of the first hydrogen-comprising precursor. Optionally, in some embodiments depositing the second dielectric material comprises simultaneously supplying a third hydrogen-comprising precursor at a third flowrate and a fourth hydrogen-free precursor at a fourth flowrate, and wherein the third flowrate of the third hydrogen-comprising precursor is greater than the first flowrate of the first hydrogen-comprising precursor. Optionally, in some embodiments, the method further includes patterning a third trench in the first dielectric material and the second dielectric material; patterning a fourth trench in the first dielectric material and the second dielectric material; and filling the third trench and the fourth trench with a conductive material to define a source line and a bit line. Optionally, in some embodiments, the first hydrogen-comprising precursor is silane ($SiH_4$), and the second hydrogen-free precursor is $N_2O$. Optionally, in some embodiments, after depositing the first dielectric material, a hydrogen concentration at an interface between the first dielectric material and the OS layer is 3 at % or less. Optionally, in some embodiments, depositing the first dielectric material comprises diffusing hydrogen into the OS layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    patterning a first trench extending through a first conductive line;
    depositing a memory film along sidewalls and a bottom surface of the first trench;
    depositing an oxide semiconductor (OS) layer over the memory film, the OS layer extending along the sidewalls and the bottom surface of the first trench;
    depositing a first dielectric material over and contacting the OS layer, wherein depositing the first dielectric material comprises simultaneously supplying a first hydrogen-comprising precursor at a first flow rate and a second hydrogen-free precursor at a second flow rate, wherein a ratio of the second flow rate of the second hydrogen-free precursor to the first flow rate of the first hydrogen-comprising precursor is at least 60, and wherein after depositing the first dielectric material, a hydrogen concentration at an interface between the first dielectric material and the OS layer is 3 at % or less;
    depositing a second dielectric material over the first dielectric material to fill a remaining portion of the first trench;
    etching a second trench through the first dielectric material and the second dielectric material, wherein the first trench extends through the OS layer; and
    filling the second trench with a first conductive material to form a bit line, wherein the bit line extends through the OS layer and overlaps the OS layer.

2. The method of claim 1, wherein depositing the second dielectric material comprises simultaneously supplying a third hydrogen-comprising precursor at a third flow rate and a fourth hydrogen-free precursor at a fourth flow rate, and wherein a first ratio of the fourth flow rate of the fourth hydrogen-free precursor to the third flow rate of the third hydrogen-comprising precursor is the same as a second ratio of the second flow rate of the second hydrogen-free precursor to the first flow rate of the first hydrogen-comprising precursor.

3. The method of claim 1, wherein depositing the second dielectric material comprises simultaneously supplying a third hydrogen-comprising precursor at a third flow rate and a fourth hydrogen-free precursor at a fourth flow rate, and wherein the third flow rate of the third hydrogen-comprising precursor is greater than the first flow rate of the first hydrogen-comprising precursor.

4. The method of claim 3, wherein the first dielectric material and the second dielectric material each comprise silicon oxide.

5. The method of claim 1, further comprising:
patterning a third trench in the first dielectric material and the second dielectric material;
filling the third trench with a second conductive material to define a source line in the third trench.

6. The method of claim 1, wherein the first hydrogen-comprising precursor is silane ($SiH_4$), and the second hydrogen-free precursor is $N_2O$.

7. The method of claim 1, wherein depositing the first dielectric material comprises diffusing hydrogen into the OS layer.

8. The method of claim 1, further comprising:
prior to depositing the second dielectric material, removing a lateral portion of the first dielectric material and patterning an opening through the OS layer, wherein depositing the second dielectric material comprises depositing a portion of the second dielectric material in the opening.

9. A method, comprising:
patterning a first trench extending through a multi-layer stack, the multi-layer stack comprising alternating conductive lines and insulating layers;
depositing a memory film along sidewalls and a bottom surface of the first trench;
depositing an oxide semiconductor (OS) layer over the memory film, the OS layer extending along the sidewalls and the bottom surface of the first trench;
depositing a first dielectric material over and contacting the OS layer, wherein the first dielectric material comprises a first silicon oxide material with a first hydrogen concentration; and
depositing a second dielectric material over the first dielectric material, wherein the second dielectric material comprises a second silicon oxide material with a second hydrogen concentration, and wherein the first hydrogen concentration of the first dielectric material is less than the second hydrogen concentration of the second dielectric material.

10. The method of claim 9, wherein depositing the first dielectric material comprises flowing a hydrogen-free precursor at a first flow rate and flowing a hydrogen-comprising precursor at a second flow rate, wherein the first flow rate is greater than the second flow rate.

11. The method of claim 10, wherein a ratio of the first flow rate to the second flow rate is at least 60.

12. The method of claim 9, wherein the first hydrogen concentration of the first dielectric material is greater than 0 at % and less than 5 at %.

13. The method of claim 9, further comprising diffusing hydrogen through the first dielectric material into the OS layer.

14. The method of claim 13, wherein after depositing the first dielectric material, a concentration of hydrogen in the OS layer is in a range of $10^{20}$ atoms per cubic centimeter to $10^{22}$ atoms per cubic centimeter.

15. A method, comprising:
patterning a first trench extending through a multi-layer stack, the multi-layer stack comprising alternating conductive lines and insulating layers;
depositing a memory film along sidewalls and a bottom surface of the first trench;
depositing an oxide semiconductor (OS) layer in the first trench over the memory film, the OS layer extending along the sidewalls and the bottom surface of the first trench; and
depositing a first dielectric material in the first trench over and contacting the OS layer, wherein the first dielectric material has a first hydrogen concentration less than 3 at % at an interface between the first dielectric material and the OS layer; and
after depositing the first dielectric material, filling a remaining portion of the first trench with a second dielectric material, wherein the second dielectric material has a second hydrogen concentration higher than the first hydrogen concentration of the first dielectric material, wherein the first dielectric material and the second dielectric material each comprise silicon oxide.

16. The method of claim 15, further comprising:
patterning a second trench and a third trench each extending through the first dielectric material and the second dielectric material; and
filling the second trench and the third trench with a conductive material to form a source line in the second trench and a bit line in the third trench.

17. The method of claim 15, wherein depositing the first dielectric material comprises flowing a first precursor at a first rate and flowing a second precursor at a second rate, the first precursor being hydrogen free, the second precursor comprising hydrogen, and a ratio of the first rate to the second rate is at least 60.

18. The method of claim 16, wherein the third trench extends through the OS layer, and wherein the bit line extends through the OS layer and overlaps the OS layer.

19. The method of claim 17, wherein the first precursor is $N_2O$, and the second precursor is silane.

20. The method of claim 17, further comprising diffusing hydrogen through the first dielectric material into the OS layer.

\* \* \* \* \*